United States Patent
Chou et al.

(10) Patent No.: US 12,376,346 B2
(45) Date of Patent: Jul. 29, 2025

(54) METHOD FOR FABRICATING INTEGRATED CIRCUIT DEVICE WITH TWO GATE STRUCTURES

(71) Applicants: TAIWAN SEMICONDUCTOR MANUFACTURING COMPANY, LTD., Hsinchu (TW); NATIONAL YANG MING CHIAO TUNG UNIVERSITY, Hsinchu (TW)

(72) Inventors: Yu-Che Chou, Yilan County (TW); Li-Cheng Teng, Hsinchu (TW); Wan-Hsuan Chung, Taichung (TW); Chao-Hsin Chien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 655 days.

(21) Appl. No.: 17/573,976

(22) Filed: Jan. 12, 2022

(65) Prior Publication Data
US 2023/0013047 A1   Jan. 19, 2023

Related U.S. Application Data

(60) Provisional application No. 63/222,617, filed on Jul. 16, 2021.

(51) Int. Cl.
*H10D 30/69* (2025.01)
*H10D 30/01* (2025.01)
(Continued)

(52) U.S. Cl.
CPC .......... *H10D 30/69* (2025.01); *H10D 30/031* (2025.01); *H10D 30/0413* (2025.01);
(Continued)

(58) Field of Classification Search
CPC ......... H01L 29/42392; H01L 29/78621; H01L 29/78696; H01L 29/00–0673;
(Continued)

(56) References Cited

U.S. PATENT DOCUMENTS 9,548,381 B1 * 1/2017 Krishnan ........... H10D 30/6734
10,971,629 B2   4/2021 Chien et al.
(Continued)

*Primary Examiner* — Chad M Dicke
*Assistant Examiner* — Jeremy Daniel Watts
(74) *Attorney, Agent, or Firm* — Birch, Stewart, Kolasch & Birch, LLP

(57) ABSTRACT

An integrated circuit device includes a semiconductor substrate, a first gate structure, a channel layer, source and drain features, a second gate structure, a first contact, and a second contact. The first gate structure is over the semiconductor substrate. The first gate structure includes a gate dielectric layer and a first gate electrode. The channel layer is over and surrounded by the first gate structure. The source and drain features are respectively on opposite first and second sides of the channel layer. The second gate structure is over the channel layer. The second gate structure includes a programming gate dielectric layer having a data storage layer and a second gate electrode over the programming gate dielectric layer. The first gate contact is on the first gate electrode. The second gate contact is on the second gate electrode.

20 Claims, 62 Drawing Sheets

(51) Int. Cl.
  *H10D 30/67*   (2025.01)
  *H10D 62/10*   (2025.01)
  *H10N 70/00*   (2023.01)
  *H10N 70/20*   (2023.01)

(52) U.S. Cl.
  CPC ..... *H10D 30/0415* (2025.01); *H10D 30/6735* (2025.01); *H10D 30/6757* (2025.01); *H10D 30/701* (2025.01); *H10D 62/118* (2025.01); *H10N 70/063* (2023.02); *H10N 70/253* (2023.02)

(58) Field of Classification Search
  CPC ........... H01L 29/66833; H01L 29/7831; H01L 29/7832; H01L 21/82345; H01L 21/823842; H01L 29/78645; H01L 29/78648; H01L 29/792; H01L 29/7923; H01L 29/068; H10N 70/063; H10N 70/253; H10N 70/20; H10N 70/231; H10N 70/826; H10N 70/8828; H10N 70/8833; H10B 63/30; H10D 30/69; H10D 30/031; H10D 30/0413; H10D 30/0415; H10D 30/6735; H10D 30/6757; H10D 30/701; H10D 62/118; H10D 30/014; H10D 30/43; H10D 62/121; H10D 64/681; B82Y 10/00
  See application file for complete search history.

(56) References Cited

U.S. PATENT DOCUMENTS

| | | | |
|---|---|---|---|
| 11,302,810 B1* | 4/2022 | Gong | H01L 21/02603 |
| 2004/0152272 A1* | 8/2004 | Fladre | H10D 30/673 |
| | | | 257/E21.415 |
| 2011/0189829 A1* | 8/2011 | Yun | H10D 30/69 |
| | | | 438/266 |
| 2013/0093002 A1* | 4/2013 | Zhu | H10D 30/6734 |
| | | | 257/329 |
| 2019/0181224 A1* | 6/2019 | Zhang | H10D 64/017 |
| 2020/0343265 A1* | 10/2020 | Chang | H10D 64/033 |
| 2021/0391467 A1* | 12/2021 | Song | H10D 62/118 |
| 2022/0271168 A1* | 8/2022 | Yamazaki | H10D 30/68 |

* cited by examiner

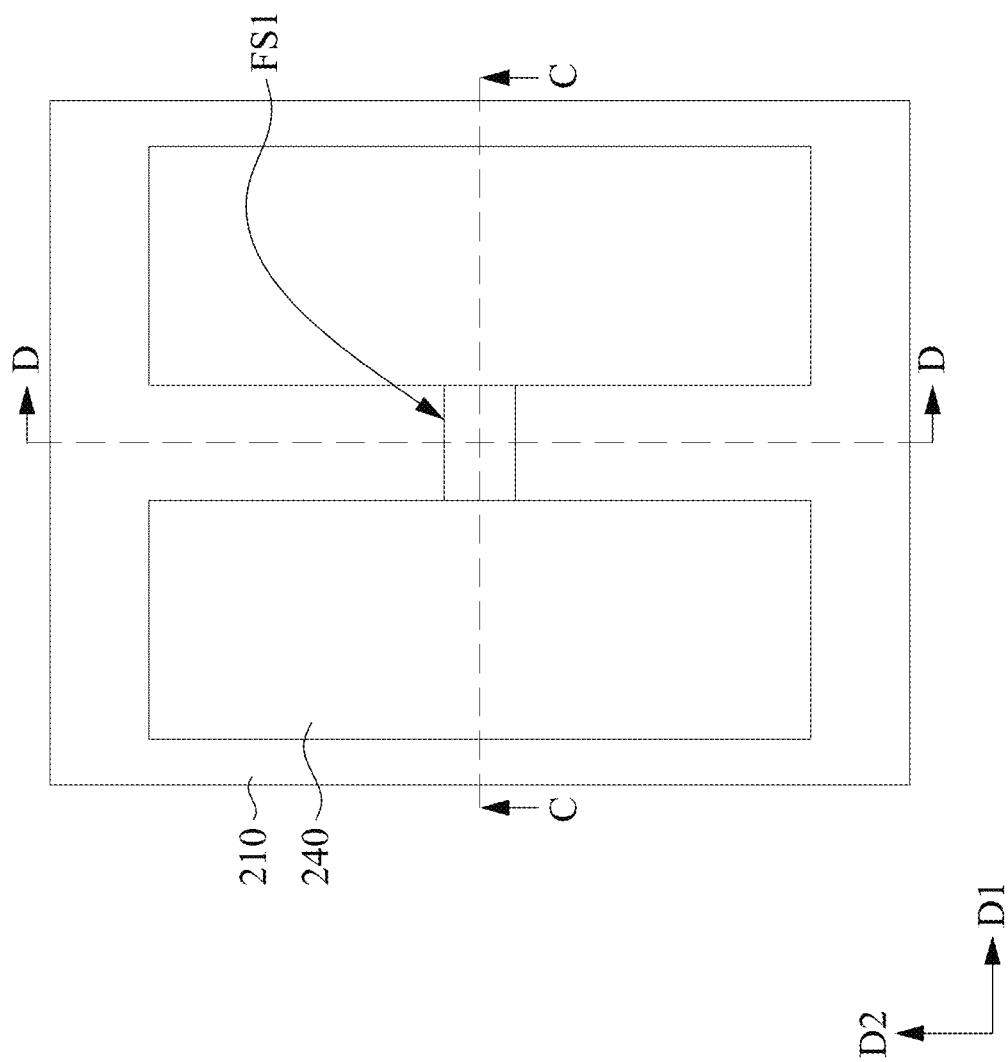

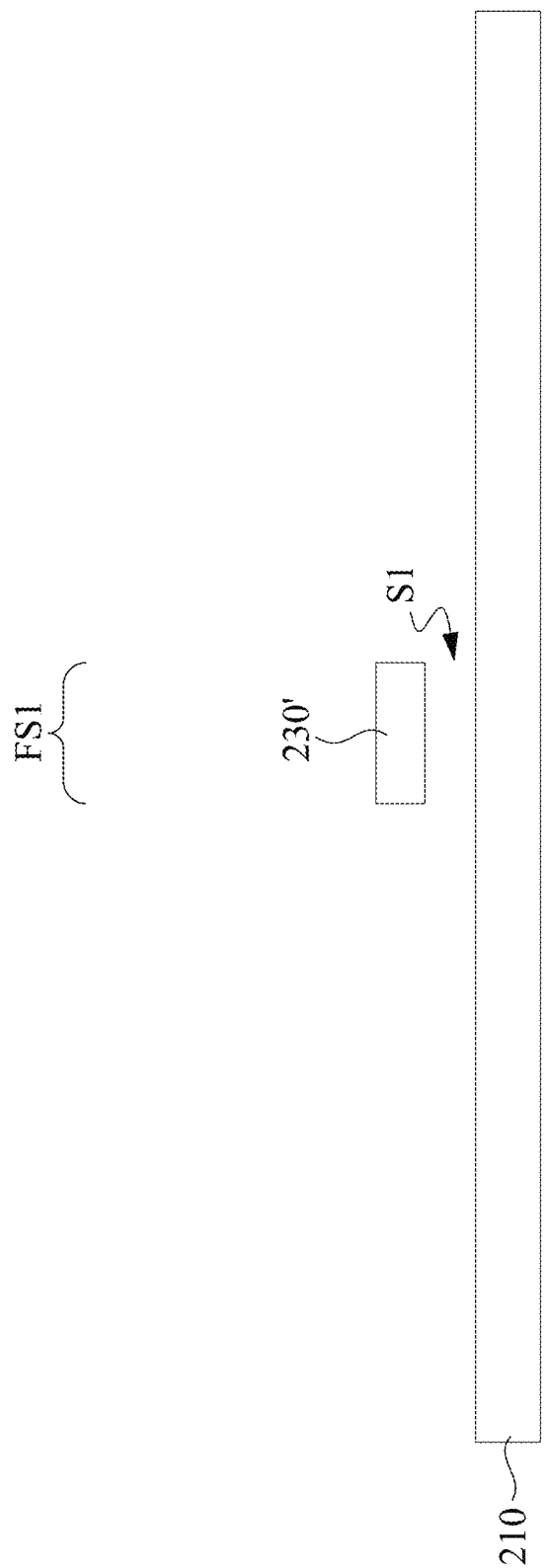

METHOD FOR FABRICATING INTEGRATED CIRCUIT DEVICE WITH TWO GATE STRUCTURES

PRIORITY CLAIM AND CROSS-REFERENCE

This application claims the benefit of U.S. Provisional Application No. 63/222,617, filed on Jul. 16, 2021, which application is hereby incorporated herein by reference in its entirety.

BACKGROUND

The semiconductor industry continues to increase the density of electronic components (e.g., transistors, diodes, resistors, capacitors, etc.) in integrated circuits by progressive reductions in minimum feature size and by the use of three-dimensional (3D) transistor structures, such as a fin field-effect transistor (FinFET), which utilize the vertical dimension to deliver more drive current for the same footprint. The higher component densities enabled by innovations in semiconductor technology allow more functions to be integrated into a given area. The ability to achieve high functional density has given rise to the System-on-Chip (SoC) concept wherein multiple functional blocks such as digital logic, non-volatile memory, and analog functions are integrated on a single chip. Integrating such a diversity of functions on one chip presents new challenges in forming and integrating a concomitantly large variety of electronic components and transistor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
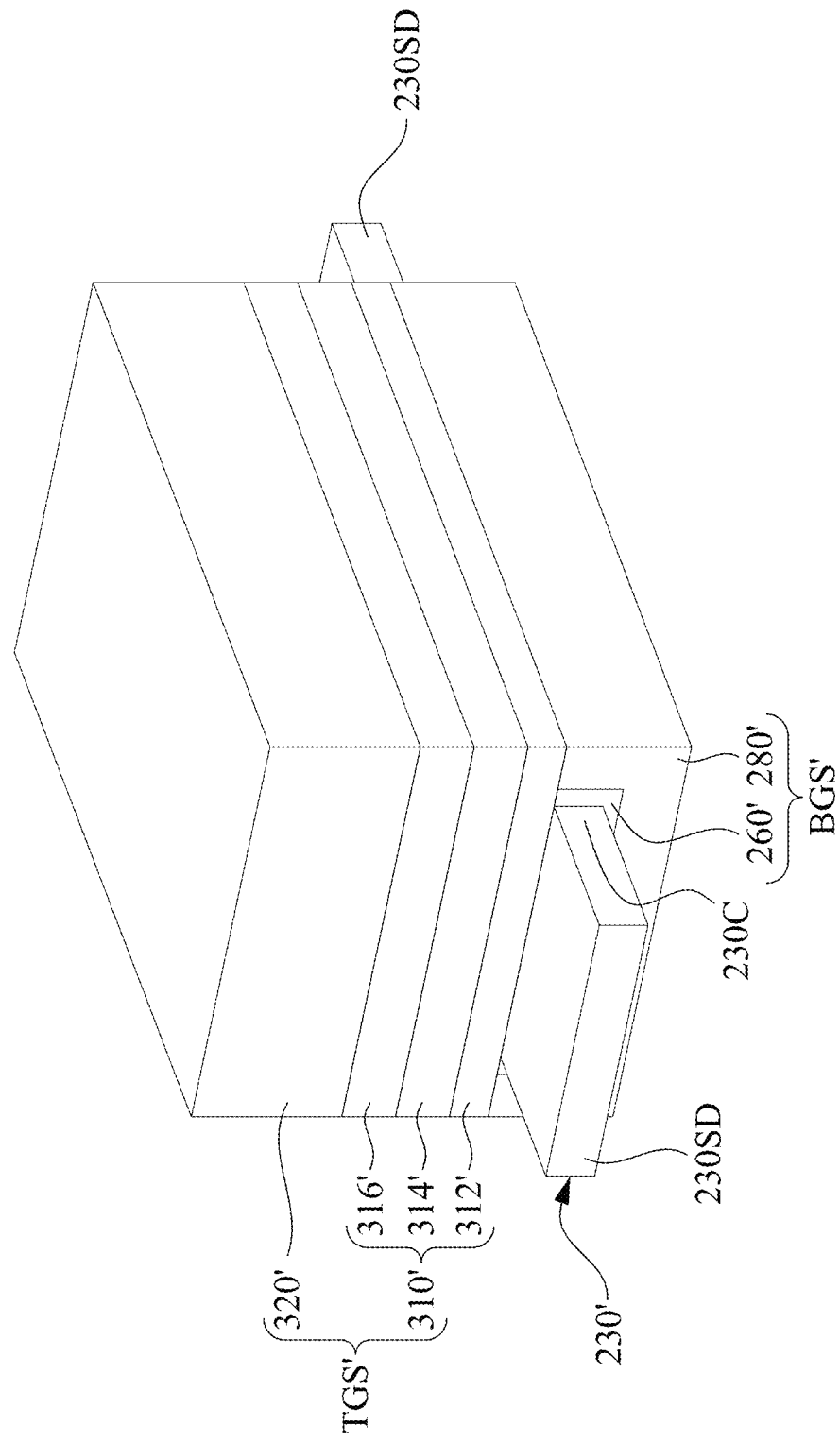
FIG. 1A is a perspective view of an integrated circuit device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may mean within 20 percent, or within 10 percent, or within 5 percent of a given value or range. Numerical quantities given herein are approximate, meaning that the term "around," "about," "approximately," or "substantially" can be inferred if not expressly stated.

Some embodiments of the present disclosure describe a metal-oxide-semiconductor field-effect transistors (MOSFETs), wherein a threshold voltage ($V_t$) of each MOSFET can be programmed electrically. The transistor structures described herein are the three-dimensional MOSFETs referred to as gate-all-around (GAA) FETs, where a semiconductor region that is used to form the channel of the MOSFET is shaped like a nano-structure (e.g., nanosheet, nanowire, or nanobridge) enclosed by a gate structure. The programmable-$V_t$ GAA FETs has two different gate structures formed on a top and a bottom of the nanosheet. For example, as discussed in greater detail below, on a top of the nanosheet may be a programming gate structure, and on a bottom of the nanosheet may be a switching gate structure. The programming gate structure may include a charge-trapping layer (e.g., a nitride layer or a polysilicon layer). Various amounts of negative and/or positive charges may be injected into and trapped in the charge-trapping layer by appropriately biasing a gate electrode of the programming gate structure (referred to as the control gate). The charges trapped in the charge-trapping layer alter the threshold at which the transistor may be switched from an off-state (or substantially non-conducting state) to an on-state (or conducting state) by applying a voltage, VG greater than or equal to $V_t$ on the gate of the switching gate structure. The $V_t$ may be programmed to one of several values by forcing the device into one of several charged states by applying a respective programming voltage on the control gate. Since the drain-to-source current (IDS) of a MOSFET depends on the $V_t$, the programmed state can be read by sensing the magnitude of electrical current flowing through the transistor when it is biased on. In additional to the charge-trapping layer (e.g., a nitride layer or a polysilicon layer), other data storage layer (e.g., a ferroelectric material layer) may also be used as the gate dielectric layer for tuning $V_t$.

In some alternative embodiments of the present disclosure, the transistor is used as electrically erasable and programmable non-volatile memory (NVM) storage elements. Various resistance-based data storage layer (e.g., a ferroelectric material layer, resistance switching layer, a phase change material layer, a nanostructure, or the like) may also be used for achieving the NVM storage elements. The transistor is designed such that leakage of trapped charges may be negligible, irrespective of the normal operating power supply being connected, so that each charged state may be considered to be metastable. Accordingly, after the transistor is programmed into its respective charged state, it may remain in that state, during which time multiple read operations may be performed. Also, the device may be cycled multiple times between different charged states with insignificant loss in the stability and readability of its multiple metastable charged states.

Figure 1B:
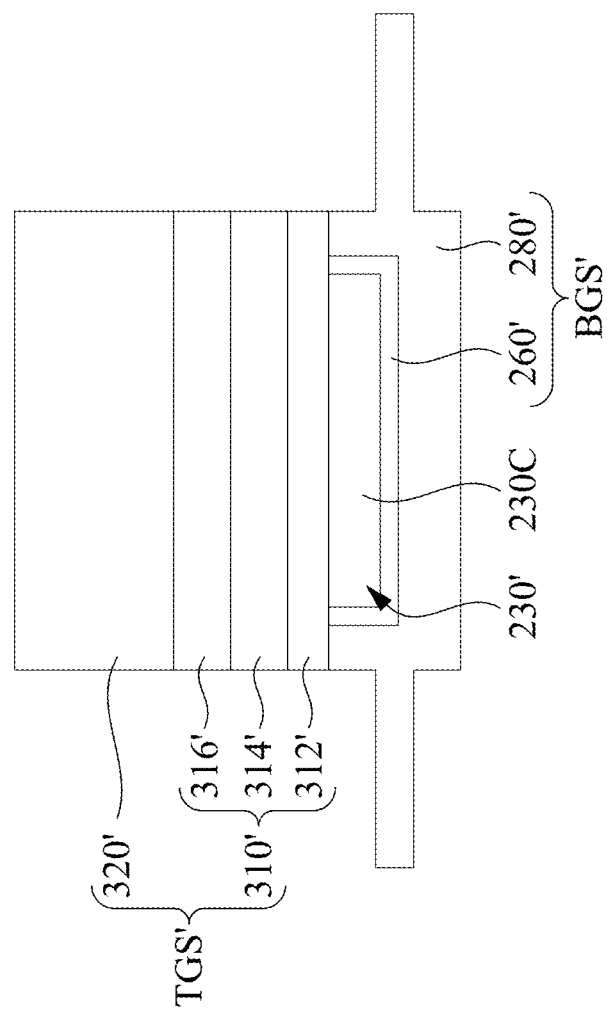
FIG. 1B is a cross-sectional view taken along line B-B of FIG. 1A.

FIG. 1A is a perspective view of an integrated circuit device 100 according to some embodiments of the present disclosure. FIG. 1B is a cross-sectional view taken along line B-B of FIG. 1A. The integrated circuit device 100 is a dual-gate FET device having two different gate structures: a programming gate structure TGS' and a switching gate structure BGS' respectively on top and bottom of a channel region 230C of the semiconductor layer 230'. Source/drain features 230SD may be disposed on opposing sides of the channel region 230C of the semiconductor layer 230'.

In some embodiments, the programming gate structure TGS' includes a programming gate dielectric layer 310' and a control gate electrode 320' formed over the programming gate dielectric layer 310'. The programming gate dielectric layer 310' may include a bottom layer 312', a data storage layer 314' over the bottom layer 312', and a top layer 316' over the data storage layer 314'.

In some embodiments, the programming gate dielectric layer 310' may be a charge trapping structure capable of trapping programming charges, thereby affecting the $V_t$ of the switching gate structure BGS'. The bottom layer 312' may be referred to as a tunneling layer 312', which includes an insulator (e.g., an oxide) which may be sufficiently thin to allow charge transport through of the dielectric by electron tunneling. The storage layer 314' may be referred to as a charge trapping layer 314', which has a high density of localized electronic states in which charge may be trapped. For example, the charge trapping layer 314' may include a high-k dielectric material (e.g., $Si_3N_4$ or $HfO_2$) or a semiconductor material (e.g., polysilicon). The top layer 316' may be referred to as a barrier layer 316', which includes an insulating material (e.g., an oxide) serving as a barrier which prevents trapped charge from leaking out of the charge trapping layer to the control gate electrode 320'. In order to suppress the charge leakage, the barrier layer 316' may be formed thicker than the tunneling layer 312'.

An appropriate programming voltage may be applied to the control gate electrode 320' to program the integrated circuit device 100 to its respective charged state. Electric charges may be transported between the channel region 230C and the charge trapping layer 314' via the tunneling layer 312' during programming. The net charge in the charge trapping layer 314' determines the charged state of the device 100. The barrier layer 316' capacitively couples a portion of the programming voltage to drop across the tunneling layer 312' to induce the requisite charge transport through the tunneling layer 312' to program the device to a desired charged state. For the charged states to function as non-volatile storage elements, the charge trapped in the charge trapping layer 314' during programming may be retained for a long time.

The switching gate structure BGS' may include a switching gate dielectric layer 260' and a switching gate electrode 280' over the switching gate dielectric layer 260'. The switching gate structure BGS' may be used to allow current to flow between the source/drain features 230SD, the threshold voltage ($V_t$) of which is controlled by the trapped charge in the programming gate structure TGS'. Separate electrical connections (not shown) may be made to the control gate electrode 320' and the switching gate electrode 280' so that the two gates may be biased independently to allow for programming and switching capabilities.

In some alternative embodiments where the device 100 is used as a memory storage element, both the programming gate structure TGS' and the switching gate structure BGS' are adjacent and coupling the same channel region 230C. This coupling allows the charged state of the device 100 to be set by programming threshold voltage ($V_t$) using the control gate electrode 320' of the programming gate structure TGS' and subsequently sensed by reading the channel current induced by turning on the switching gate electrode 280'.

Figure 1C:
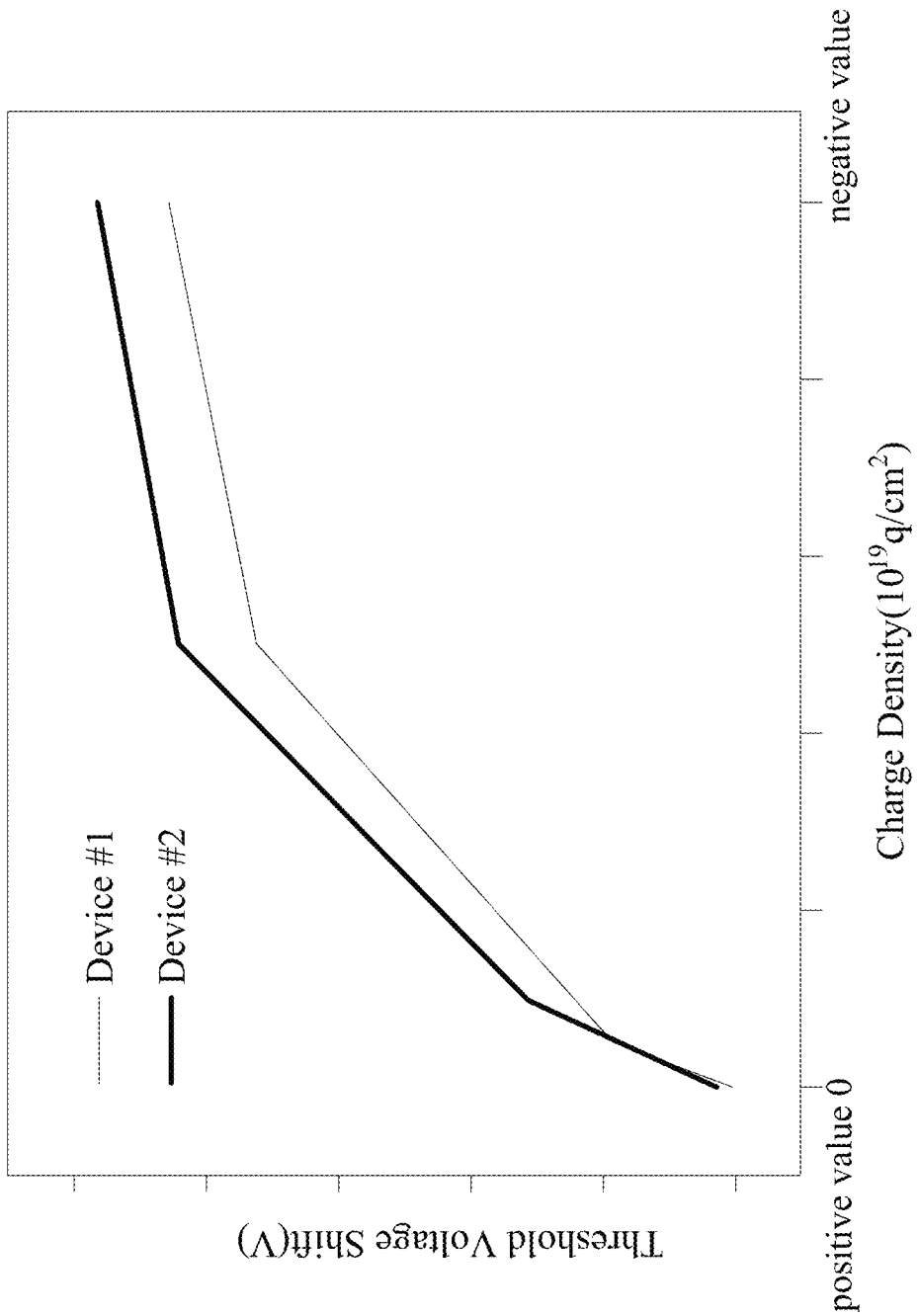
FIG. 1C is a plot of threshold voltage versus charge density according to some embodiments of the present disclosure.

FIG. 1C is a plot of threshold voltage ($V_t$) versus charge density of different devices according to some embodiments of the present disclosure. In FIG. 1C, the charge density of the charge trapping layer 314' of the programming gate dielectric layer 310' (referring to FIGS. 1A and 1B) is shown on the horizontal axis in FIG. 1C, and the threshold voltage ($V_t$) is shown on the vertical axis in FIG. 1C. In FIG. 1C, the device #1 has an $SiO_2/Si_3N_4/SiO_2$ (ONO) stack as its programming gate dielectric layer. That is, the layers 312'-316' of the device #1 are respectively a $SiO_2$ layer, a $Si_3N_4$ layer, and a $SiO_2$ layer. In FIG. 1C, the device #2 has an $Al_2O_3/HfO_2/Al_2O_3$ stack as its programming gate dielectric layer. That is, the layers 312'-316' of the device #2 are respectively an $Al_2O_3$ layer, a $HfO_2$ layer, and an $Al_2O_3$ layer.

The charge density of the charge trapping layer 314' (referring to FIGS. 1A and 1B) can be controlled by applying programming voltages on the control electrode 320' (referring to FIGS. 1A and 1). As shown in the figure, when the charge density decreases (i.e., more negative charges in the charge trapping layer), the threshold voltages ($V_t$) of the devices #1 and #2 becomes larger. It is confirmed that by applying various programming voltages to have different charge density in the charge trapping layer 314' (referring to FIGS. 1A and 1), each of the devices #1 and #2 can be programmed to multiple charged states, each corresponding to a respective threshold voltages ($V_t$).

Figure 2A:
FIGS. 2A and 2B are flow charts of a method for fabricating an integrated circuit device according to some embodiments of the present disclosure.
Figure 2B:
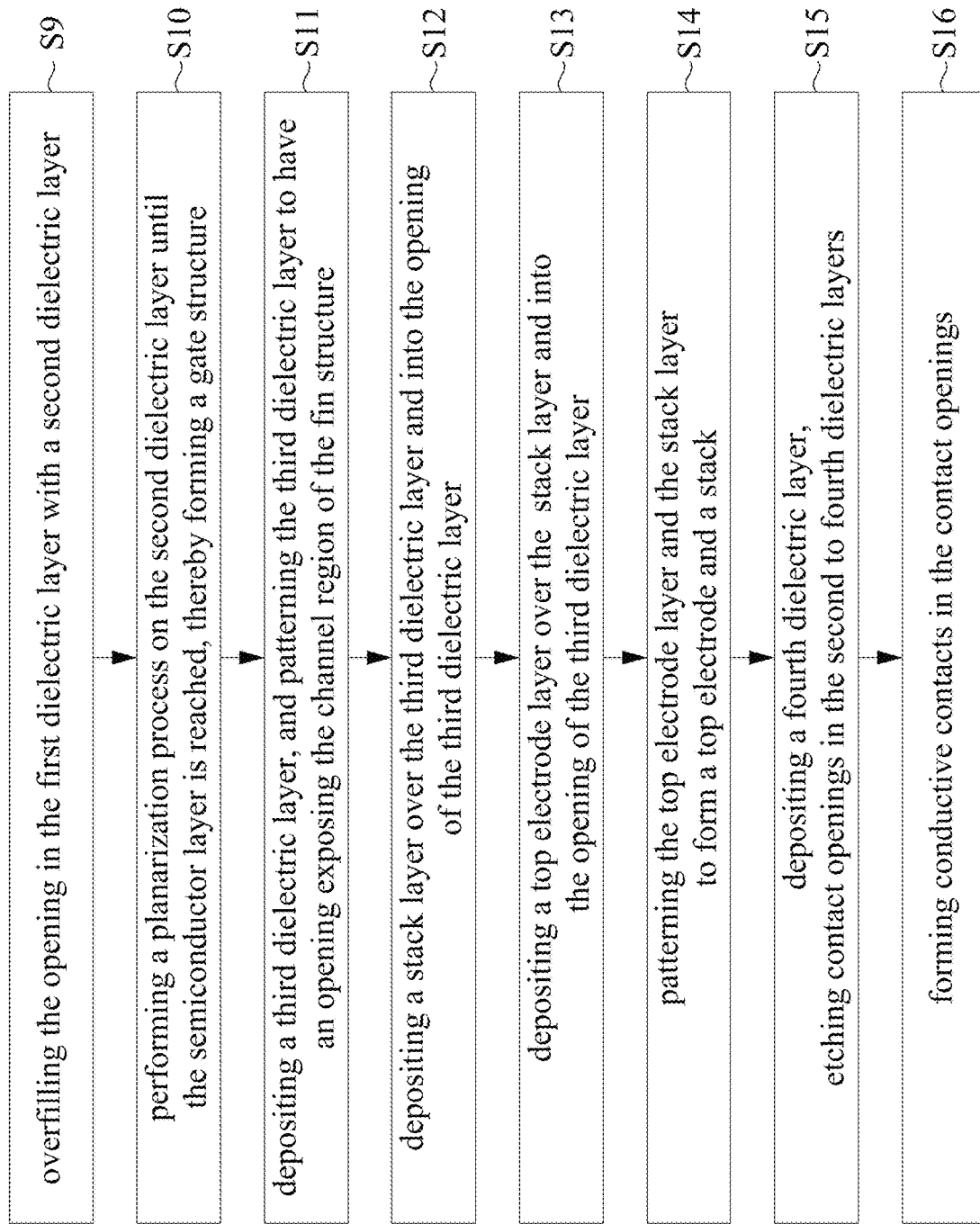

FIGS. 2A and 2B are flow charts of a method M for fabricating an integrated circuit device according to some embodiments of the present disclosure. FIGS. 3-18B illustrate an integrated circuit device at intermediate stages in the fabricating process according to some embodiments of the present disclosure. The method M may include steps S1-S16. It is understood that additional steps may be provided before, during, and after the steps S1-S16 shown by FIGS. 2A and 2B, and some of the steps described below can be replaced or eliminated for additional embodiments of the method. The order of the operations/processes may be interchangeable.

Figure 3:
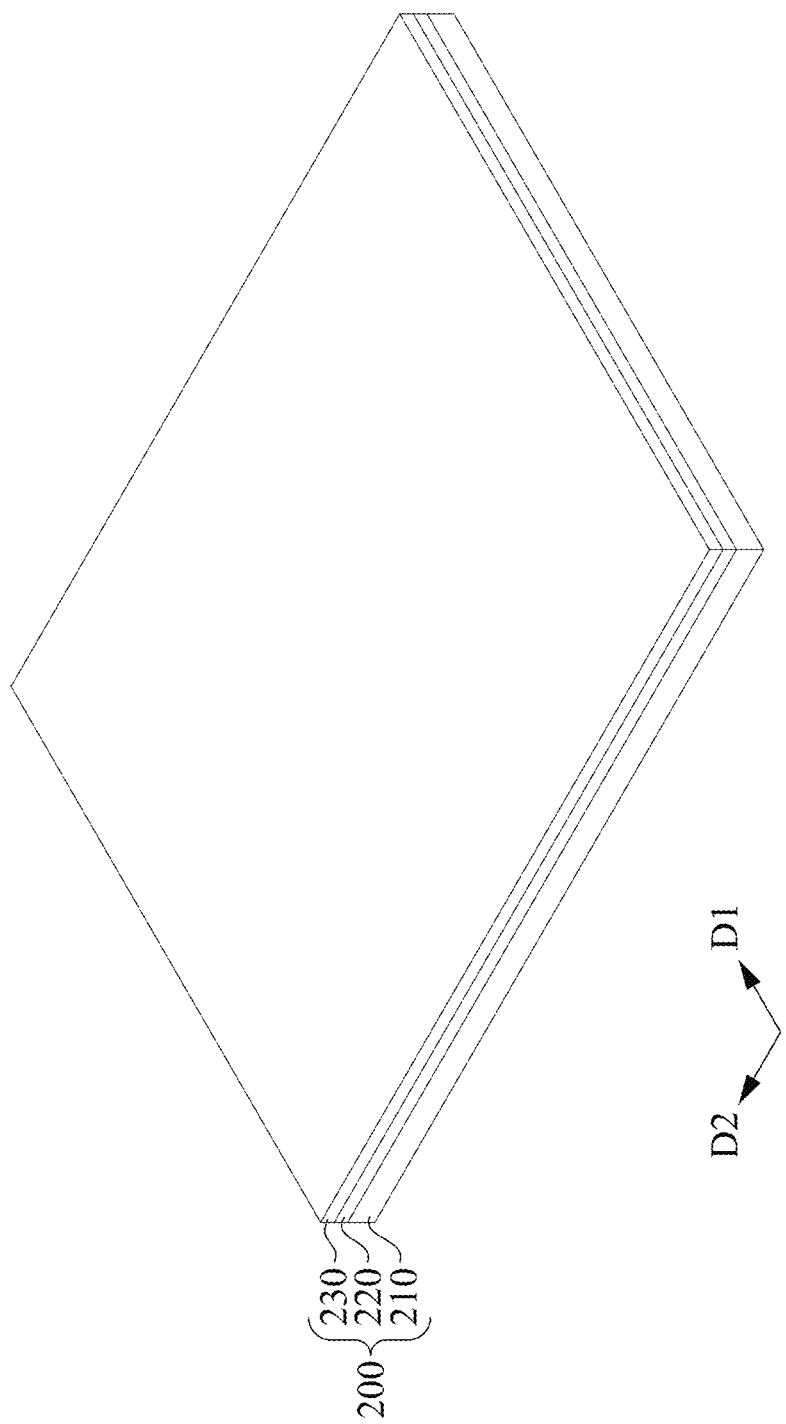
FIGS. 3-18B illustrate an integrated circuit device at intermediate stages in the fabricating process according to some embodiments of the present disclosure.

FIG. 3 is a perspective view of an integrated circuit device at an intermediate stage according to some embodiments of the present disclosure. Reference is made to FIGS. 2A and 3. The method M begins at step S1, where a semiconductor substrate 200 is provided. In some embodiments, the substrate 200 may include a base substrate 210, an interlayer 220 over the base substrate 210, and a semiconductor layer 230 over the interlayer 220.

In some embodiments, the base substrate 210 is a semiconductor substrate, such as a semiconductor wafer. For example, the base substrate 210 is a silicon wafer. The base substrate 210 may include silicon or another elementary semiconductor material such as germanium. In some other embodiments, the base substrate 210 includes a compound semiconductor. The compound semiconductor may include gallium arsenide, silicon carbide, indium arsenide, indium phosphide, another suitable material, or a combination thereof. In some embodiments, the semiconductor layer 230 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. A thickness of the semiconductor layer 230 may be in a range from about 5 nanometers to about 100 nanometers. If the thickness of the semiconductor layer 230 is less than about 5 nanometers, a resulted channel region may be too thin, which may result in higher channel resistance. If the thickness of the semiconductor layer 230 is greater than about 100 nanometers, a $V_t$ shift range of the resultant device may be reduced.

In some embodiments, the interlayer 220 is interposed between the base substrate 210 and the semiconductor layer 230. The interlayer 220 may include a material different from that of the underlying base substrate 210 and the overlaying semiconductor layer 230, thereby showing etch selectivity between these layers. For example, the interlayer 220 may include a dielectric material or a semiconductor material different from that of the base substrate 210 and the semiconductor layer 230. A thickness of the interlayer 220 may be in a range from about 5 nanometers to about 100 nanometers. If the thickness of the interlayer 220 is less than about 5 nanometers, a space for receiving gate materials formed by removing the interlayer 220 may be too small. If the thickness of the interlayer 220 is greater than about 100 nanometers, an etching process for removing the interlayer 220 may take a long time, which may damage the semiconductor layer 230.

In some embodiments, the substrate 200 may be a semiconductor-on-insulator (SOI) substrate, and the interlayer 220 may be an insulator layer of a semiconductor-on-insulator (SOI) substrate. The interlayer 220 may be referred to as a buried oxide (BOX) layer, such as a thick silicon oxide layer. Other dielectric materials can be used for the interlayer 220. Formation of the interlayer 220 may be using processes such as separation by implantation of oxygen (e.g., SIMOX), oxidation, deposition, and/or suitable processes.

In some embodiments, the interlayer 220 may be a semiconductor layer including a semiconductor material different from that of the base substrate 210 and the semiconductor layer 230. The interlayer may include group-IV semiconductor materials as the base substrate 210 and the semiconductor layer 230 include. For example, while the base substrate 210 and the semiconductor layer 230 include silicon, and the interlayer 220 may include silicon germanium. Alternatively, while the base substrate 210 and the semiconductor layer 230 include silicon germanium, and the interlayer 220 may include silicon. The interlayer 220 and the semiconductor layer 230 may be epitaxially deposited by CVD, ALD, the like, or the combination thereof.

Figure 4A:
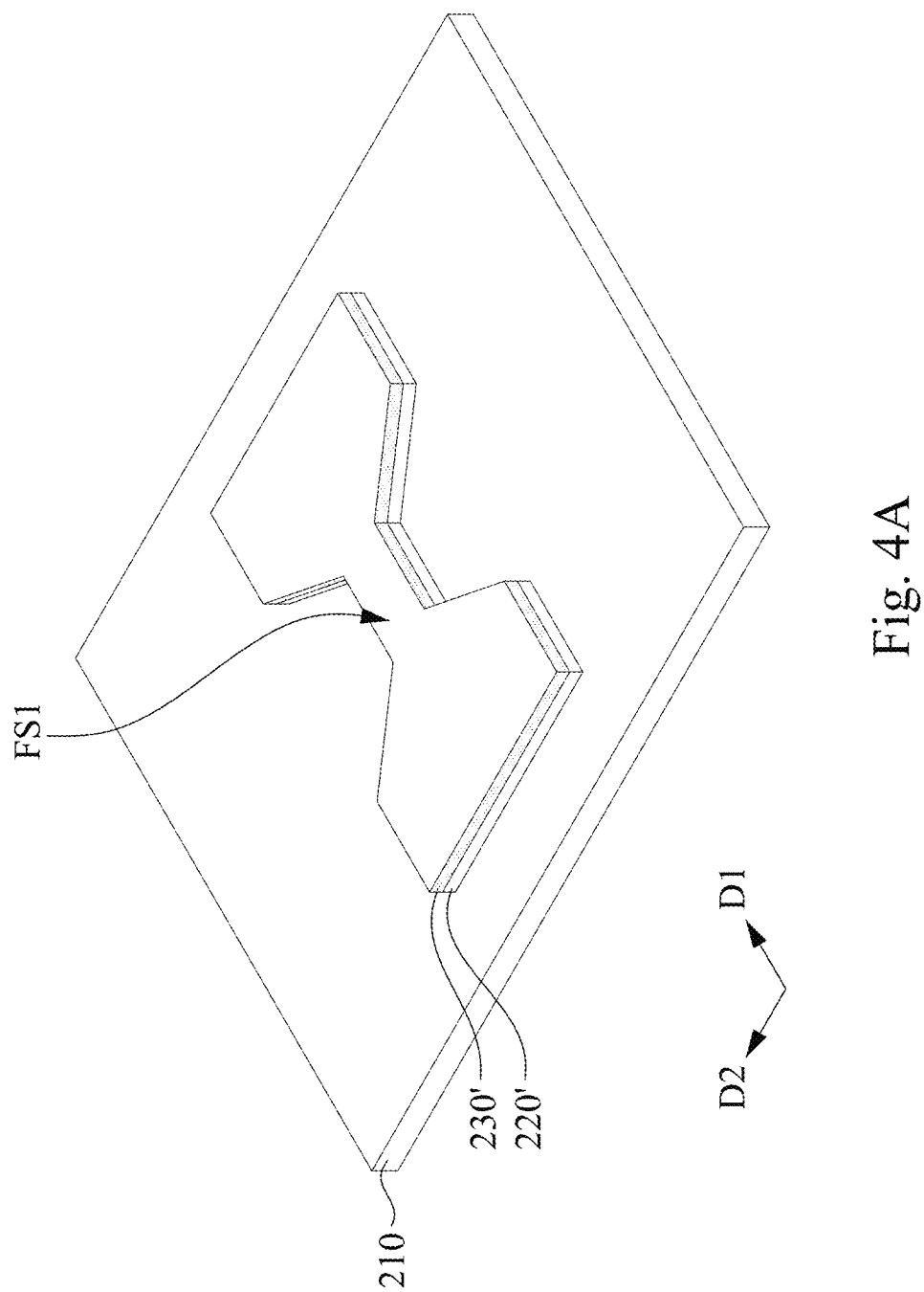
Figure 4B:
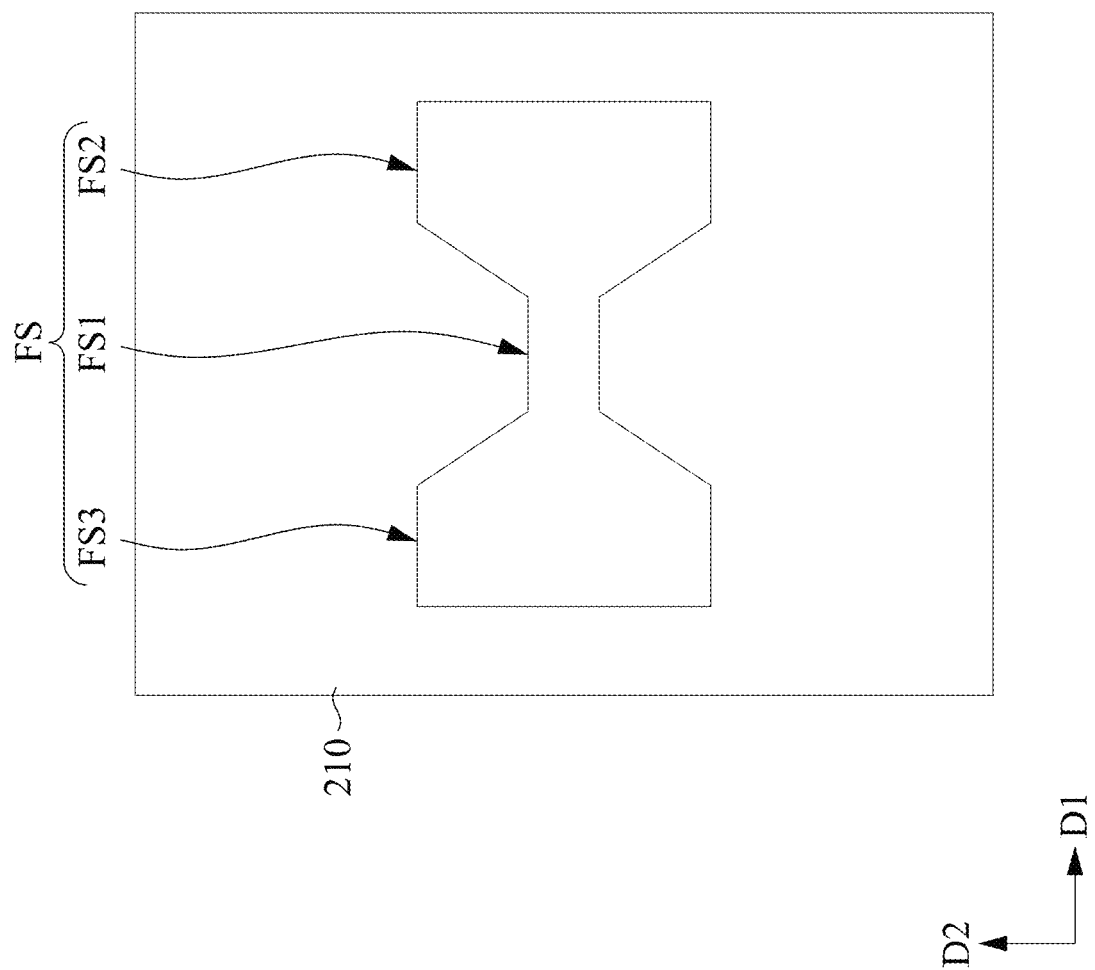

FIG. 4A is a perspective view of an integrated circuit device at an intermediate stage according to some embodiments of the present disclosure. FIG. 4B is a top view of the integrated circuit device of FIG. 4A. Reference is made to FIGS. 1A, 4A, and 4B. The method M proceeds to step S2, where the interlayer 220 and the semiconductor layer 230 (referring to FIG. 3) are patterned to form a fin structure FS. The patterning may include one or more etching processes for etching the interlayer 220 and the semiconductor layer 230 (referring to FIG. 3). The etching processes may include dry etch, wet etch, or the combination thereof. In some embodiments, the base substrate 210 may have a higher etch resistance to the etching processes than that of the interlayer 220, and may serve as an etch stop layer during the etching process. After the etching processes, the interlayer 220 and the semiconductor layer 230 (referring to FIG. 3) are referred to as interlayer 220' and the semiconductor layer 230', respectively. The interlayer 220' and the semiconductor layer 230' form the fin structure FS.

The fin structure FS may have a channel region FS1 and source and drain regions FS2 and FS3, in which the channel regions FS1 may extend along a direction D1 and connect the source region FS2 to the drain region FS3. In the present embodiments, a width of the source and drain regions FS2 and FS3 measured along a direction D2 orthogonal to the direction D1 is greater than a width of the channel region FS1 measured along the direction D2, which is beneficial for contact landings. In some other embodiments, as a size or critical dimension of the contacts can be reduced by suitable fabrication process, a width of the source and drain regions FS2 and FS3 measured along the direction D2 may be equal to or less than a width of the channel region FS1 measured along the direction D2.

In some embodiments, the channel region FS1 may have a channel length in a range from about 5 nanometers up to several hundreds of nanometers, and a channel width in a range from about 10 nanometers to about 100 nanometers. If the channel length is less than about 5 nanometers, leakage current may increase. If the channel length is greater than several hundreds of nanometers, a channel resistance may be too large. If the channel width is less than about 10 nanometers, a channel resistance may be too large. If the channel width is greater than about 100 nanometers, the device size may be unnecessarily increased. In some embodiments, the source and drain regions FS2 and FS3 may have a source/drain length in a range from about 5 nanometers to about 30 nanometers, and a source/drain length in a range from about 10 nanometers to about 150 nanometers. If the source/drain length is less than about 5 nanometers or the source/drain width is less than about 10 nanometers, the source and drain regions may have a small area for receiving source/drain contact. If the source/drain length is greater than about 30 nanometers or the source/drain width is greater than about 150 nanometers, the device size may be unnecessarily increased.

Figure 5A:
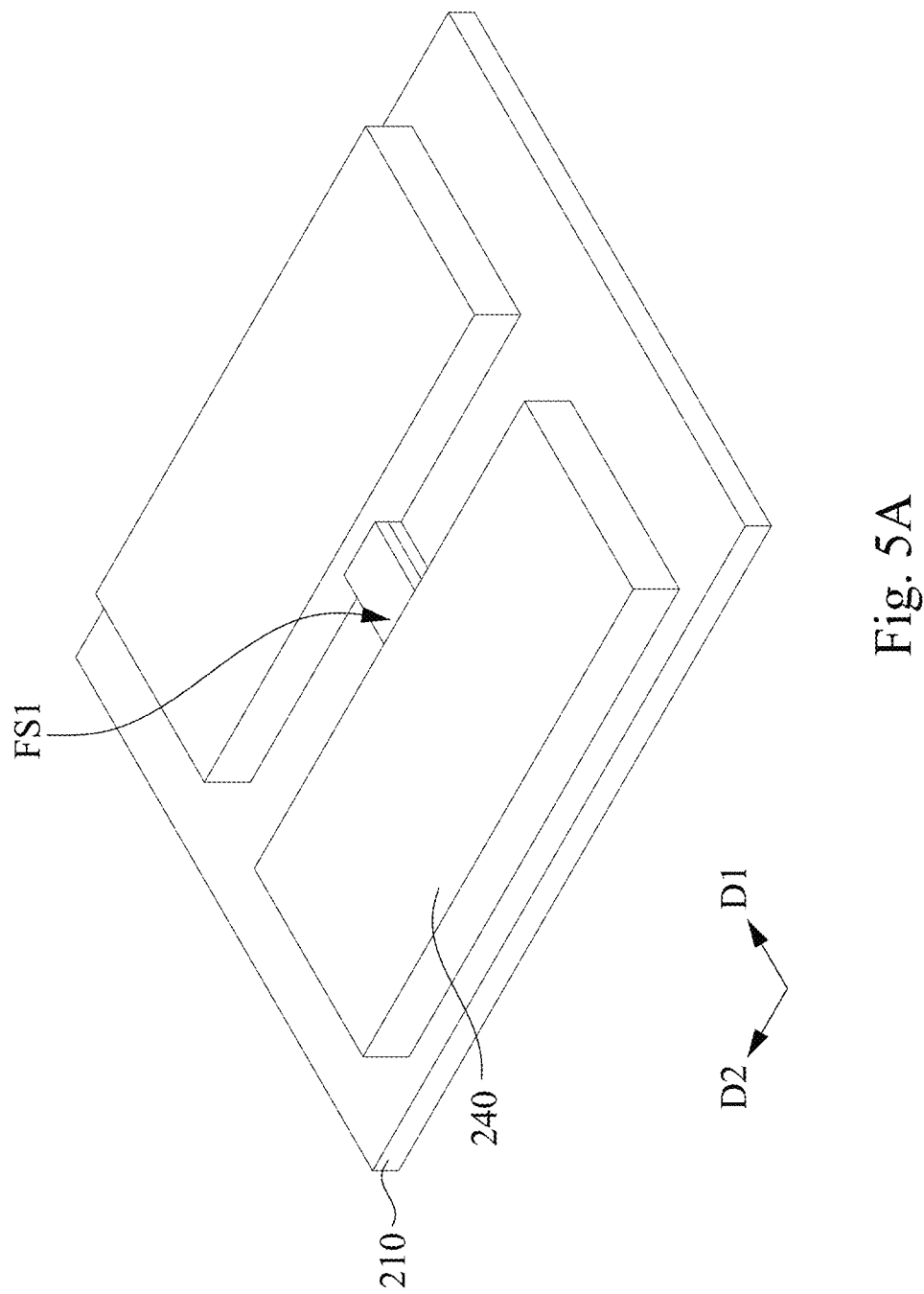
Figure 5C:
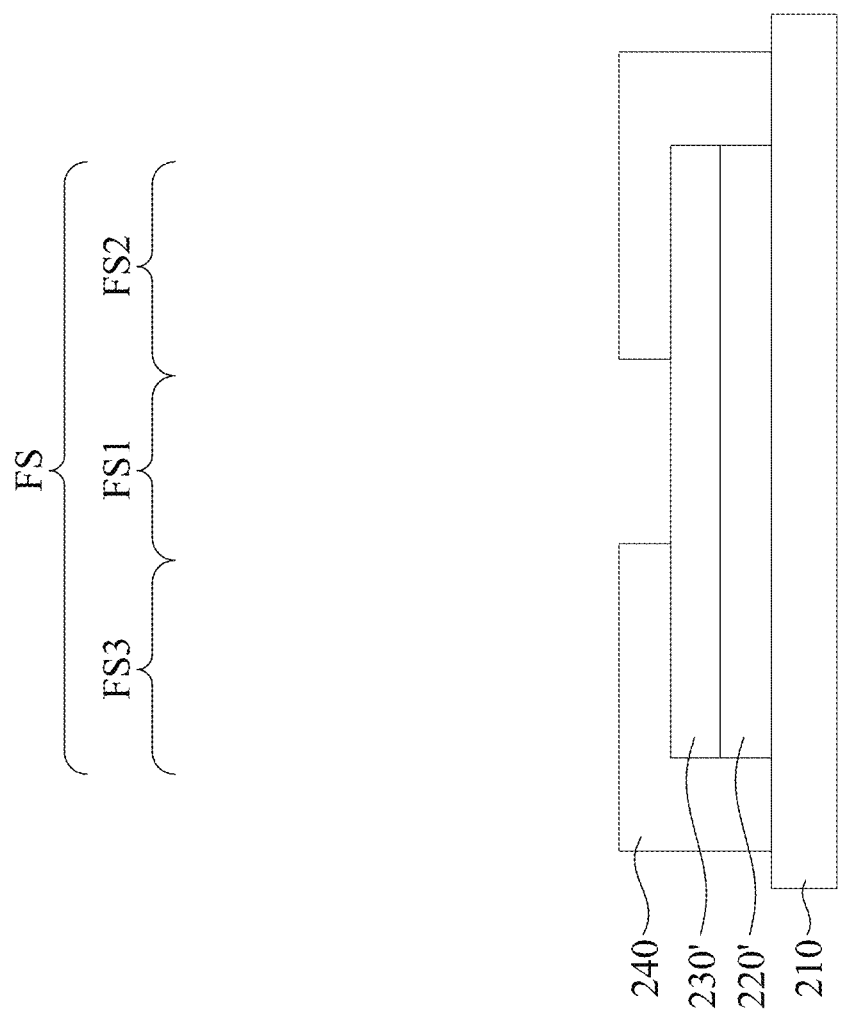
Figure 5D:
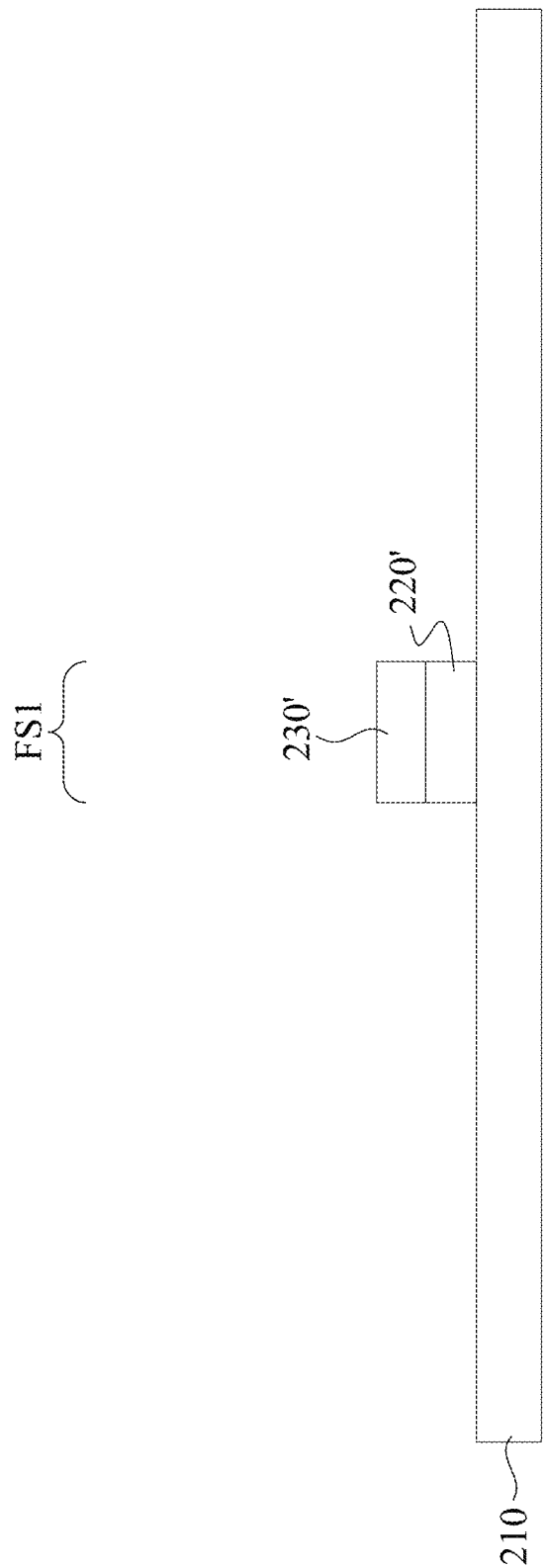

FIG. 5A is a perspective view of an integrated circuit device at an intermediate stage according to some embodiments of the present disclosure. FIG. 5B is a top view of the integrated circuit device of FIG. 5A. FIGS. 5C and 5D are cross-sectional views respectively taken along lines C-C and D-D of FIG. 5B. Reference is made to FIGS. 1A and 5A-5D. The method M proceeds to step S3, where a patterned mask 240 is formed covering the source and drain regions FS2 and FS3 of the fin structure FS (referring to FIG. 4B), and exposing the channel region FS1 of the fin structure FS.

The patterned mask 240 may be a hard mask for protecting the underlying source and drain regions FS2 and FS3 against subsequent etching process. The patterned mask 240 may include materials that provide a high etch selectivity with respect to the interlayer 220'. For example, the patterned mask 240 may include a dielectric material, such as silicon nitride, silicon oxynitride, silicon oxycarbide (SiOC), the like, or the combination thereof. Alternatively, the patterned mask 240 may include a metal material, such as titanium nitride (TiN), tantalum nitride (TaN), or tungsten nitride (WN), the like, or the combination thereof. The patterned mask 240 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 6A:
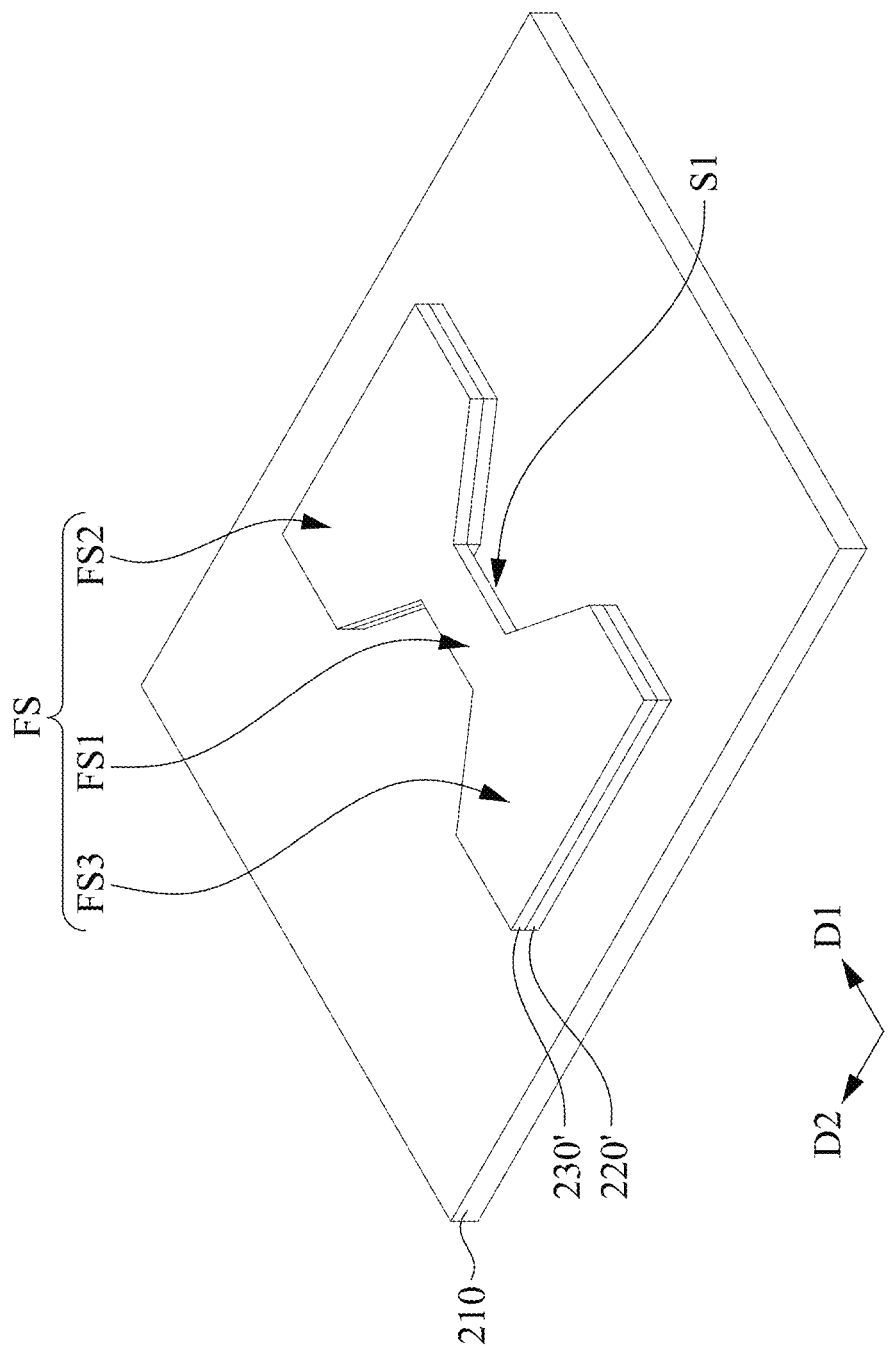
Figure 6B:
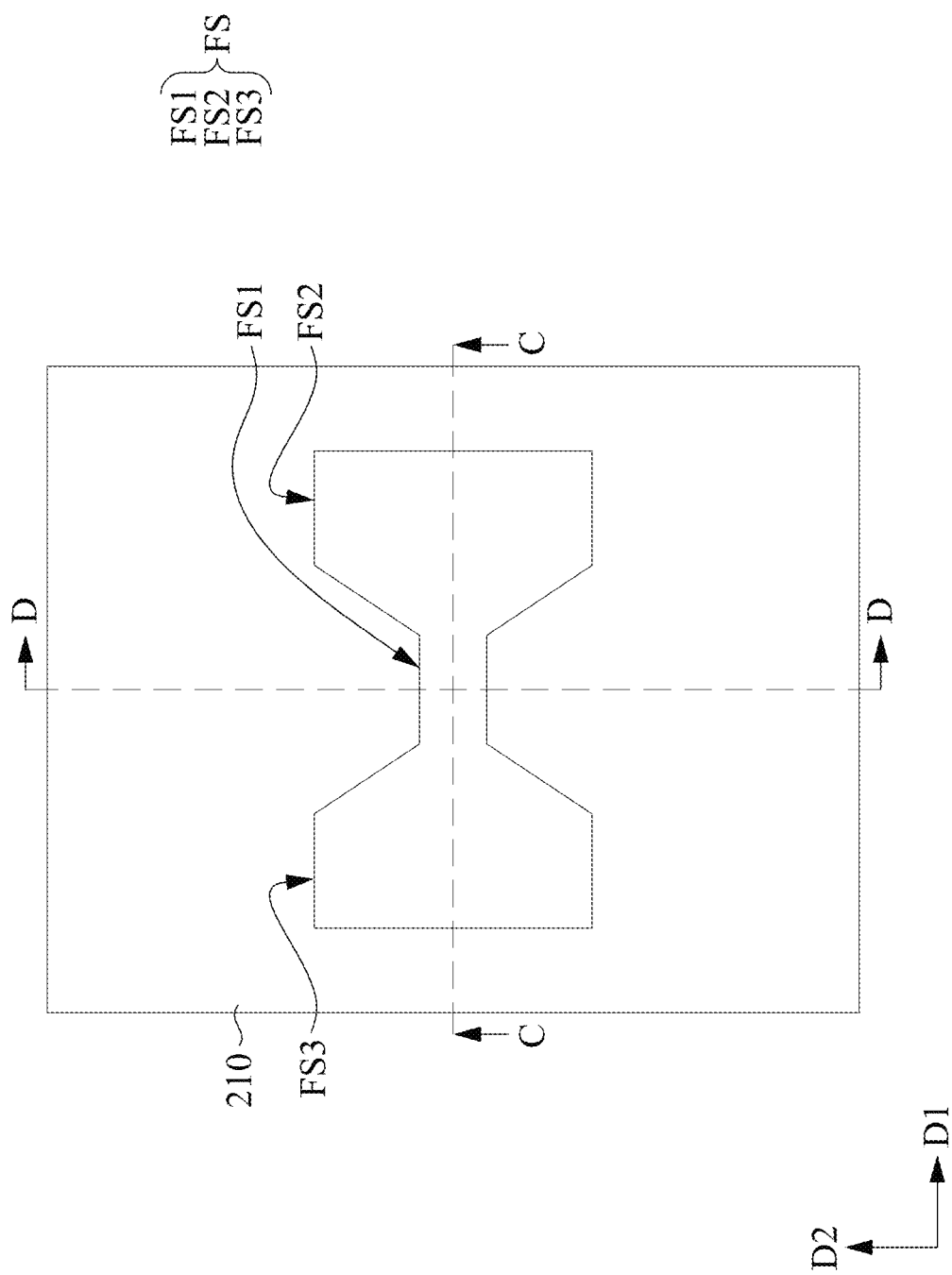
Figure 6C:
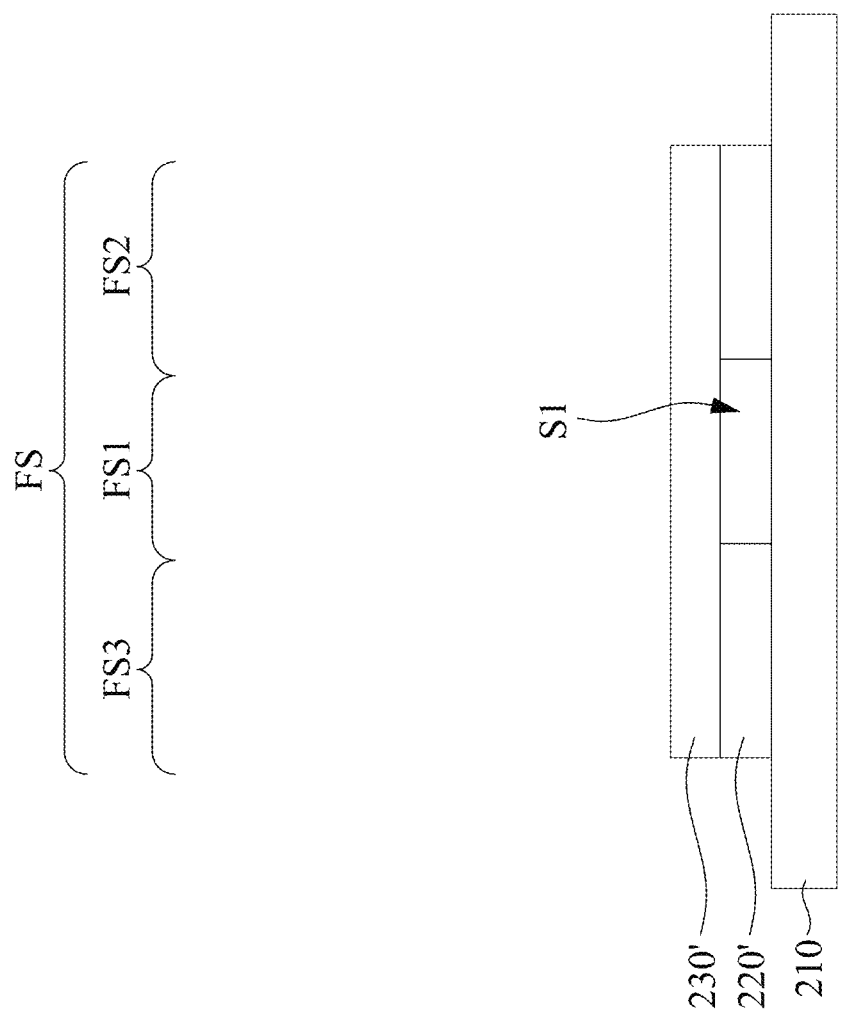

FIG. 6A is a perspective view of an integrated circuit device at an intermediate stage according to some embodiments of the present disclosure. FIG. 6B is a top view of the integrated circuit device of FIG. 6A. FIGS. 6C and 6D are cross-sectional views respectively taken along lines C-C and D-D of FIG. 6B. Reference is made to FIGS. 1A and 6A-6D. The method M proceeds to step S4, where a portion of the interlayer 220' in the channel region FS1 of the fin structure FS is etched and removed. The etching process may include a dry etch, wet etch, or the combination thereof. The etching process may use suitable etchants that has a higher etch rate to the interlayer 220' than an etch rate to the semiconductor layer 230', such that the etching process may not substantially remove a portion of the semiconductor layer 230' in the channel region FS1 of the fin structure FS. For example, the etchants may include HF or the like. After the etching process, the portion of the semiconductor layer 230' in the channel region FS1 of the fin structure FS is suspended and spaced apart from the substrate 110 by a space S1.

During the etching process, the source and drain regions FS2 and FS3 are protecting from being etched by the patterned mask 240 (referring to FIGS. 5A-5D). For example, the etchants may have a higher etch rate to the interlayer 220' than an etch rate to the patterned mask 240 (referring to FIGS. 5A-5D), such that the patterned mask 240 (referring to FIGS. 5A-5D) can remain covering the source and drain regions FS2 and FS3 after the etching process. Stated differently, the patterned mask 240 is used as an etch mask during the etching process. The patterned mask 240 (referring to FIGS. 5A-5D) may be removed after the etching process.

Figure 7A:
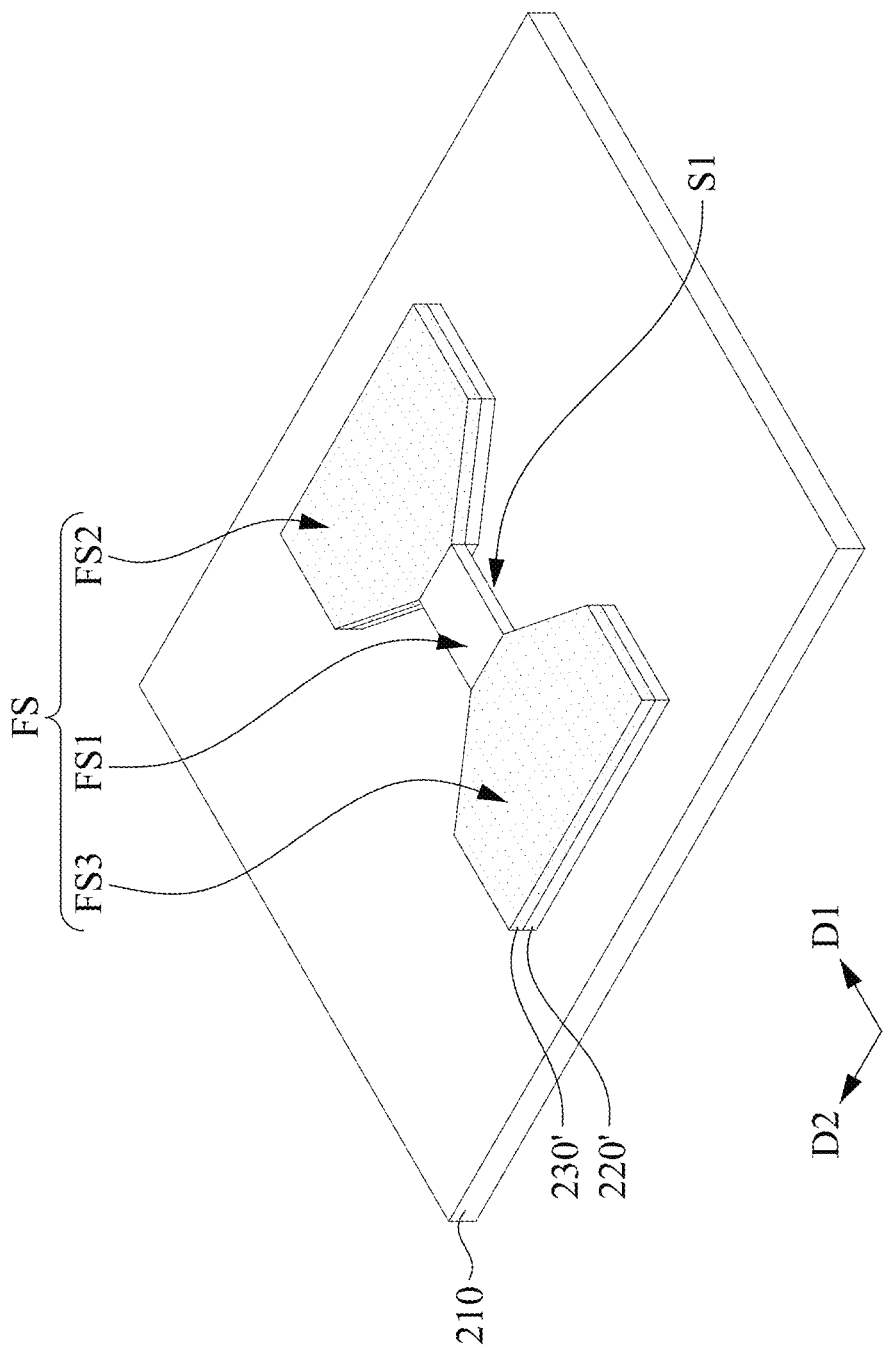
Figure 7B:
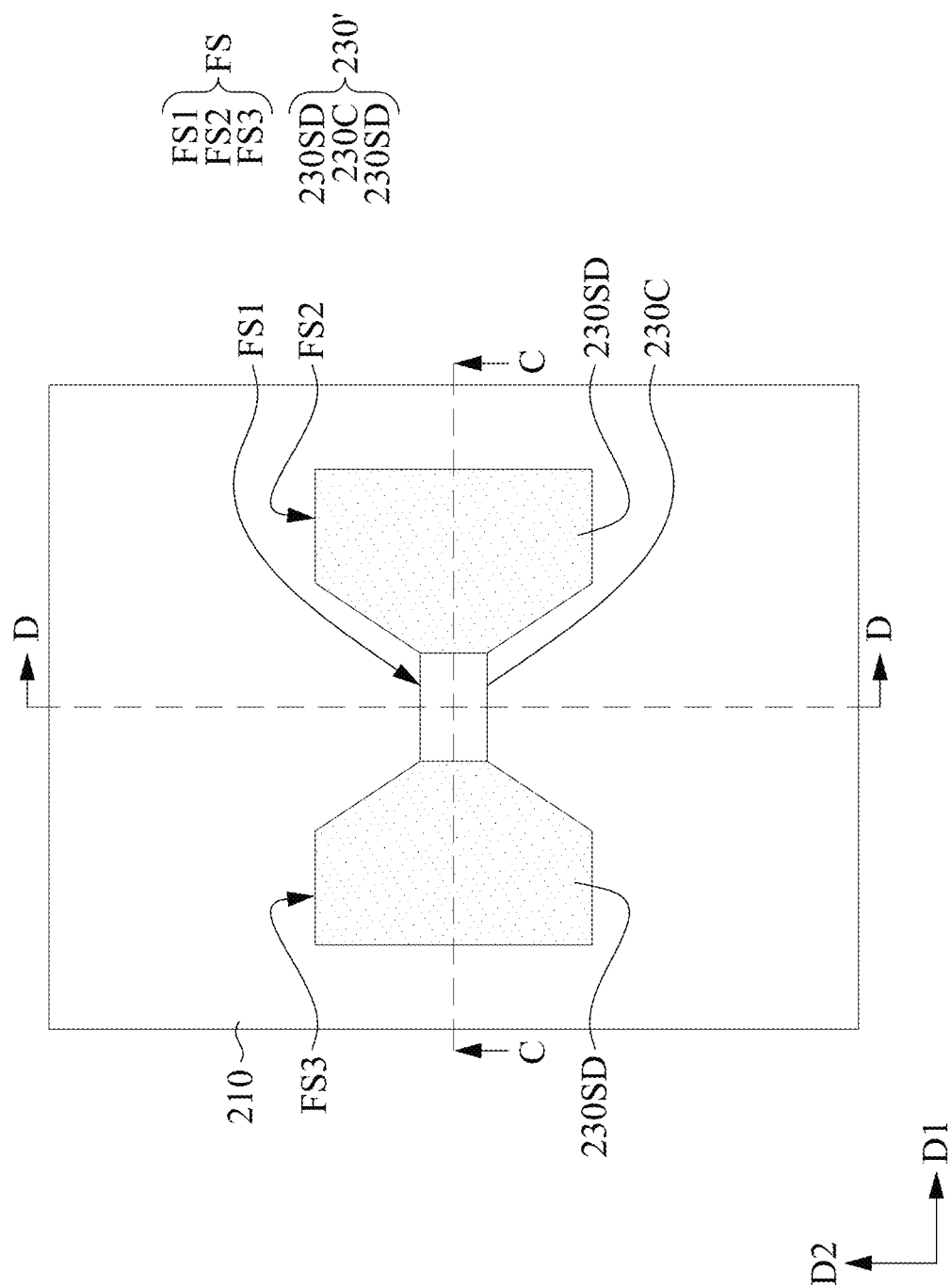
Figure 7C:
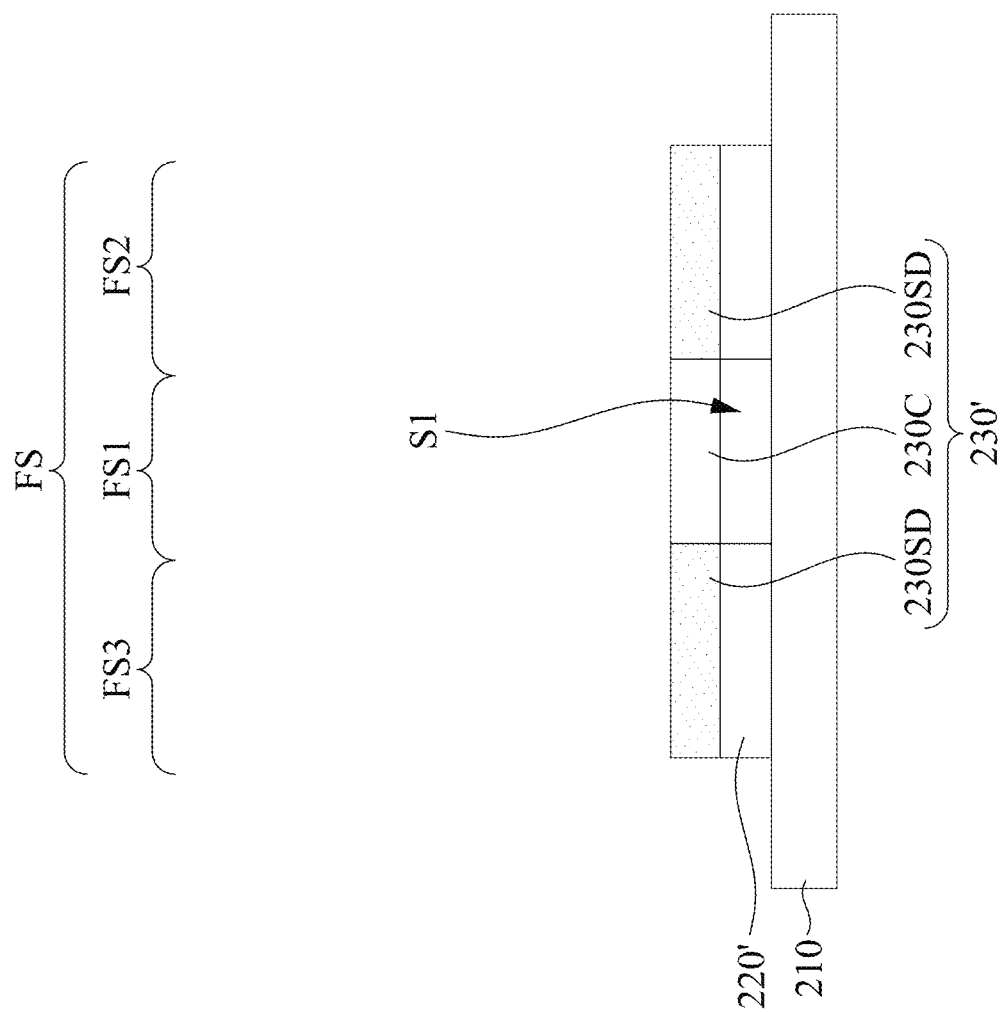

FIG. 7A is a perspective view of an integrated circuit device at an intermediate stage according to some embodiments of the present disclosure. FIG. 7B is a top view of the integrated circuit device of FIG. 7A. FIG. 7C is a cross-sectional view taken along line C-C of FIG. 7B. Reference is made to FIGS. 2A and 7A-7C. The method M proceeds to step S5, where source and drain features are formed. In present embodiments, portions of the semiconductor layer 230' in the source and drain regions FS2 and FS3 of the fin structure FS are doped. The doping process may use n-type dopants, such a phosphorous, arsenic or the like, or with p-type dopants, such as boron or the like. A doping concentration of the doped portions of the semiconductor layer 230' may be higher than about $10^{18}/cm^3$. The doping may be performed by an implantation process, a diffusion process, the like, or the combination thereof. The doped portions of the semiconductor layer 230' may be referred to as source and drain features 230SD. The undoped portion of the semiconductor layer 230' in the channel region FS1 of the fin structure FS may referred to as a channel region 230C hereinafter. The channel region 230C may not be intentionally doped, for example, not having intentionally placed dopants, but rather having a doping resulting from process contaminants. For example, the channel region 230C is a not intentional doped (NID) semiconductor layer and thus free from the dopants in the source and drain features 230SD. In some other embodiments, the channel region 230C may be doped with a p-type or an n-type, and with a doping concentration lower than that of the source and drain features 230SD. For example, the intrinsic channel region 230C has a dopant concentration lower than about $10^{13}/cm^3$.

In some alternative embodiments, portions of the semiconductor layer 230' in the source and drain regions FS2 and FS3 of the fin structure FS may be etched, and epitaxial materials can be deposited in the source and drain regions FS2 and FS3 on opposite sides of the channel region 230C. The epitaxial materials can be doped and serve as the source and drain features 230SD. The epitaxial materials may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. The epitaxial features source and drain features 230SD may be in-situ doped during the epitaxial process. If the epitaxial source and drain features 230SD are not in-situ doped, an implantation process (i.e., a junction implant process) is performed to dope the epitaxial source and drain features 230SD. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor layer 230'.

In some alternative embodiments, portions of the semiconductor layer 230' in the source and drain regions FS2 and FS3 of the fin structure FS are etched, and metal or alloy materials can be deposited in the source and drain regions FS2 and FS3 on opposite sides of the channel region 230C. The metal or alloy materials can serve as the source and drain features 230SD. For example, the metal or alloy materials may include Ni, NiGePt, or the like. In these embodiments, the source and drain features 230SD may form Schottky junction with the channel region 230C.

In some embodiments, prior to the formation of the source and drain features, an patterned mask is formed for exposing the portions of the semiconductor layer 230' in the source and drain regions FS2 and FS3 and covering other regions (e.g., the channel region 230C), thereby protecting other regions (e.g., the channel region 230C) from being intentionally doped or being etched. The patterned mask may be removed by suitable etching process after the formation of the source and drain features.

Figure 8:
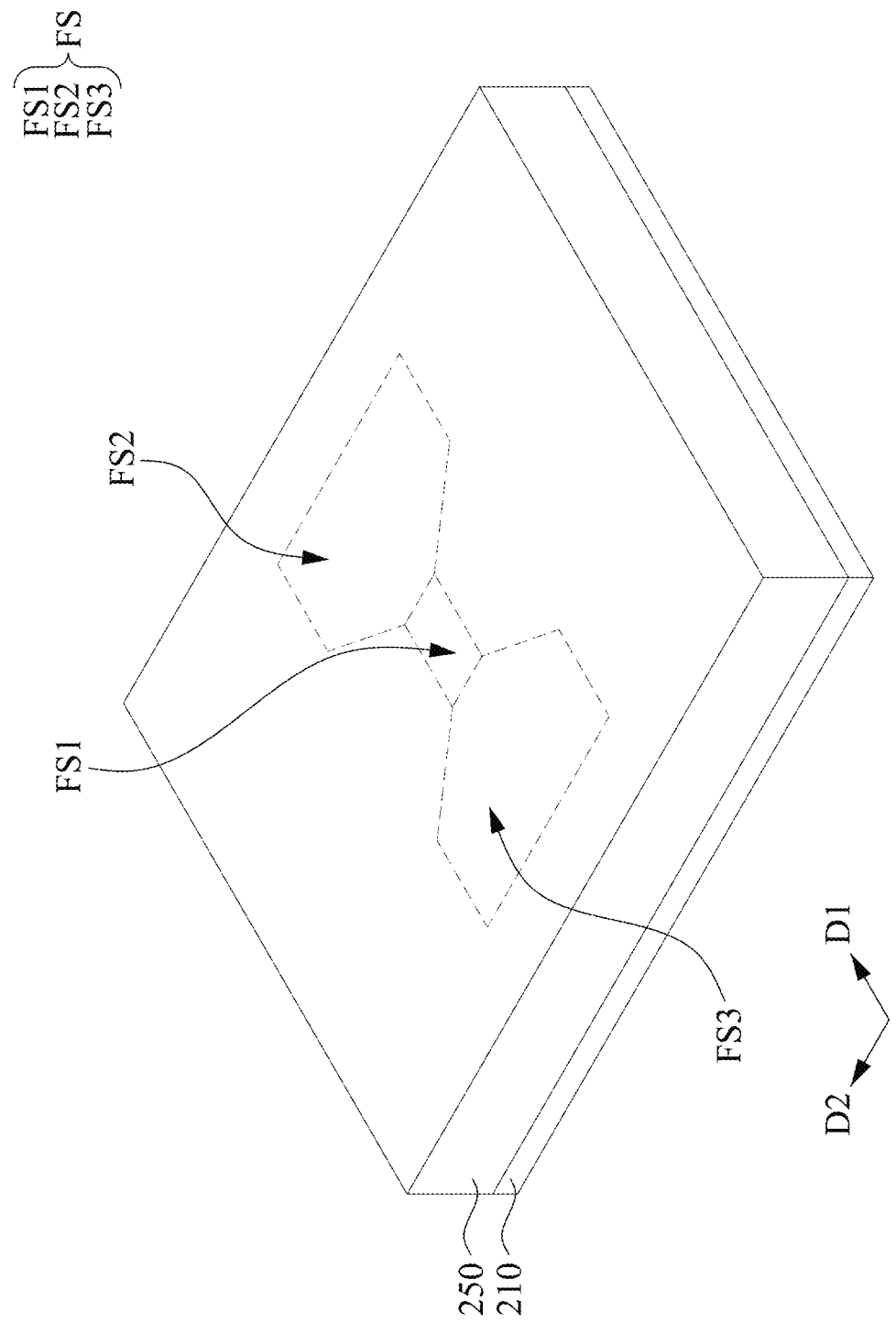

FIG. 8 is a perspective view of an integrated circuit device at an intermediate stage according to some embodiments of the present disclosure. The method M proceeds to step S6, where a first interlayer dielectric layer 250 is deposited over the structure of FIG. 7A. In some embodiments, the first interlayer dielectric layer 250 may include low-k dielectric materials having k values, for example, lower than about 4.0 or even 2.0. In some embodiments, the first interlayer dielectric layer 250 may be made of, for example, as silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The first interlayer dielectric layer 250 may be deposited using any suitable method, such as CVD, physical vapor deposition (PVD), ALD, PEALD, PECVD, SACVD, FCVD, spin-on, and/or the like, or a combination thereof.

A thickness of the first interlayer dielectric layer 250 may be in a range from about 10 nanometers to about 500 nanometers. If the thickness of the first interlayer dielectric layer 250 is less than about 10 nanometers, the first interlayer dielectric layer 250 have a top surface lower than the semiconductor layer 230', which may result in failure in forming separated bottom gate structures between plural devices in subsequent processes. If the thickness of the first interlayer dielectric layer 250 is greater than about 500 nanometers, a time duration for polishing and removing a top portion of the first interlayer dielectric layer 250 subsequently may be increased.

In the figures, the dash lines are used to indicate positions or regions of the underlying elements covered by the topmost layer. For example, in FIG. 8, the dash lines indicate the positions of the regions FS1-FS3 covered by the first interlayer dielectric layer 250.

Figure 9A:
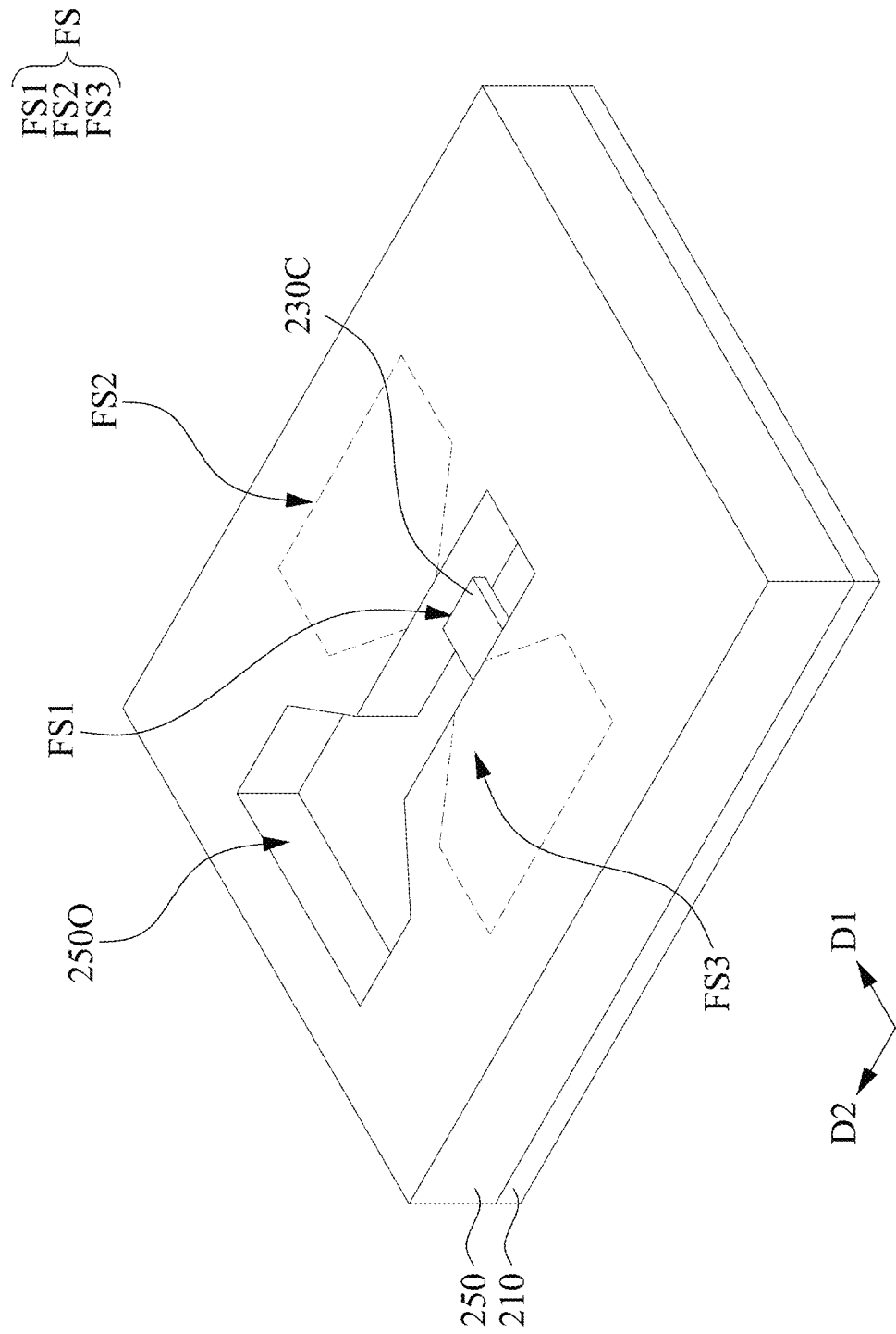
Figure 9B:
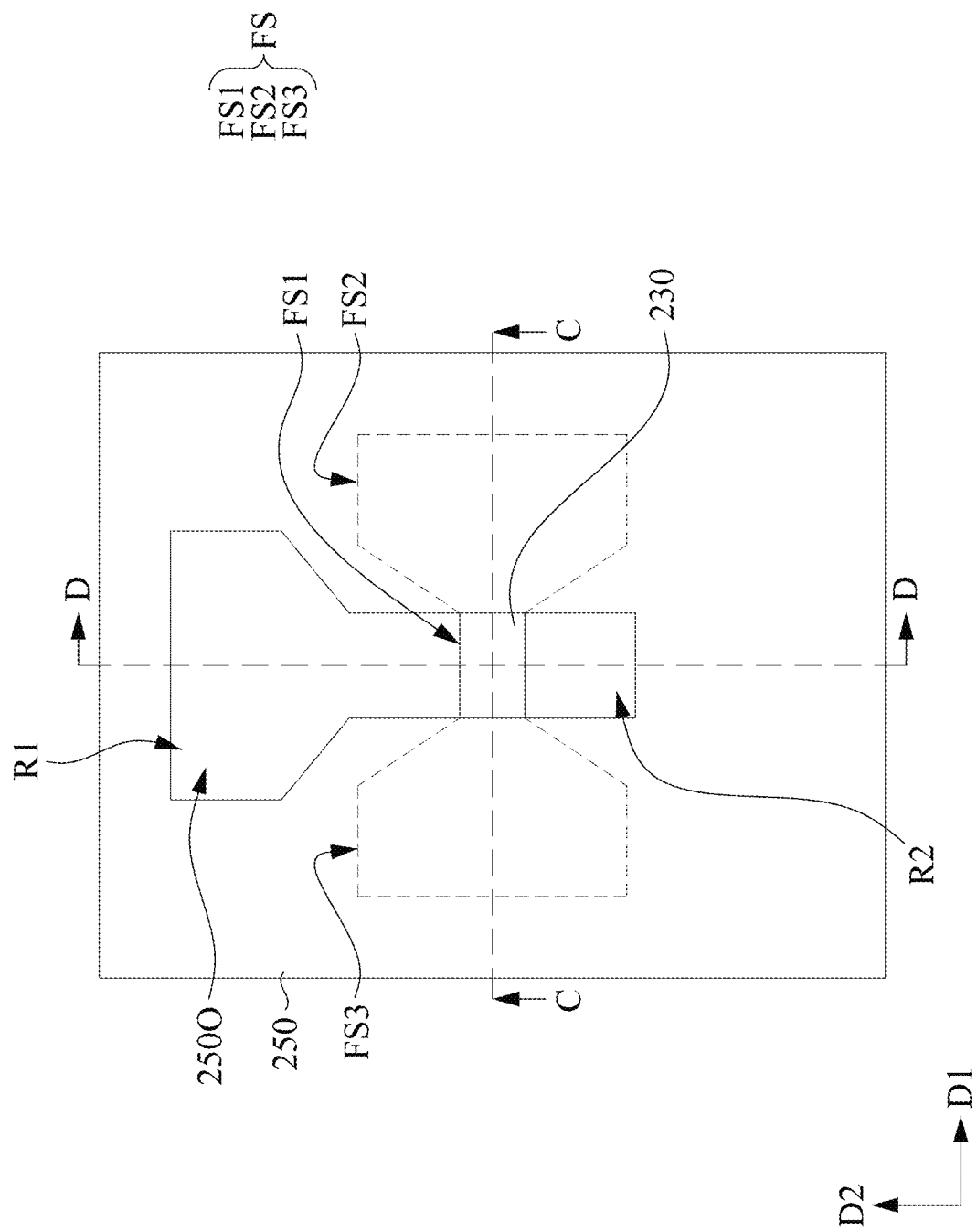
Figure 9C:
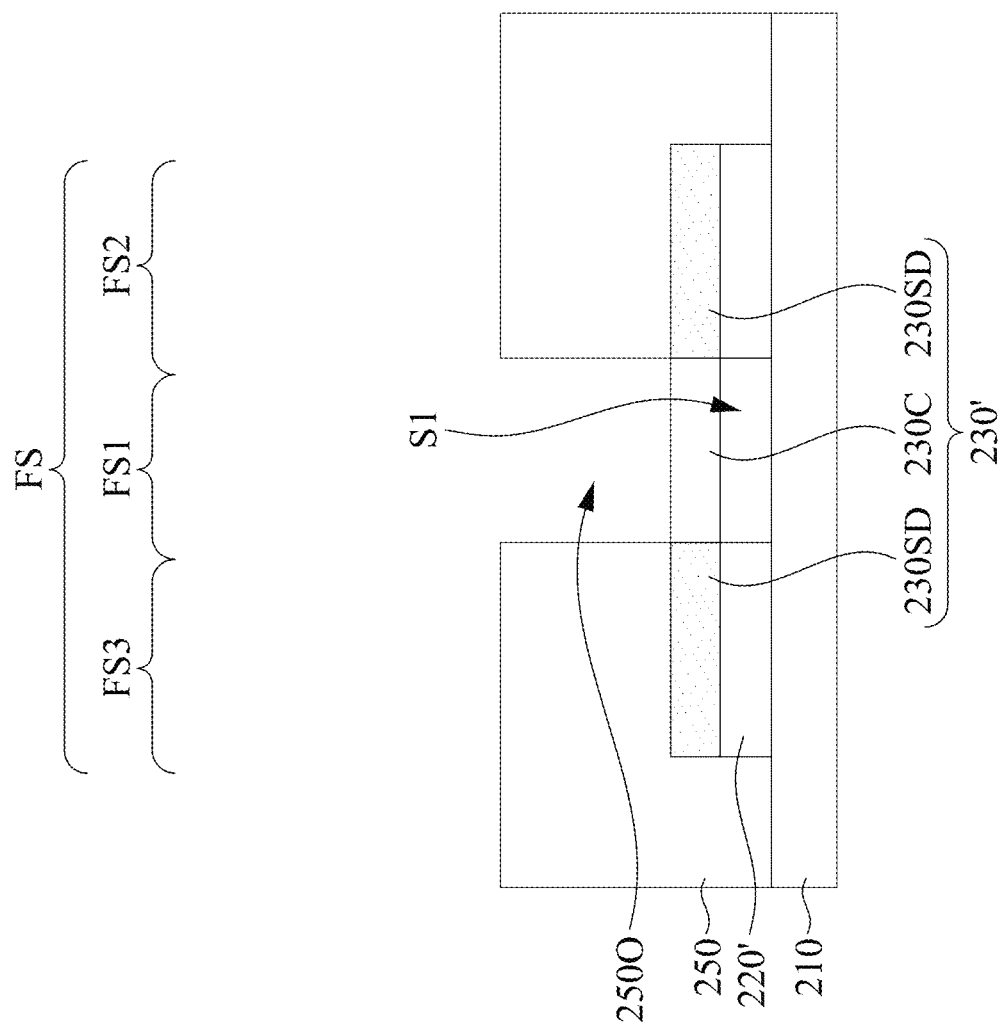
Figure 9D:
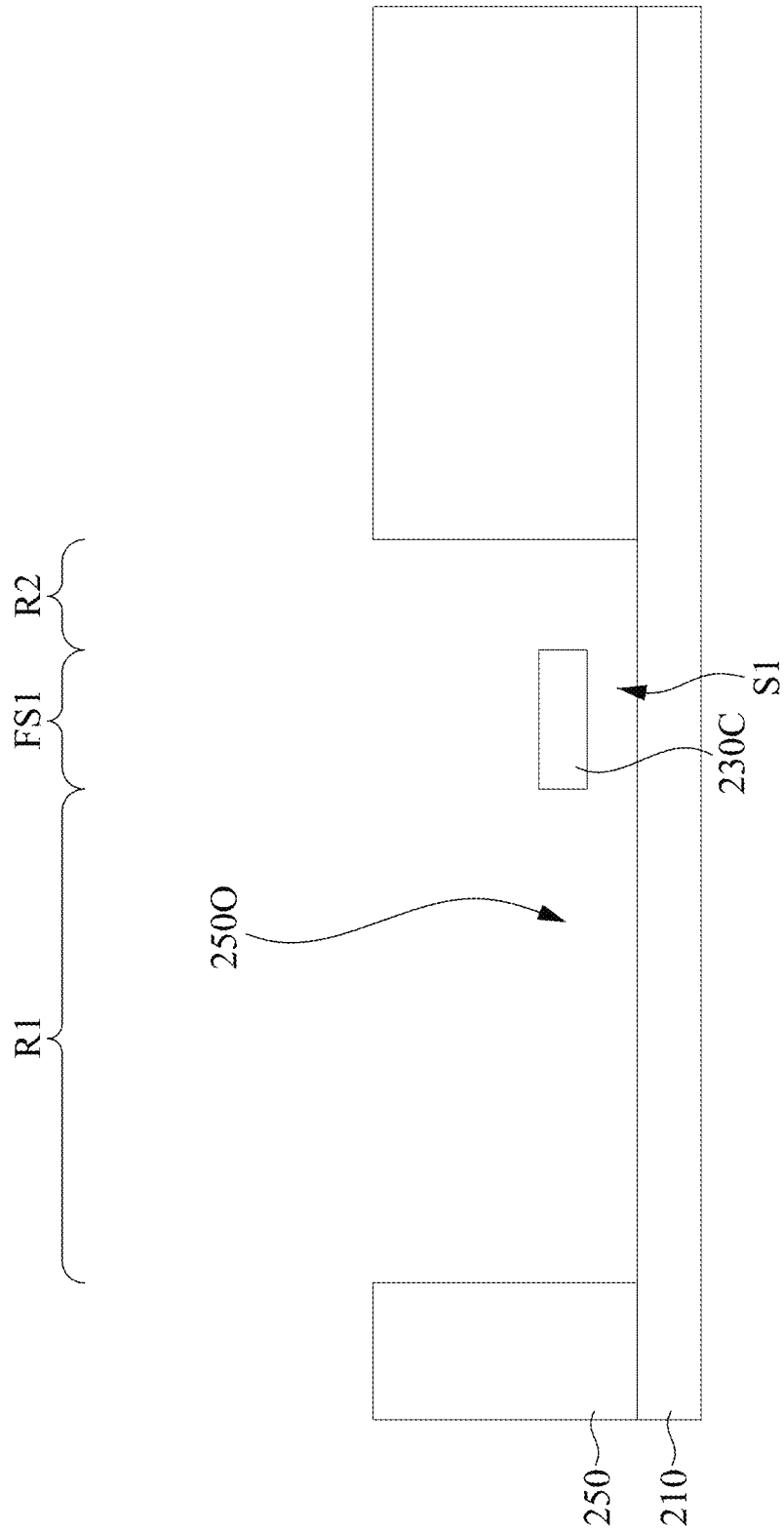

FIG. 9A is a perspective view of an integrated circuit device at an intermediate stage according to some embodiments of the present disclosure. FIG. 9B is a top view of the integrated circuit device of FIG. 9A. FIGS. 9C and 9D are cross-sectional views respectively taken along lines C-C and D-D of FIG. 9B. Reference is made to FIGS. 2A and 9A-9D. The method M proceeds to step S7, where the first interlayer dielectric layer 250 is patterned to have an opening 2500 exposing at least the channel region FS1 of the fin structure FS (i.e., the channel region 230C). The patterning of the first interlayer dielectric layer 250 may include an etching process, such as dry etch, wet etch, or the combination thereof. Above the channel region 230C, the opening 2500 may have a width the same as the channel width of the channel region 230C. The opening 2500 may extend beyond edges of the channel region 230C along the direction D2. For example, the opening 2500 may expose a first region R1 of the base substrate 210 and a second region R2 of the base substrate 210, in which the channel region FS1 is between the first and second region R2 along the direction D2. After the formation of the opening 2500, the source and drain features 230SD are covered by the first interlayer dielectric layer 250, not exposed by the opening 2500.

In some embodiments, prior to the etching process, a patterned mask (not shown) is formed over the first interlayer dielectric layer 250. The patterned mask (not shown) may expose portions of the first interlayer dielectric layer 250 over the channel region FS1 and regions R1 and R2 and cover portions of the first interlayer dielectric layer 250 over the regions FS2 and FS3. The patterned mask may include suitable materials that provide a high etch selectivity with respect to the first interlayer dielectric layer 250, thereby serving as an etch mask during patterning the first interlayer dielectric layer 250. For example, the patterned mask (not shown) may include silicon nitride, silicon oxynitride, the like, or the combination thereof. The patterned mask may be formed by a series of operations including deposition, photolithography patterning, and etching processes, as the formation of the pattern mask 240 (referring to FIGS. 5A-5C).

After patterning the first interlayer dielectric layer 250, the patterned mask (not shown) is removed by suitable etching process.

Figure 10A:
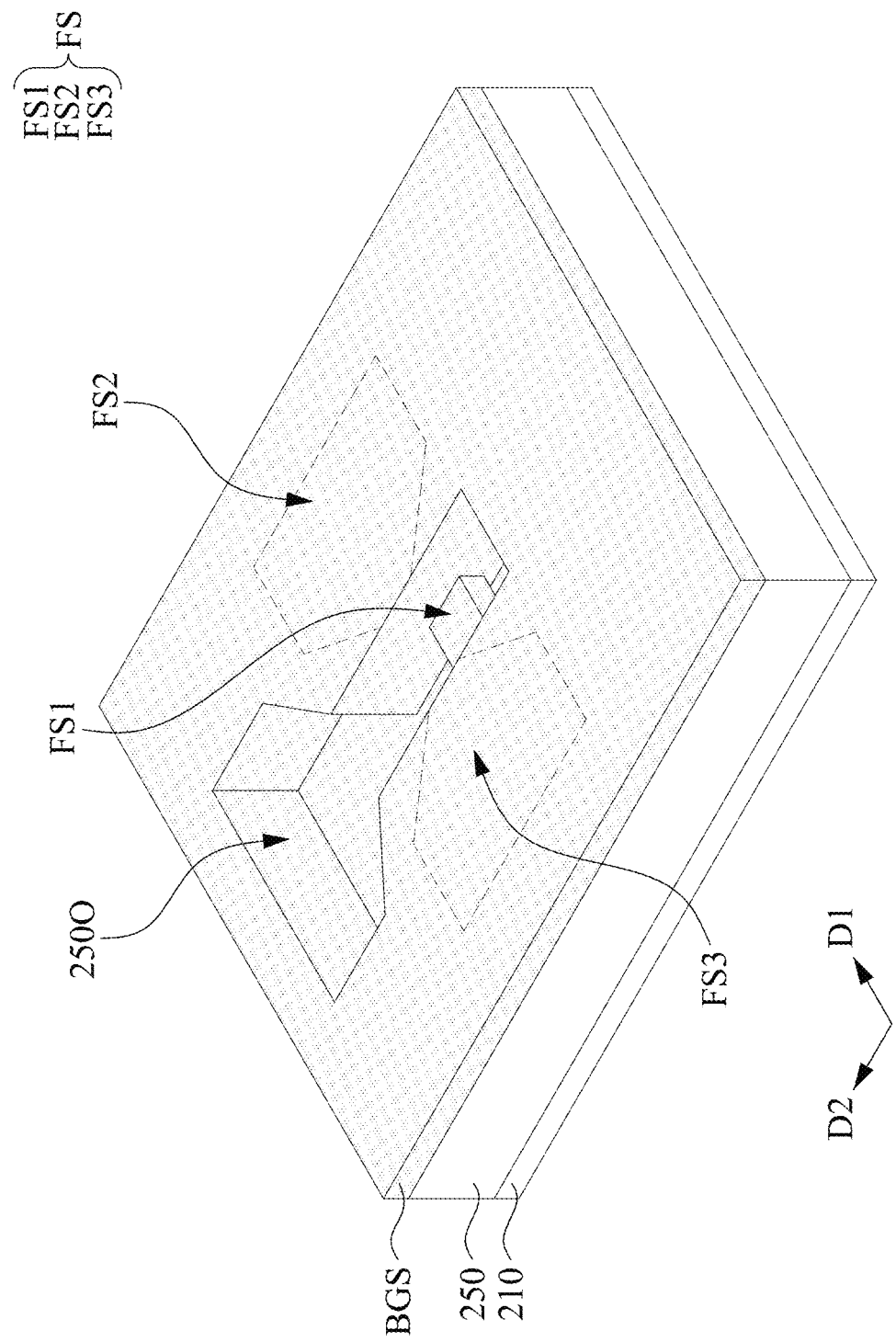
Figure 10B:
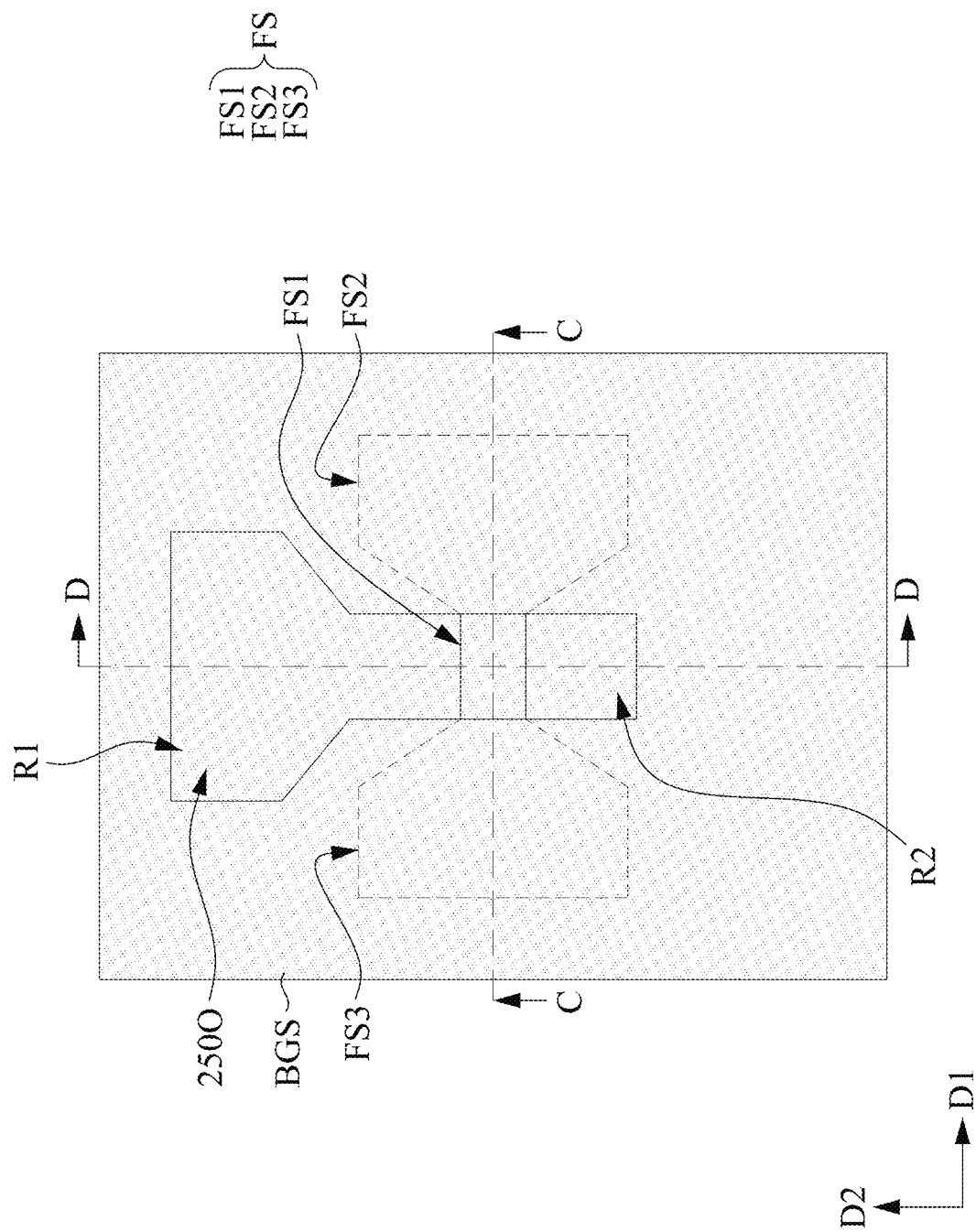
Figure 10C:
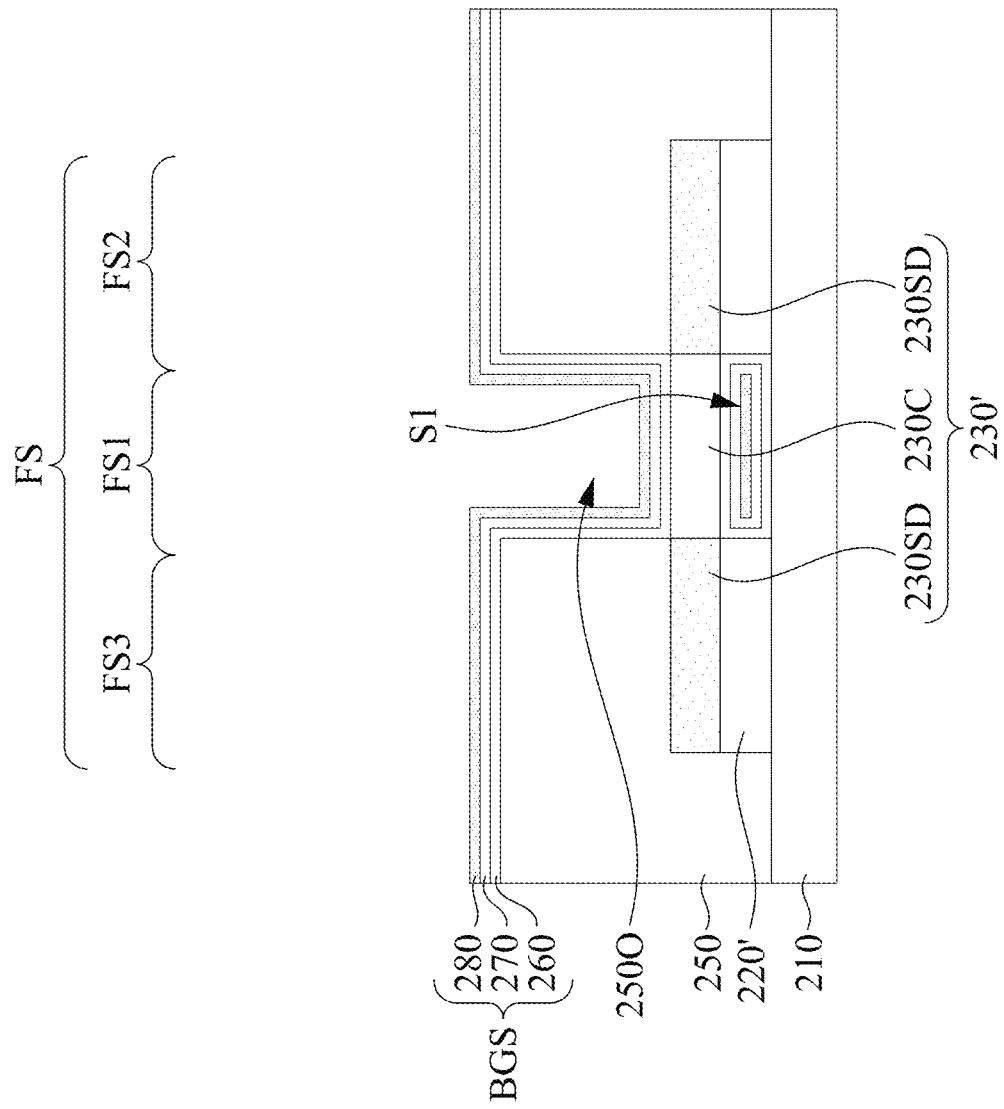
Figure 10D:
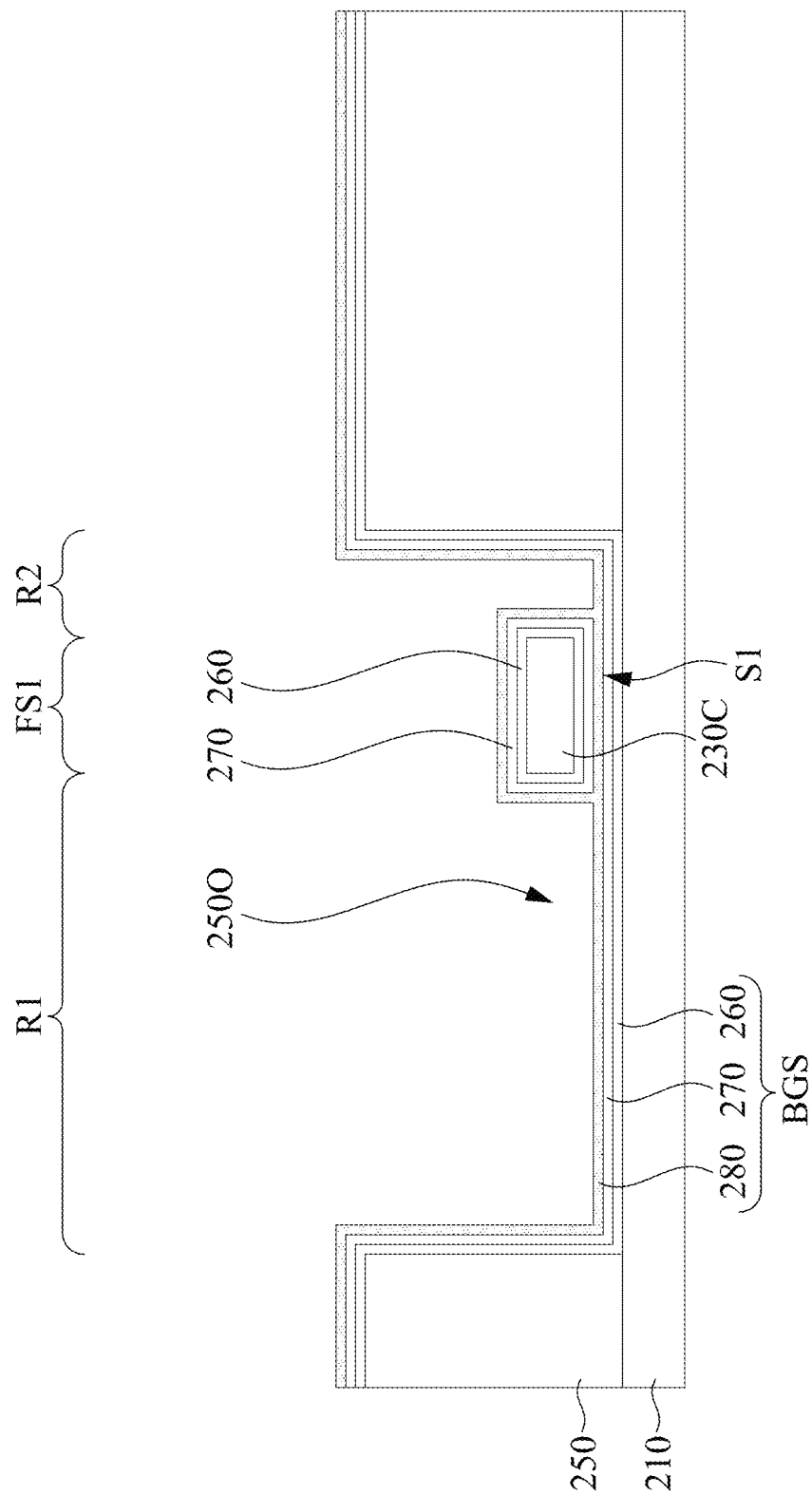

FIG. 10A is a perspective view of an integrated circuit device at an intermediate stage according to some embodiments of the present disclosure. FIG. 10B is a top view of the integrated circuit device of FIG. 10A. FIGS. 10C and 10D are cross-sectional views respectively taken along lines C-C and D-D of FIG. 10B. Reference is made to FIGS. 2A and 10A-10D. The method M proceeds to step S8, where a bottom gate multilayer stack BGS is deposited over the first interlayer dielectric layer 250 and into the opening 2500 in the first interlayer dielectric layer 250. The gate multilayer stack BGS may fill the space S1. The gate multilayer stack BGS may include a gate dielectric layer 260, a work function metal layer 270, and a gate electrode layer 280. The gate dielectric layer 260 may include a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. The work function metal layer 270 may include TiN, TaN, Ru, Mo, Al, for a p-type FET, and Ti, Ag, TaAl, TaAlC, TiAlN, TaC, TaCN, TaSiN, Mn, Zr, for an n-type FET. The gate electrode layer 280, which fills a remainder of the recess, may include metals such as Cu, Al, W, Co, Ru, or the like, or combinations thereof, or multi-layers thereof. The materials of the layers 260-280 may be deposited by any suitable method, e.g., CVD, PECVD, PVD, ALD, and/or the like.

The gate dielectric layer 260 may have a thickness in a range from about 1 nanometer to about 10 nanometers. If the thickness of the gate dielectric layer 260 is less than about 1 nanometer, the gate electrode may not be electrically isolated from the channel region. If the thickness of the gate dielectric layer 260 is greater than about 10 nanometers, a remaining space in the space S1 may become small, which increases the difficulty in depositing the work function metal layer 270 and the gate electrode layer 280. The metal gate of the gate multilayer stack BGS (e.g., a combination of the work function metal layer 270 and the gate electrode layer 280) may have a thickness in a range from about 1 nanometer to about 100 nanometers. If the thickness of the metal gate is less than about 1 nanometer, the deposited metal gate may not be a proper continuous film. If the thickness of the metal gate is greater than about 100 nanometers, a time duration for polishing and removing a top portion of the metal gate subsequently may be increased.

In the present embodiments, the gate multilayer stack BGS does not fill up the opening 2500 over the region R2. For example, a lowest portion of a top surface of the gate multilayer stack BGS over the region R2 is lower than a top surface of the channel region 230C. In some other embodiments, a length of the second region R2 exposed by the opening 2500 and/or thicknesses of layers of the gate multilayer stack BGS are designed such that the gate multilayer stack BGS may fill up the opening 2500 over the region R2. For example, the lowest portion of the top surface of the gate multilayer stack BGS over the region R2 may be higher than a top surface of the channel region 230C.

Figure 11A:
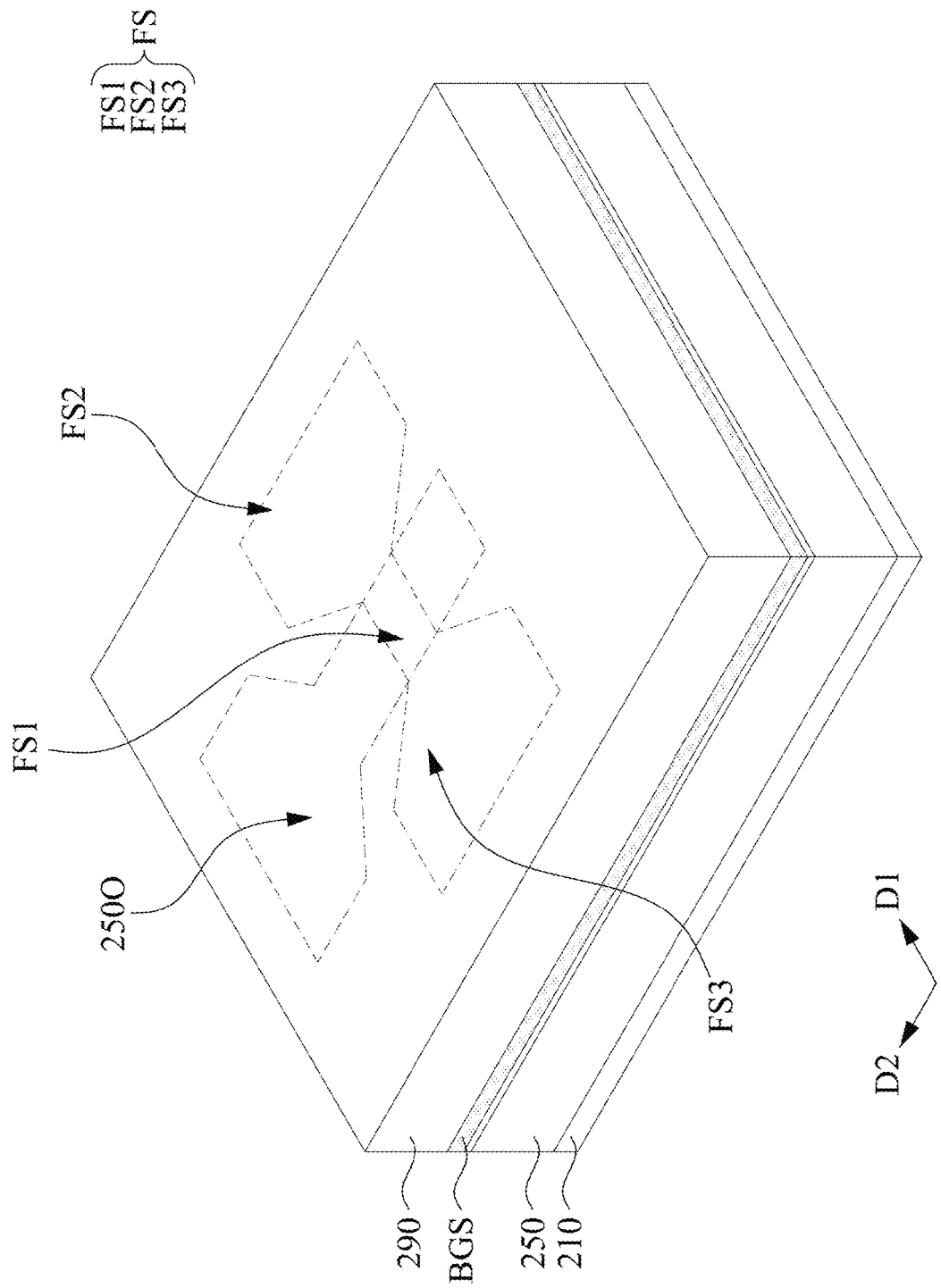
Figure 11B:
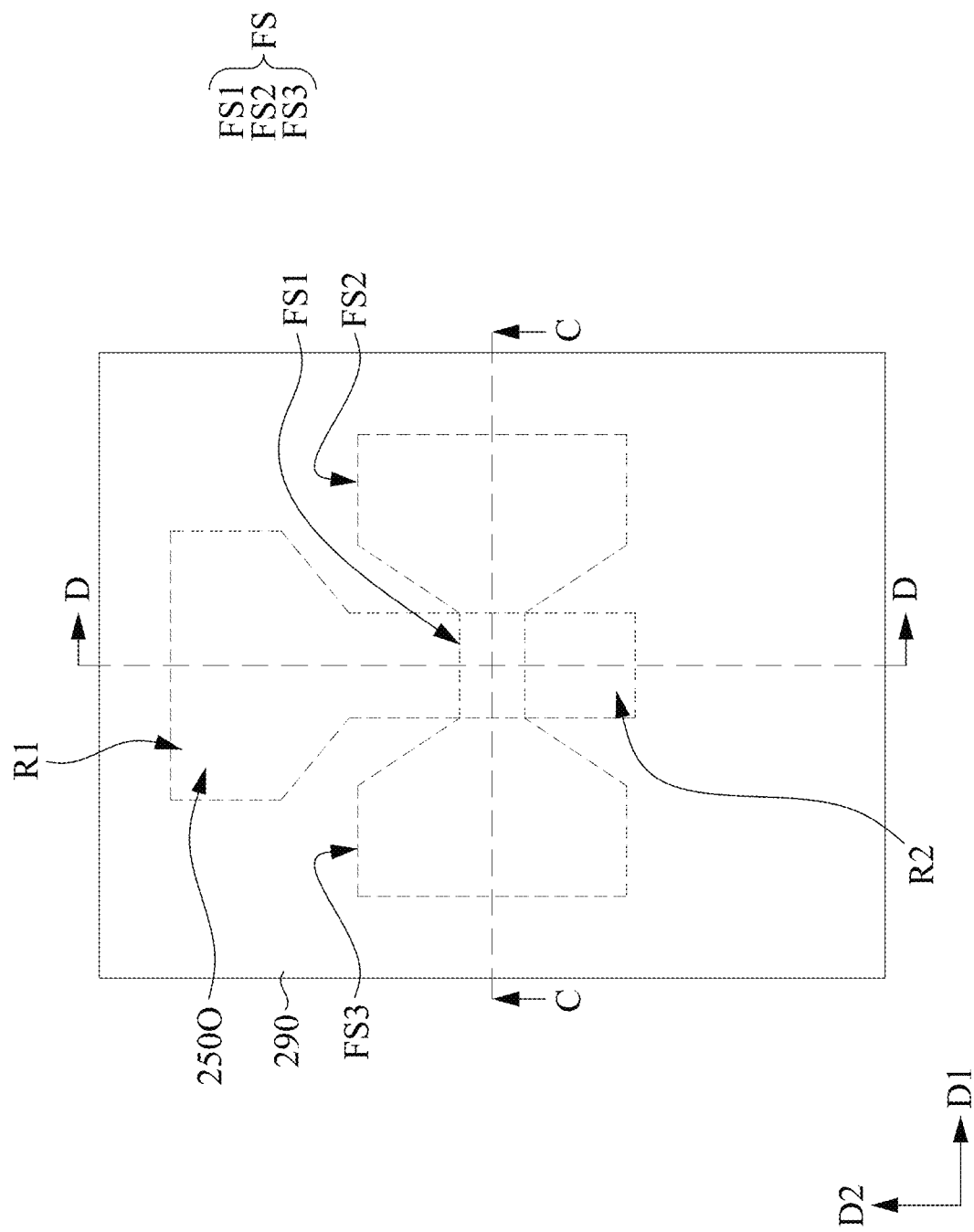
Figure 11C:
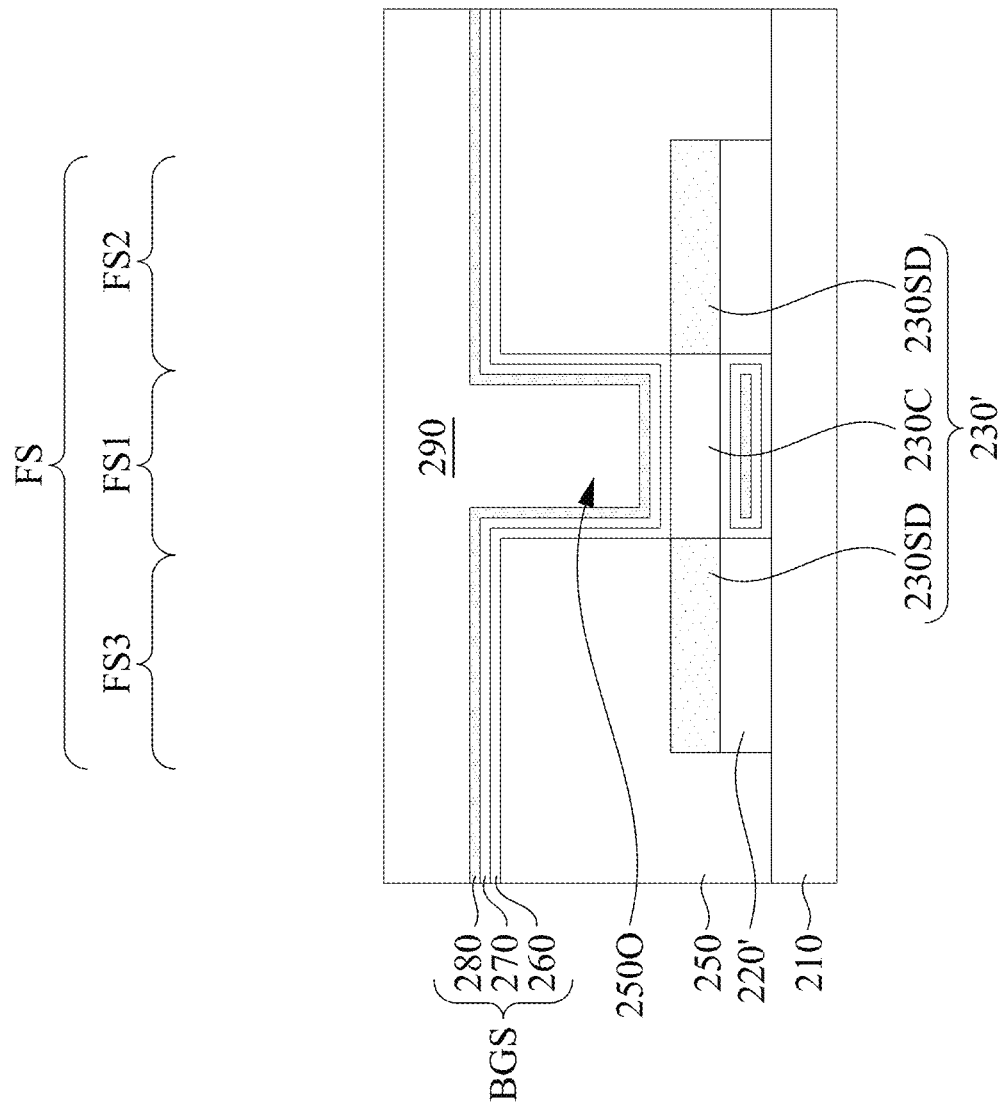
Figure 11D:
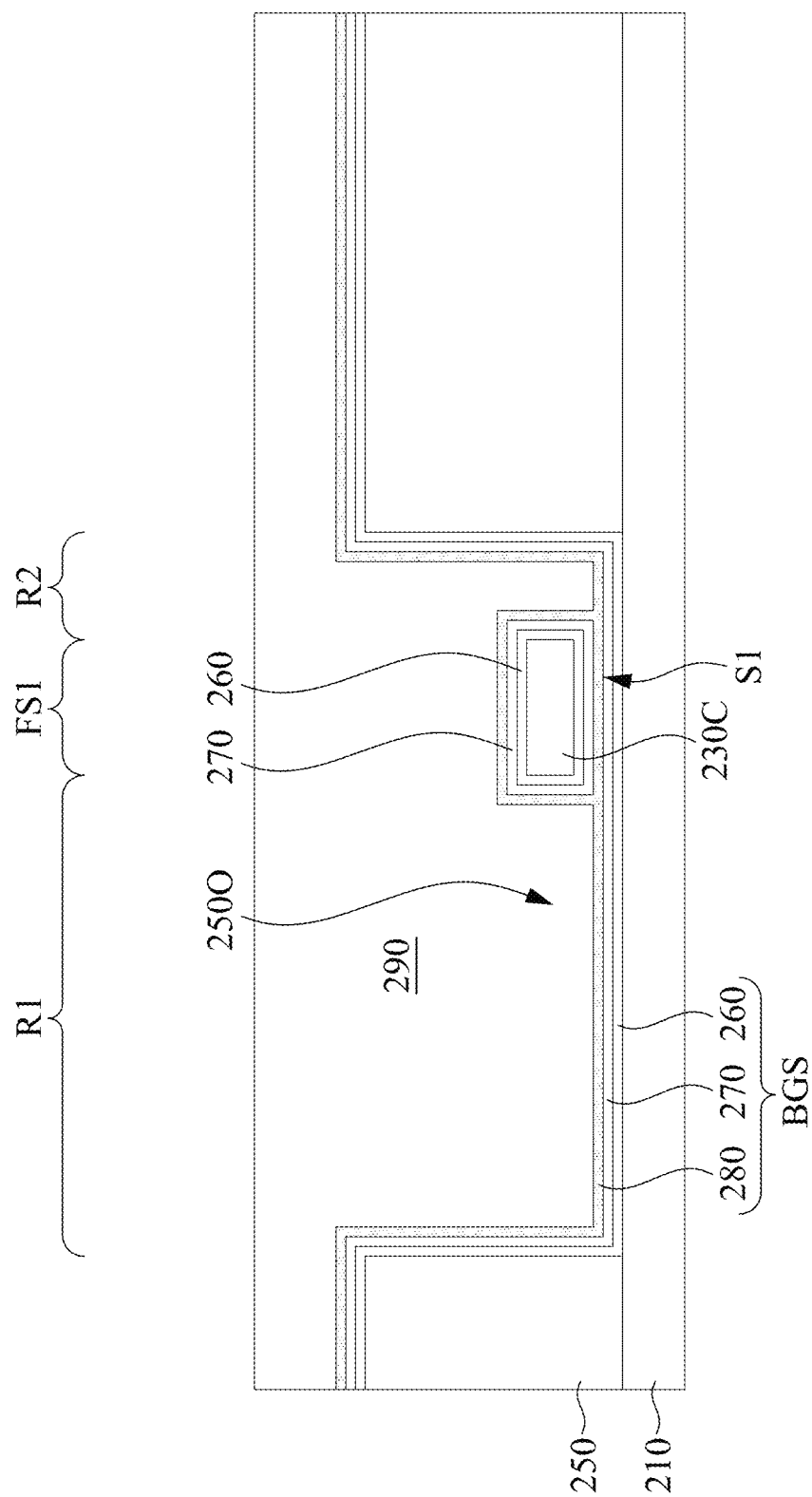

FIG. 11A is a perspective view of an integrated circuit device at an intermediate stage according to some embodiments of the present disclosure. FIG. 11B is a top view of the integrated circuit device of FIG. 11A. FIGS. 11C and 11D are cross-sectional views respectively taken along lines C-C and D-D of FIG. 11B. Reference is made to FIGS. 2B and 11A-11D. The method M proceeds to step S9, where the opening 2500 in the first interlayer dielectric layer 250 is overfilled with a second interlayer dielectric layer 290. In some embodiments, the second interlayer dielectric layer 290 may include low-k dielectric materials having k values, for example, lower than about 4.0 or even 2.0. In some embodiments, the second interlayer dielectric layer 290 may be made of, for example, silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The second interlayer dielectric layer 290 may be deposited using any suitable method, such as CVD, physical vapor deposition (PVD), ALD, PEALD, PECVD, SACVD, FCVD, spin-on, and/or the like, or a combination thereof.

A thickness of the second interlayer dielectric layer 290 may be in a range from about 10 nanometers to about 1000 nanometers. If the thickness of the second interlayer dielectric layer 290 is less than about 10 nanometers, the second interlayer dielectric layer 290 may not overfill opening 2500 in the first interlayer dielectric layer 250. If the thickness of the second interlayer dielectric layer 290 is greater than about 1000 nanometers, a time duration for polishing and removing a top portion of the second interlayer dielectric layer 290 subsequently may be increased.

Figure 12A:
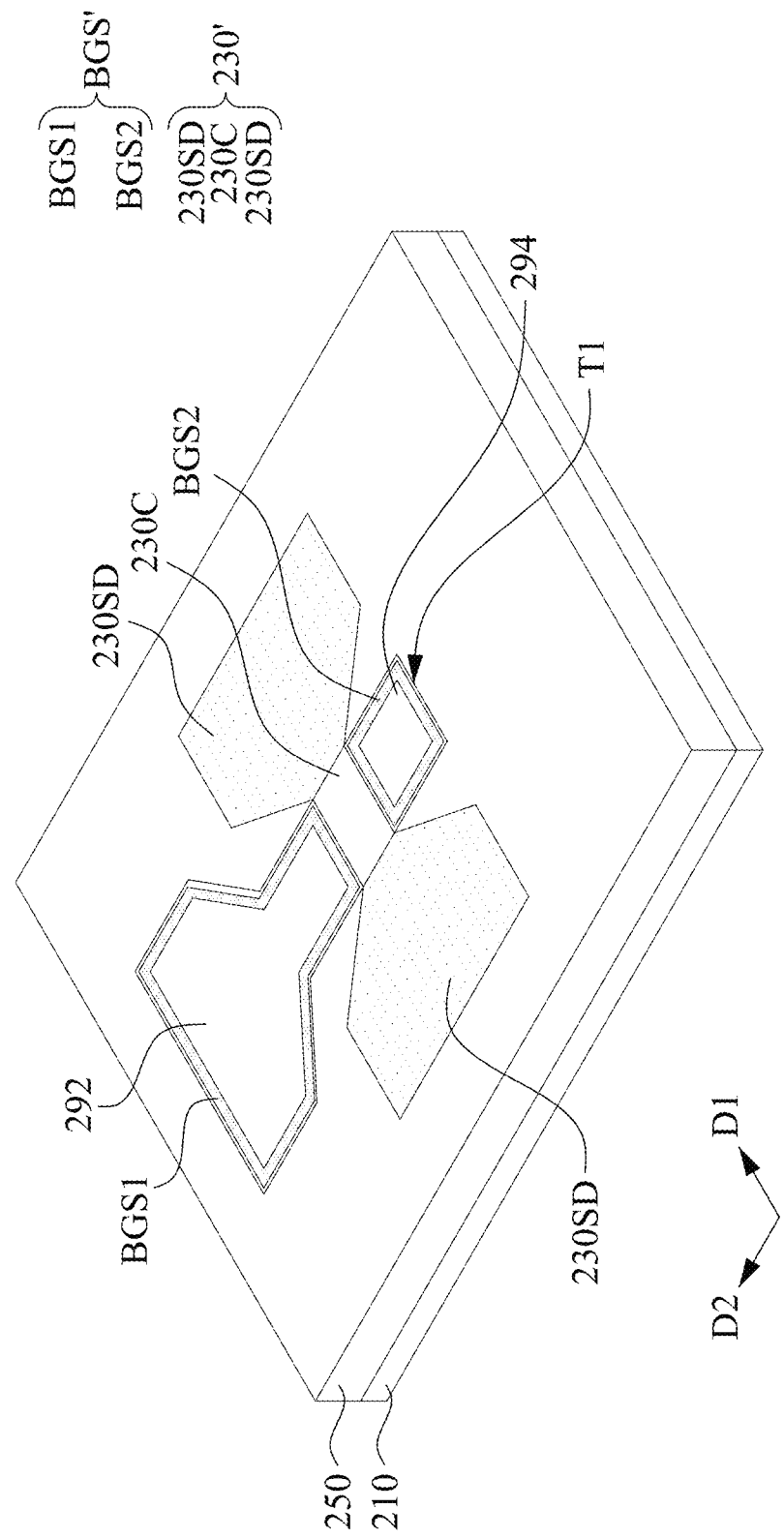
Figure 12B:
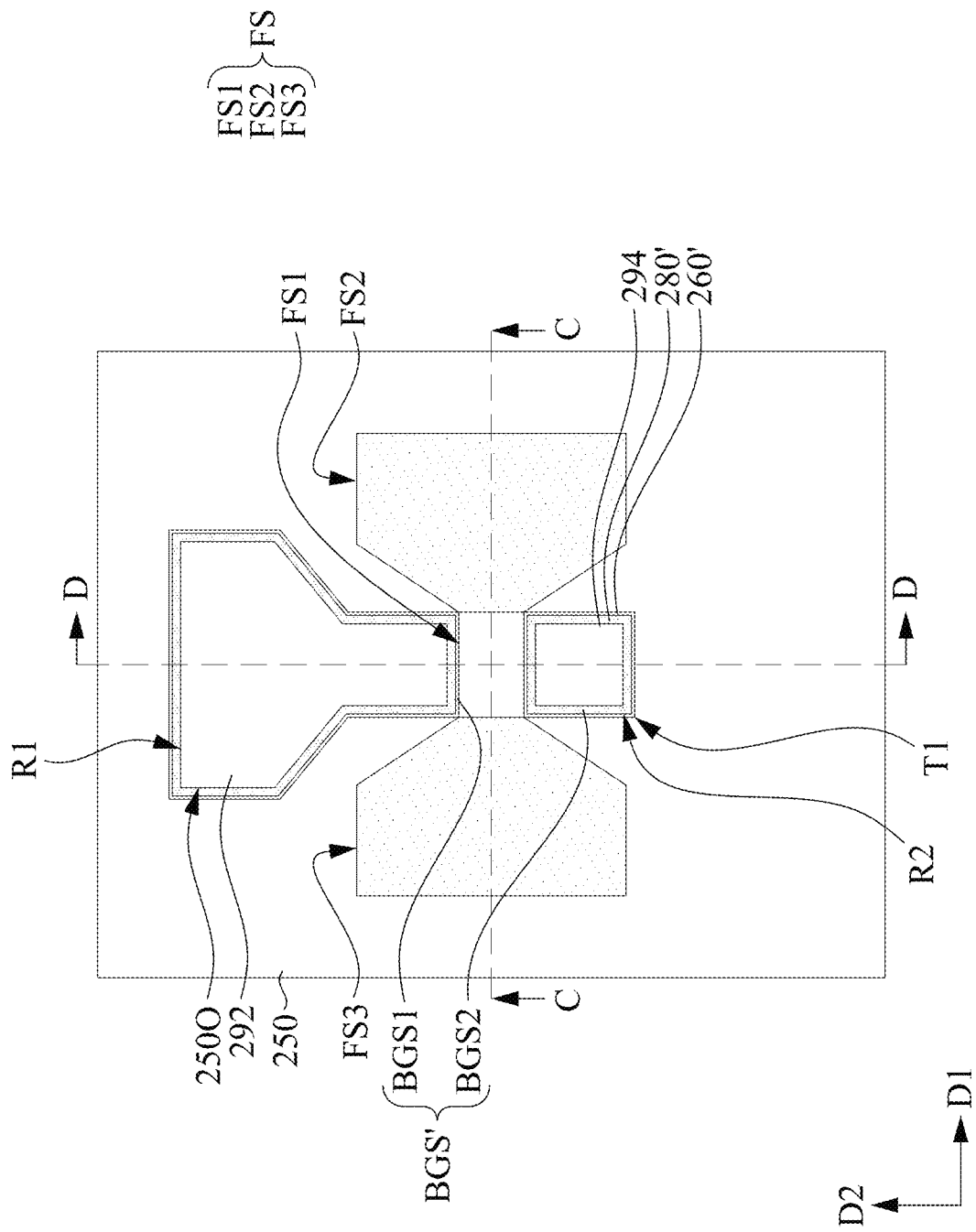
Figure 12C:
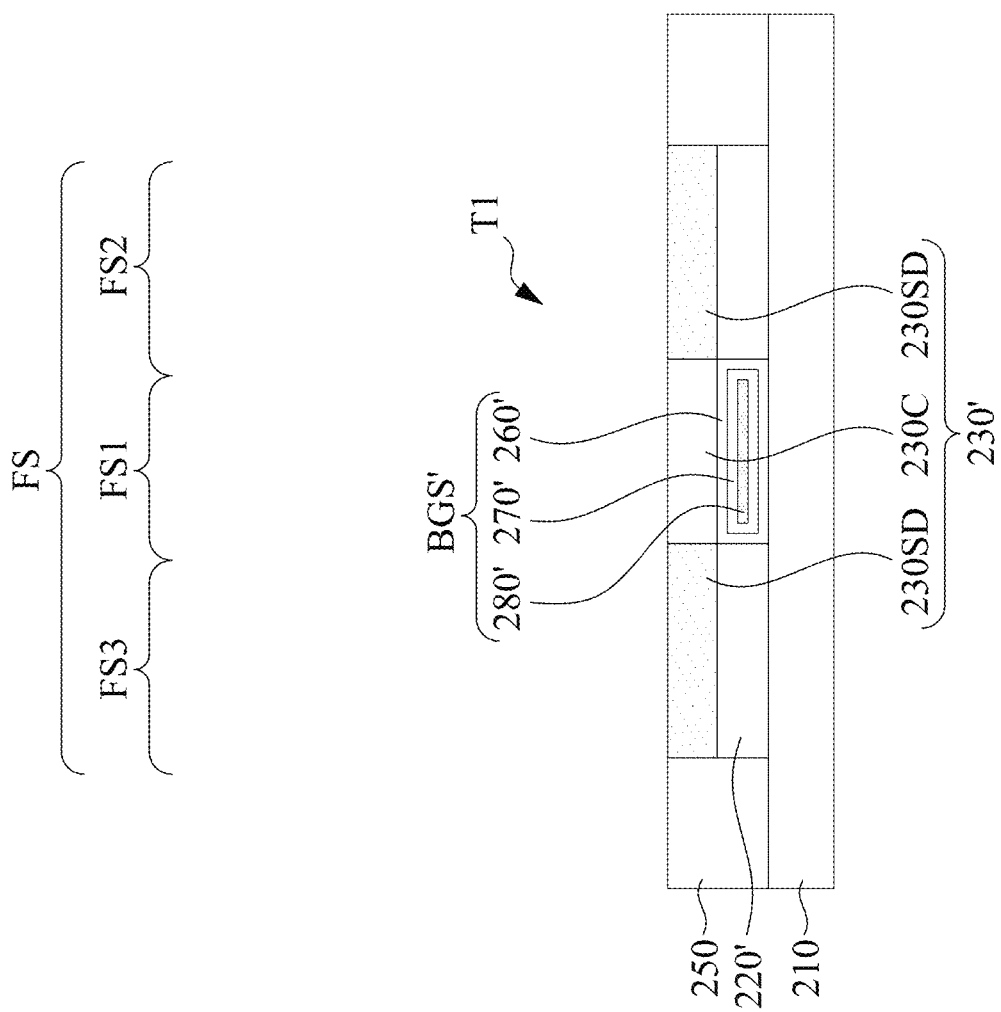
Figure 12D:
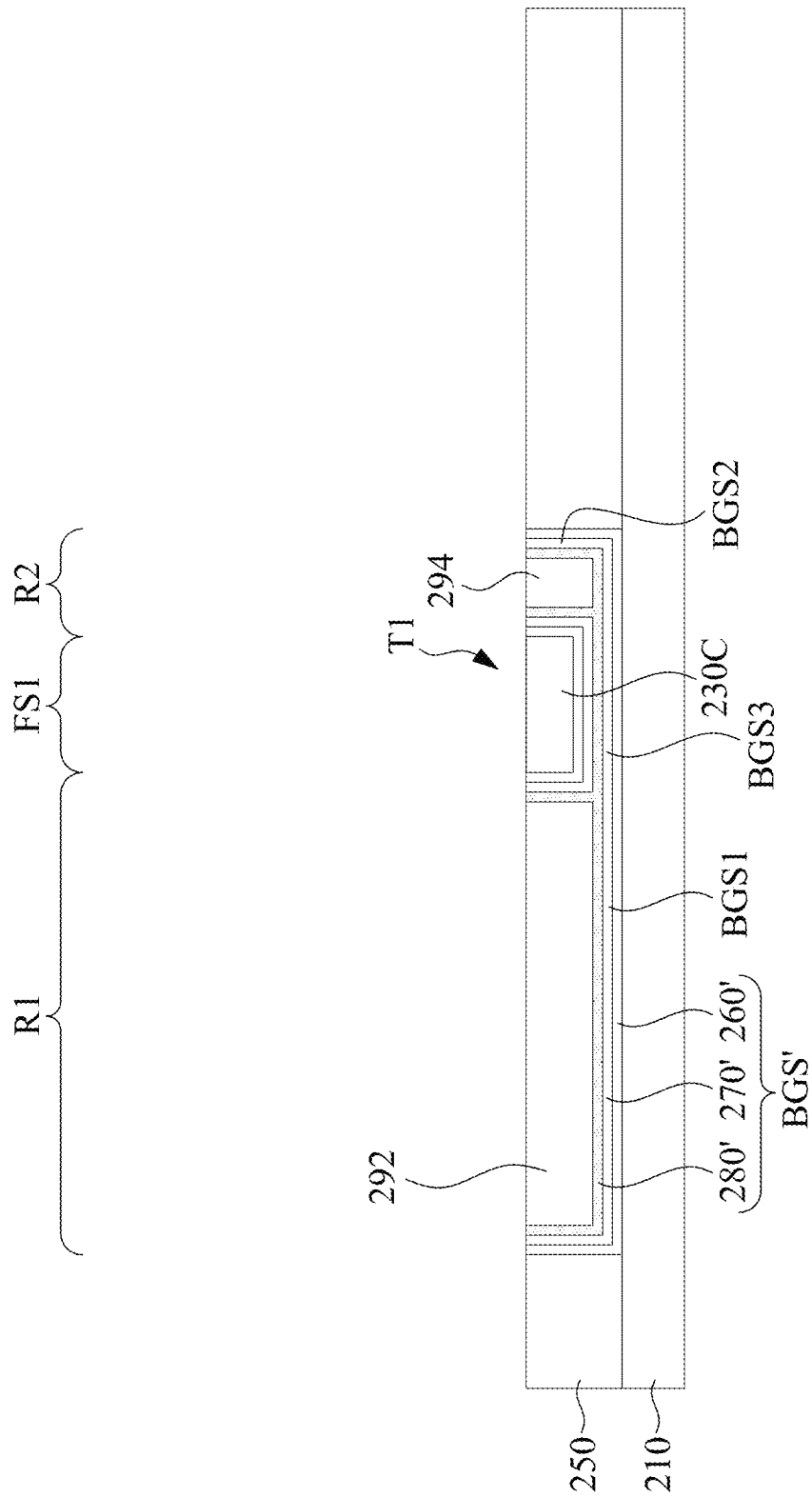

FIG. 12A is a perspective view of an integrated circuit device at an intermediate stage according to some embodiments of the present disclosure. FIG. 12B is a top view of the integrated circuit device of FIG. 12A. FIGS. 12C and 12D are cross-sectional views respectively taken along lines C-C and D-D of FIG. 11B. Reference is made to FIGS. 2B and 12A-12D. The method M proceeds to step S10, where a planarization process is performed on the second interlayer dielectric layer 290 (referring to FIGS. 11A-11D) until the semiconductor layer 230' is reached. The planarization process may include a chemical mechanical polish (CMP) process. Through the planarization process, a top portion of the gate multilayer stack BGS, the top portion of the second interlayer dielectric layer 290, and the top portion of the first interlayer dielectric layer 250 above the top surface of the semiconductor layer 230' (referring to FIGS. 11A-11D) are removed. In some embodiment, the duration of the planarization process is controlled by end-point detection. For example, the end-point detection may detect characteristics (e.g., electrical and/or optical characteristics) of polishing byproduct (e.g., silicon). A remaining portion of the gate multilayer stack BGS (referring to FIGS. 11A-11D) may be referred to as a gate structure BGS' after the planarization process. The gate structure BGS' may have a first portion BGS1 over the region R1, and a second portion BGS2 over the second region R2, and a third region BGS3 below the channel region 230C and connected between the first and second portion BGS1 and BGS2. In some embodiments, a width of the first portion BGS1 of the gate structure BGS' (or the region R1) measured along the direction D1 is greater than the channel length of the channel region 230C, which is beneficial for receiving a bottom gate contact.

In some embodiments, the planarization process removes portions of the gate dielectric layer 260, the work function metal layer 270, and the gate electrode layer 280 above the top surface of the semiconductor layer 230' (referring to FIGS. 11A-11D). Remaining portions of the gate dielectric layer 260, the work function metal layer 270, and the gate electrode layer 280 (referring to FIGS. 11A-11D) may be respectively referred to as gate dielectric layers 260', work function metal layers 270', and a gate electrode 280'. The gate structure BGS' includes the gate dielectric layers 260', the work function metal layers 270', and the gate electrode 280'. Through the steps, a transistor T1 including the gate structure BGS', the channel region 230C, and the source/drain features 230SD is formed.

In the present embodiments, remaining portions of the second interlayer dielectric layer 290 (referring to FIGS. 11A-11D) may be referred to as an interlayer dielectric 292 and an interlayer dielectric 294, respectively surrounded by the first portion BGS1 and the second portion BGS2 of the gate structure BGS'. In some alternative embodiments, by designing a small region R2, the second portion BGS2 may fill up the opening 2500 over the region R2, and the interlayer dielectric 294 may be omitted.

Figure 13A:
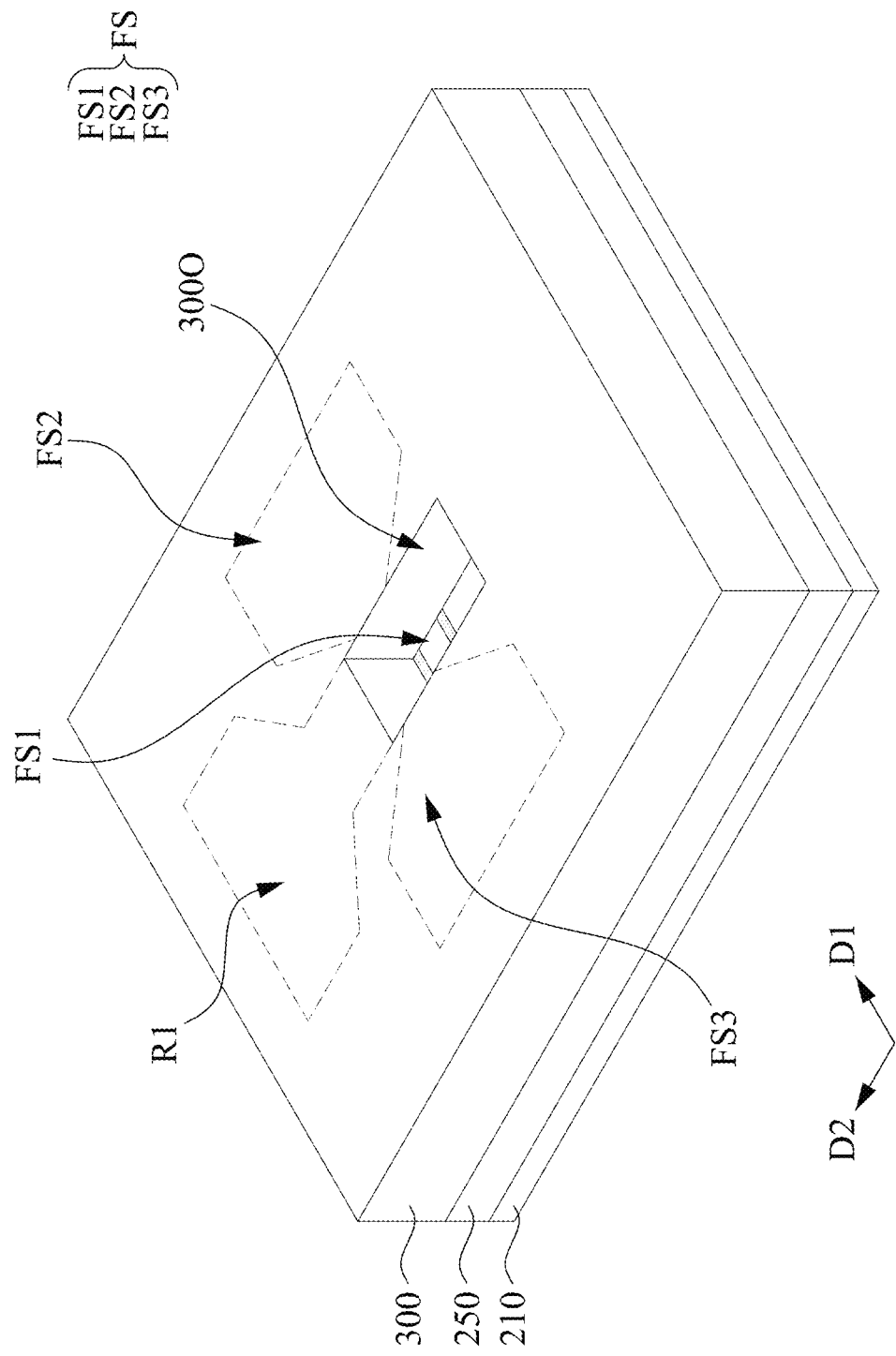
Figure 13B:
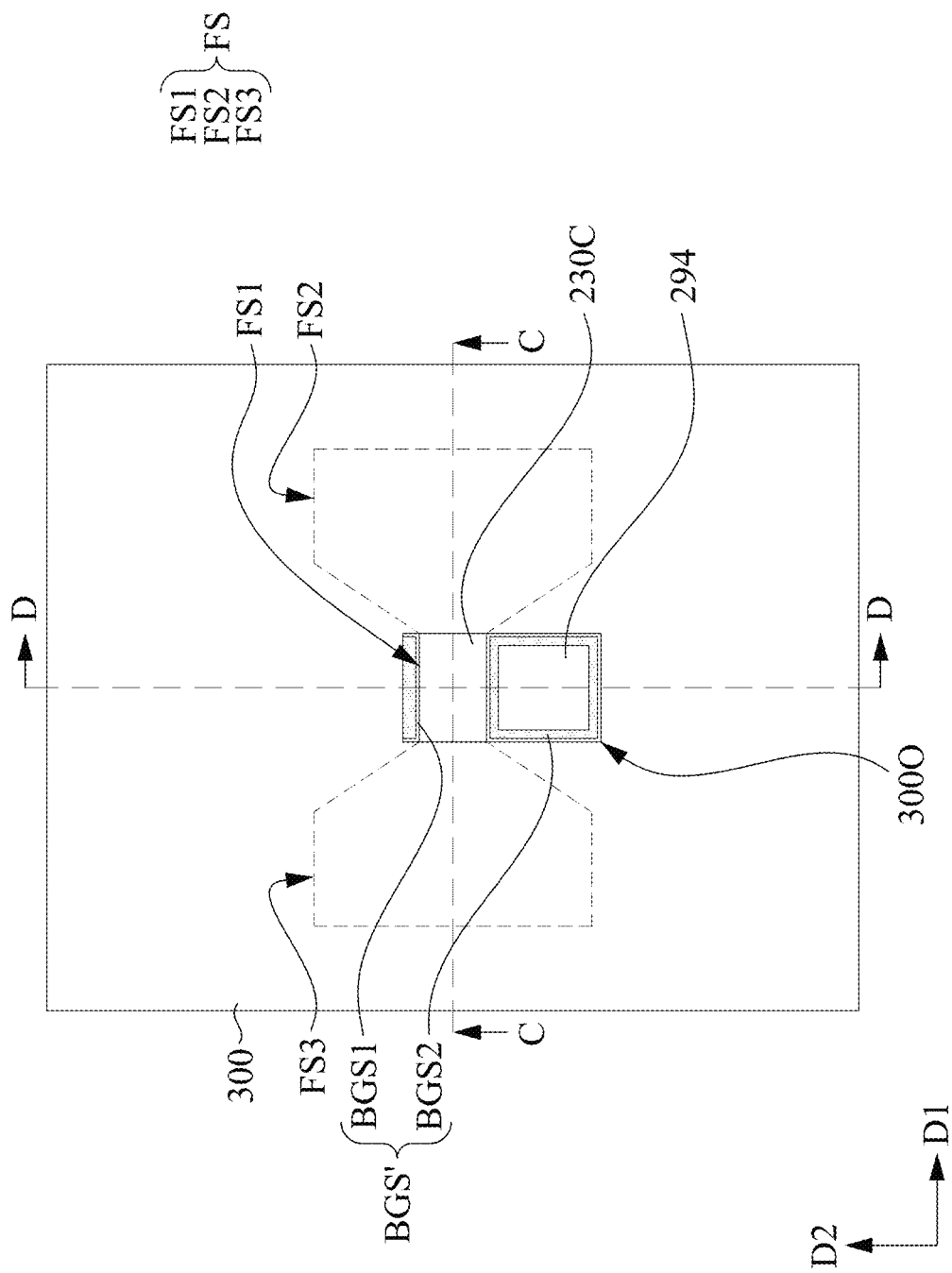
Figure 13C:
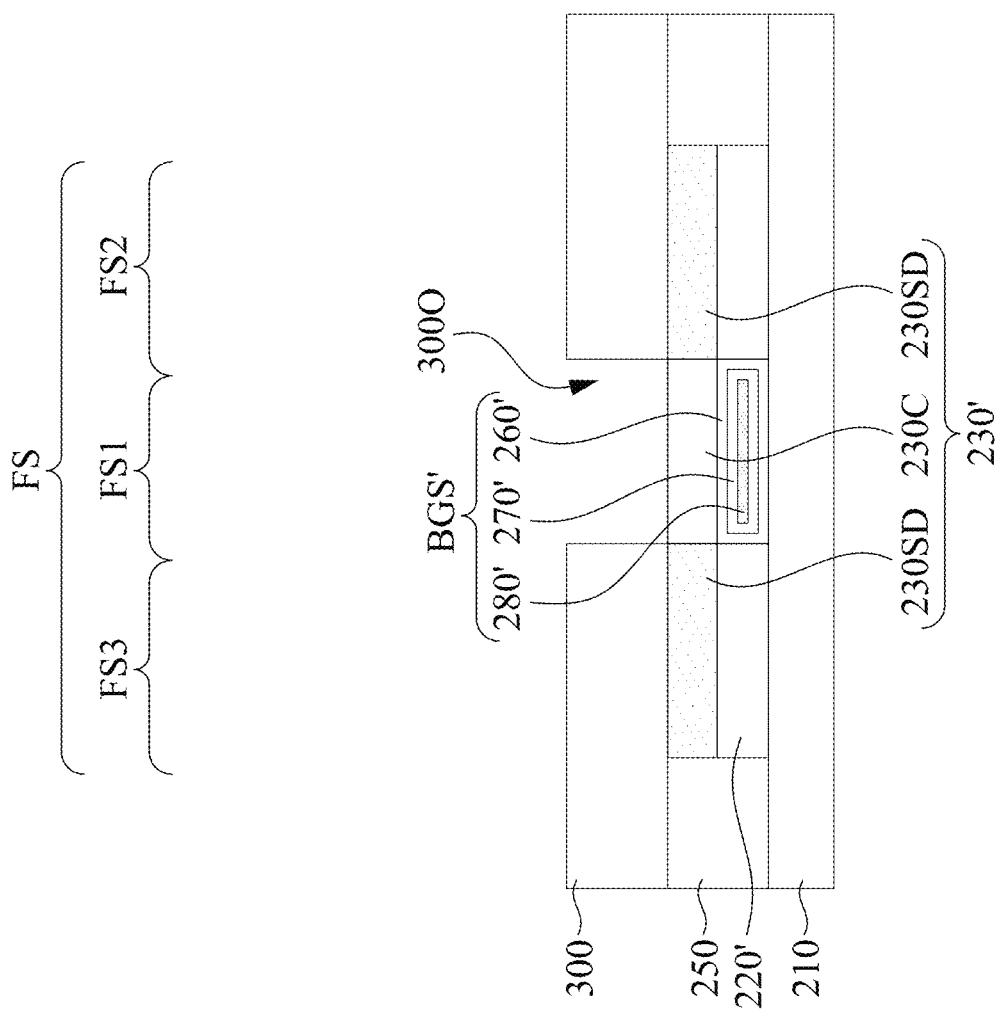
Figure 13D:
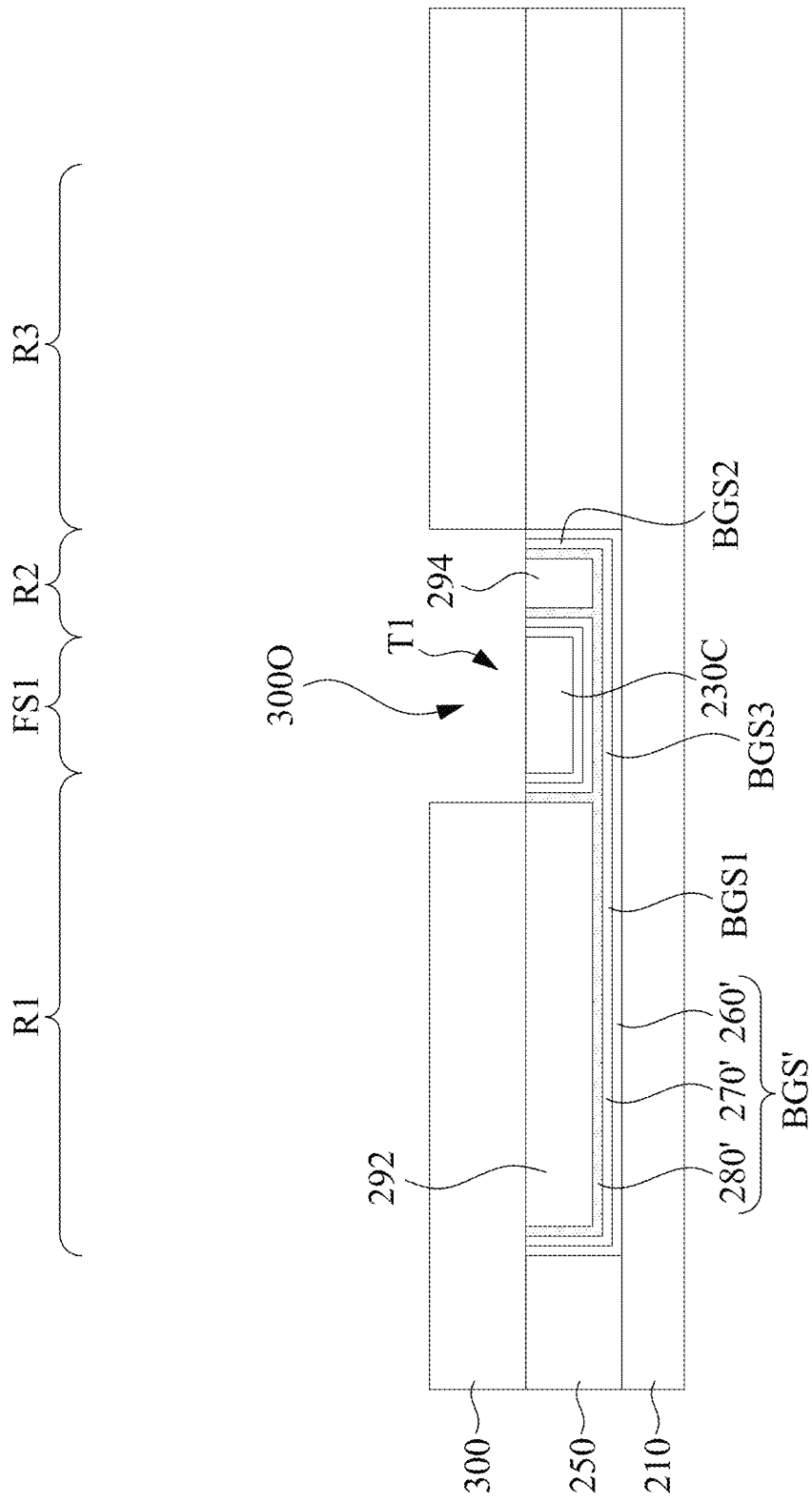

FIG. 13A is a perspective view of an integrated circuit device at an intermediate stage according to some embodiments of the present disclosure. FIG. 13B is a top view of the integrated circuit device of FIG. 13A. FIGS. 13C and 13D are cross-sectional views respectively taken along lines C-C and D-D of FIG. 13B. Reference is made to FIGS. 2B and 13A-13D. The method M proceeds to step S11, where a third interlayer dielectric layer 300 is deposited over the structure of FIGS. 12A-12D, and the third interlayer dielectric layer 300 is patterned to have an opening 3000 exposing the channel portion FS1 of the fin structure FS. In some embodiments, the third interlayer dielectric layer 300 may include low-k dielectric materials having k values, for example, lower than about 4.0 or even 2.0. In some embodiments, the third interlayer dielectric layer 300 may be made of, for example, silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The third interlayer dielectric layer 300 may be deposited using any suitable method, such as CVD, physical vapor deposition (PVD), ALD, PEALD, PECVD, SACVD, FCVD, spin-on, and/or the like, or a combination thereof.

A thickness of the third interlayer dielectric layer 300 may be in a range from about 10 nanometers to about 1000 nanometers. If the thickness of the third interlayer dielectric layer 300 is less than about 10 nanometers, there will be significant peripheral capacitors which lead to undesirable resistive-capacitive (RC) delay. If the thickness of the third interlayer dielectric layer 300 is greater than about 1000 nanometers, the device height is unnecessarily increased.

The patterning of the third interlayer dielectric layer 300 may include an etching process, such as dry etch, wet etch, or the combination thereof. The opening 3000 may expose the channel region FS1/230C, the portions BGS1 and BGS2 of the gate structure BGS', and the interlayer dielectric 294. After the formation of the opening 3000, the source and drain features 230SD and at least a part of the portion BGS1 of the gate structure BGS' are covered by the third interlayer dielectric layer 300, not exposed by the opening 3000. In the present embodiments, the opening 3000 expose the entire portion BGS2 of the gate structure BGS'. In some other embodiments, at least a part of the portion BGS2 of the gate structure BGS' may be covered by the third interlayer dielectric layer 300, not exposed by the opening 3000.

In some embodiments, prior to etching the third interlayer dielectric layer 300, a patterned mask (not shown) is formed over the third interlayer dielectric layer 300. The patterned mask (not shown) may have a desired pattern corresponding to the opening 3000. The patterned mask may include suitable materials that provide a high etch selectivity with respect to the third interlayer dielectric layer 300, thereby serving as an etch mask during patterning the third interlayer dielectric layer 300. For example, the patterned mask (not shown) may include silicon nitride, silicon oxynitride, the like, or the combination thereof. The patterned mask may be formed by a series of operations including deposition, photolithography patterning, and etching processes, as the formation of the pattern mask 240 (referring to FIGS. 5A-5C). After patterning the third interlayer dielectric layer 300, the patterned mask (not shown) is removed by suitable etching process.

Figure 14A:
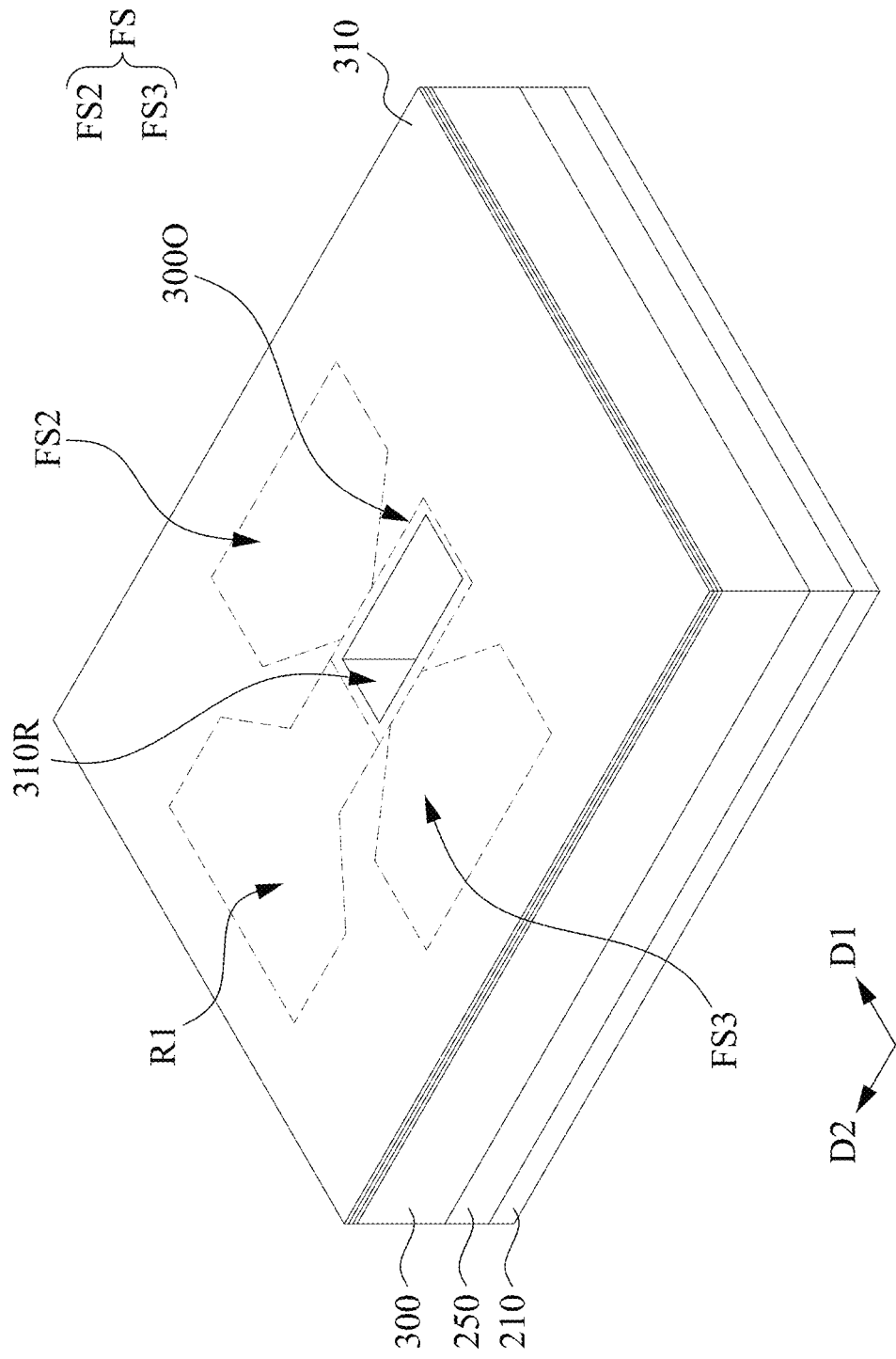
Figure 14B:
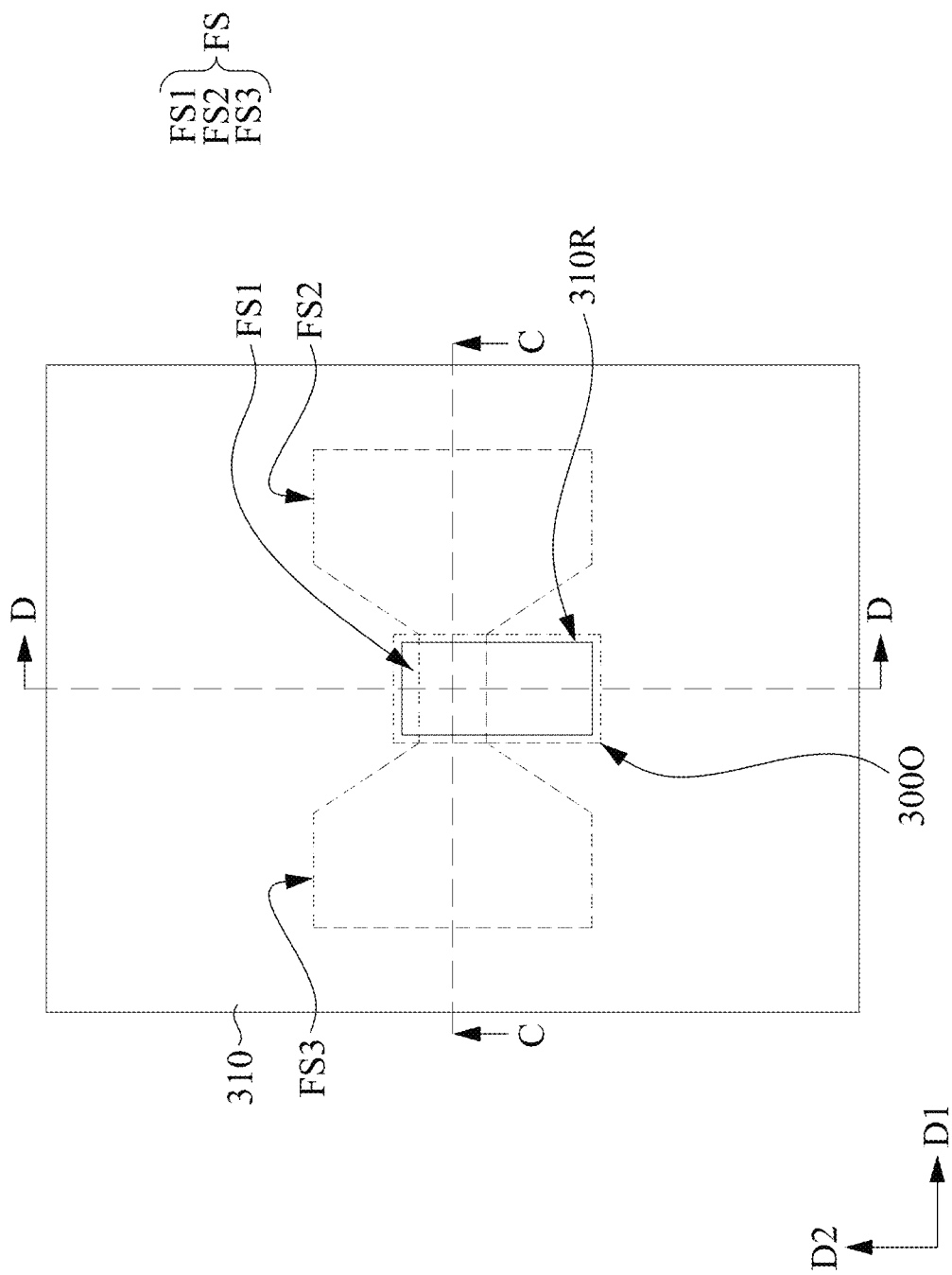
Figure 14C:
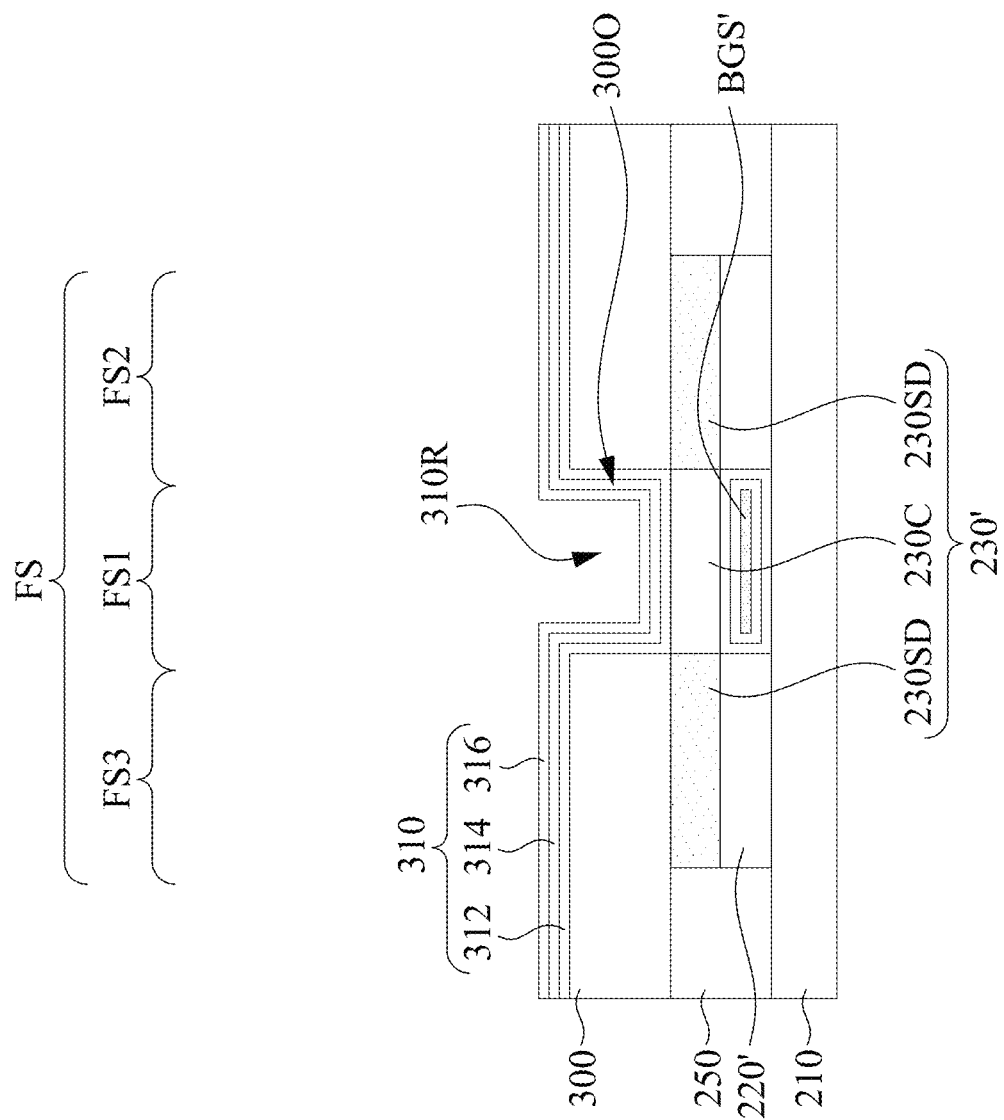
Figure 14D:
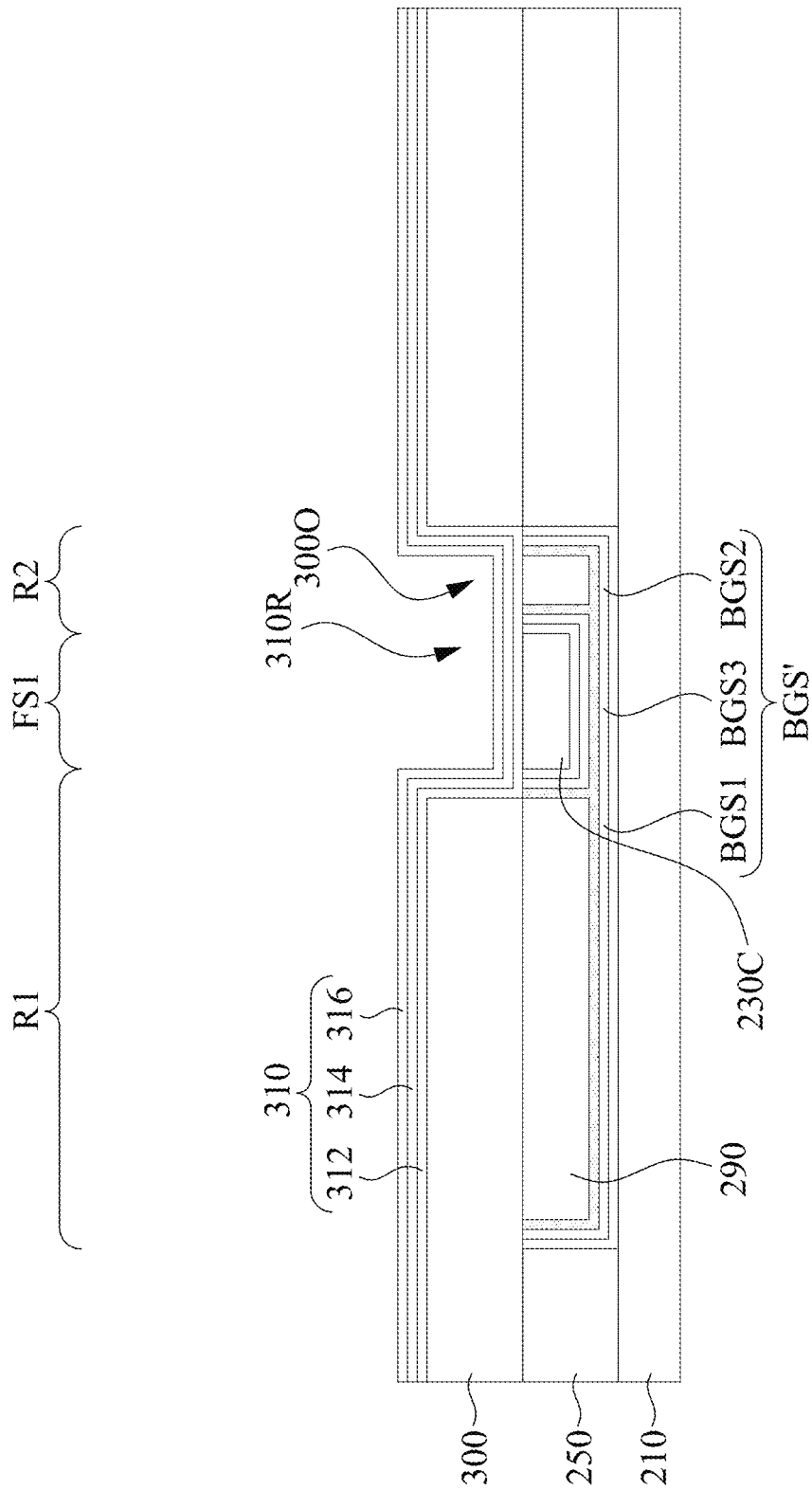

FIG. 14A is a perspective view of an integrated circuit device at an intermediate stage according to some embodiments of the present disclosure. FIG. 14B is a top view of the integrated circuit device of FIG. 14A. FIGS. 14C and 14D are cross-sectional views respectively taken along lines C-C and D-D of FIG. 13B. Reference is made to FIGS. 2B and 14A-14D. The method M proceeds to step S12, where a multilayer stack 310 is deposited over the third interlayer dielectric layer 300 and into the opening 3000 in the third interlayer dielectric layer 300. The multilayer stack 310 may have a recess 310R corresponding to the opening 3000 of the third interlayer dielectric layer 300. The multilayer stack 310 may include a bottom layer 312, a data storage layer 314, and a top layer 316.

In some embodiments, the data storage layer 314 may be a charge trapping layer, which includes an insulating or semiconductor material with a high density of localized electronic states in which charge may be trapped. For example, the data storage layer 314 may include high-k dielectrics (e.g., silicon nitride or $HfO_2$), semiconductor materials (e.g., polysilicon), the like, or the combination thereof. The data storage layer 314 may be deposited by CVD, ALD, PVD, the like, or other suitable methods. In the embodiments where the data storage layer 314 serves as the charge trapping layer, the bottom and top layers 312 and 316 may respectively be a tunneling layer and a barrier layer. For example, the tunneling layer 312 and the barrier layer 316 may be made of suitable dielectric materials, such as silicon oxide, silicon nitride, silicon oxynitride, $HfO_2$, other high-k dielectric materials, the like or the combination thereof. Materials of the bottom and top layers 312 and 316 may be different from that of the data storage layer 314. The tunneling layer 312 and the barrier layer 316 may be deposited by CVD, ALD, PVD, the like, or other suitable methods. In order to suppress the charge leakage, the barrier layer 316 may be thicker than the tunneling layer 312.

In some alternative embodiments, the data storage layer 314 is a programmable material layer, which is made of various kinds of non-conductive materials having at least two programmable states. One of the states may be considered to be a logic "1", and the other state may be considered to be a logic "0." In various embodiments, the data storage layer 314 may be made of resistance switching materials, ferroelectric materials, phase change materials (e.g., phase change alloys), the like. The bottom layer 312 may be made of a suitable dielectric material electrically isolating the data storage layer 314 from the channel region 230C and the gate structure BGS'. The top layer 316 may be made of a suitable dielectric material electrically isolating the data storage layer 314 from a top electrode subsequently formed. For example, the bottom and top layers 312 and 316 may be made of silicon oxide, silicon nitride, silicon oxynitride, $HfO_2$, other high-k dielectric materials, the like or the combination thereof. The material of the bottom and top layers 312 and 316 may be different from that of the data storage layer 314. The bottom and top layers 312 and 316 may be deposited by CVD, ALD, PVD, the like, or other suitable methods.

The resistance switching materials may include high-k dielectric materials or metal oxide materials. For example, the resistance switching materials may include hafnium oxide ($HfO_x$), titanium oxide ($TiO_x$), tantalum oxide ($TaO_x$), nickel oxide (NiO), zinc oxide (ZnO), zinc titanate ($Zn_2TiO_4$), manganese oxide ($MnO_x$), magnesium oxide (MgO), aluminum oxide ($AlO_x$), zirconium dioxide ($ZrO_2$), the like, or the combination thereof. These materials may be deposited by physical vapor deposition (PVD), atomic layer deposition (ALD), or the like. In some embodiments where the data storage layer 314 including the resistance switching materials, the resistance of the data storage layer 314 can be changed by at least an electrical programming signal. For example, the data storage layer 314 may have a high-resistance state and a low-resistance state.

The ferroelectric materials may include hafnium zirconium oxide ($HfZrO_2$, HZO), lead zirconate titanate (Pb(Zr, Ti)$O_3$, PZT), strontium bismuth tantalite ($SrBi_2Ta_2O_9$, SBT), barium titanate ($BaTiO_3$, BTO), hafnium oxide ($HfO_2$), and zirconium oxide ($ZrO_2$), or the like. The ferroelectric materials may be formed by atomic layer deposition (ALD), such as thermal ALD, and other suitable techniques. In some embodiments where the data storage layer 314 including the ferroelectric materials, the polarization state of the data storage layer 314 can be changed by at least an electrical programming signal. For example, the data storage layer 314 may have a first polarization state (e.g., spontaneous polarization state) and a second polarization state (e.g., reversal polarization state) different from the first polarization state.

The phase change materials may include chalcogenide alloy containing one or more of Ge, Te, and Sb, e.g., such as be $Ge_2Sb_2Te_5$. In some other embodiments, the phase change materials may include metal oxides, such as tungsten oxide, nickel oxide, copper oxide, or the like. In some embodiments where the data storage layer 314 including the phase change material, the phase of the data storage layer 314 can be changed by at least an electrical programming signal. For example, the data storage layer 314 may have a first phase state (e.g., crystalline state, corresponding to a low-resistance state) and a second phase state (e.g., amorphous state, corresponding to a high-resistance state) different from the first phase state.

In some other examples, the data storage layer 314 may include a nanocrystal structure may be formed by patterning one of the charge trapping layer, the layer of the resistance switching materials, the layer of the ferroelectric materials, and the layer of the phase change materials, a semiconductor layer (e.g., polysilicon layer), other suitable materials, or the combination thereof.

In the above embodiments, the data storage layer 314 (e.g., $HfO_2$) may have a thickness in range from about 4 nanometers to about 20 nanometers. If the data storage layer 314 is less than about 4 nanometers, there will not be adequate amount charge traps for charge trapping devices or polarization for ferroelectric devices. If the data storage layer 314 is greater than about 20 nanometers, the operation voltage of writing for charge trapping devices or polarize voltage for ferroelectric devices will be too high for the concern of power consumption. In the above embodiments, the bottom layer 312 may have a thickness in range from about 3 nanometers to about 6 nanometers, and the top layer 316 may have a thickness in range from about 6 nanometers to about 10 nanometers. The thickness of the bottom layer 312 may be comparable to or less than that of the top layers 316. The thicknesses of these layers are designed for the tunneling effect or electrical isolation.

Figure 15A:
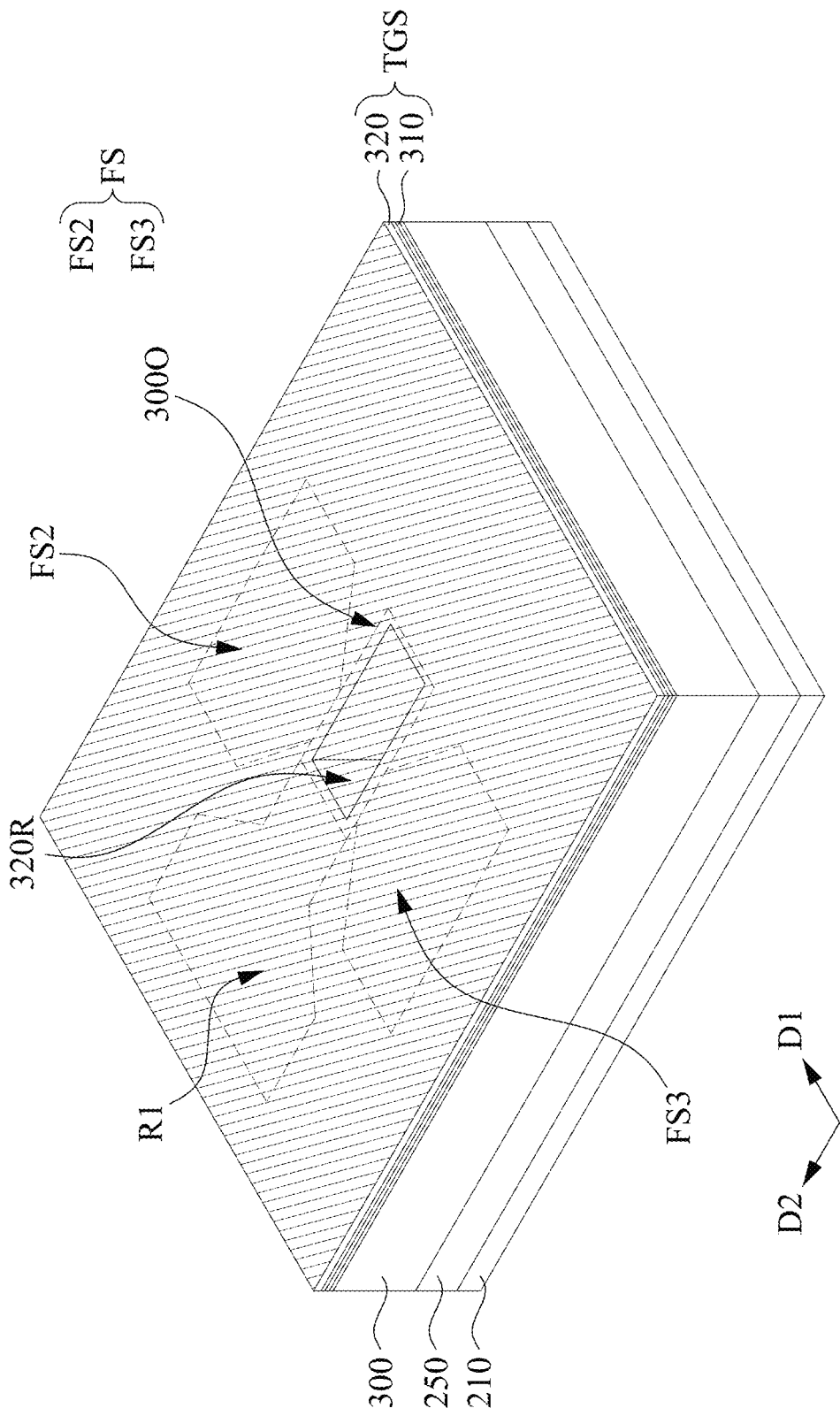
Figure 15B:
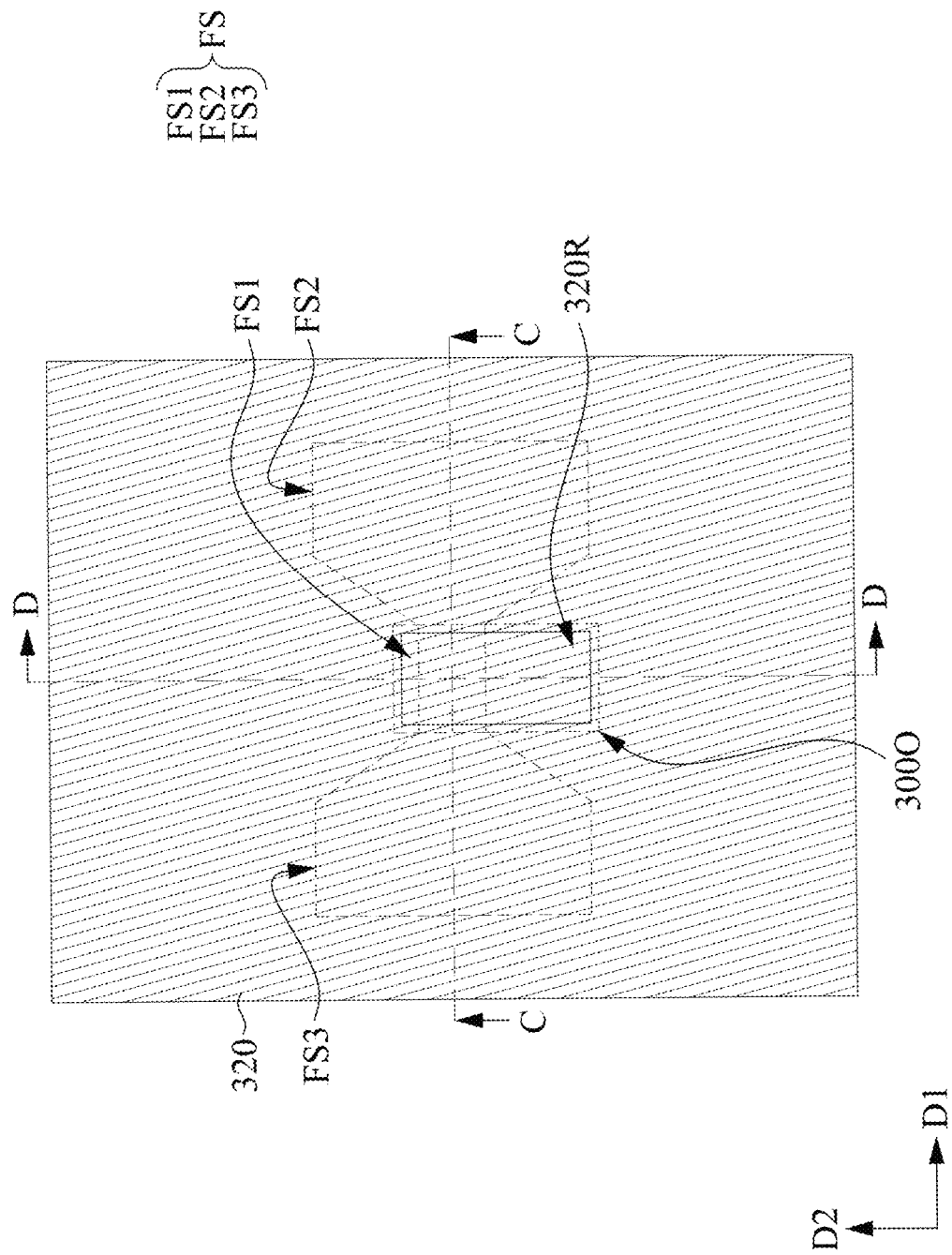
Figure 15C:
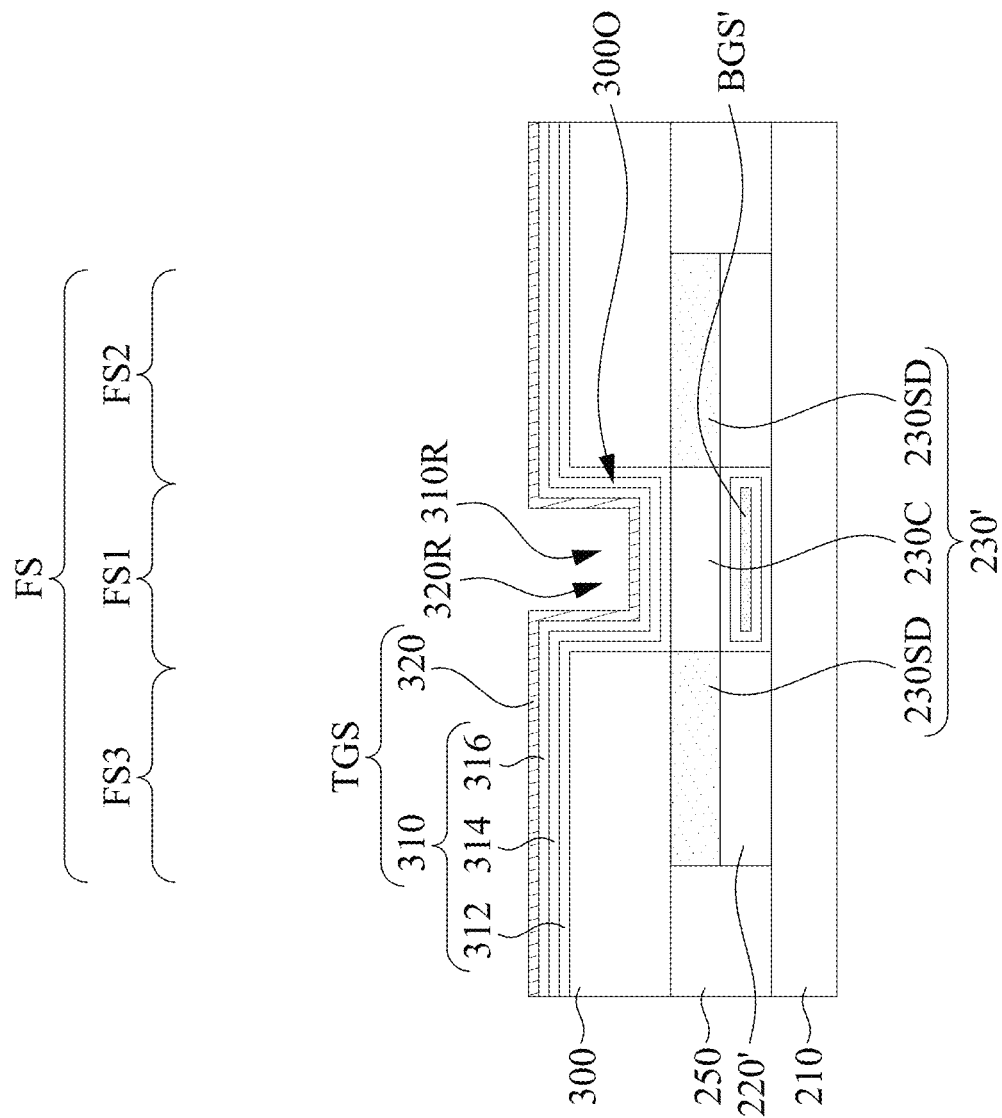
Figure 15D:
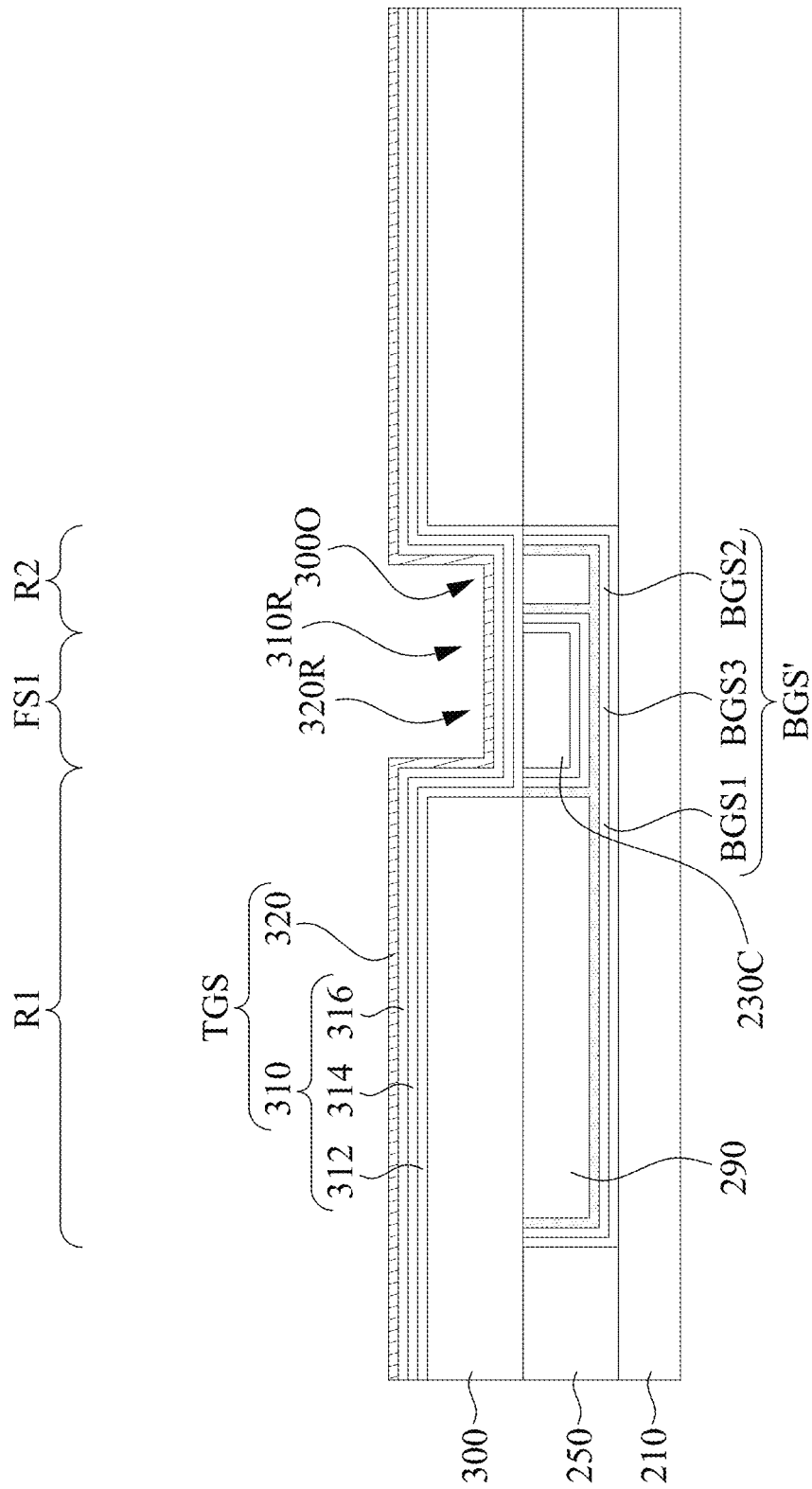

FIG. 15A is a perspective view of an integrated circuit device at an intermediate stage according to some embodiments of the present disclosure. FIG. 15B is a top view of the integrated circuit device of FIG. 15A. FIGS. 15C and 15D are cross-sectional views respectively taken along lines C-C and D-D of FIG. 15B. Reference is made to FIGS. 2B and 15A-15D. The method M proceeds to step S13, where a top electrode layer 320 is deposited over the multilayer stack 310 and into the opening 3000 of the third interlayer dielectric layer 300. The top electrode layer 320 may include doped semiconductor material, such as doped polysilicon. Alternatively, the top electrode layer 320 may include metals such as Cu, Al, W, Co, Ru, the like, combinations thereof, or multi-layers thereof. For example, in some embodiments, the top electrode layer 320 may include a work function metal layer and a gate metal layer over the work function metal. The work function metal may include TiN, TaN, TiAl, Ni, Pt, the like or the combination thereof. The gate metal layer may include TiN, TaN, W, the like or the combination thereof. The materials used in forming the top electrode layer 320 may be deposited by any suitable method, e.g., CVD, PECVD, PVD, ALD, and/or the like. A thickness of the top electrode layer 320 (e.g., a metal gate layer) may be in a range from about 1 nanometer to about 100 nanometers. If the thickness of the top electrode layer 320 is less than about 1 nanometer, it may not be proper continuous film. If the thickness of the top electrode layer 320 is greater than about 100 nanometers, a device height may be unnecessarily increased.

In some embodiments, the top electrode layer 320 is deposited in a conformal manner, such that the top electrode layer 320 may have a recess 320R corresponding to the opening 3000 of the third interlayer dielectric layer 300 and the recess 310R of the multilayer stack 310. In some other embodiments, the top electrode layer 320 may fill up the opening 3000 of the third interlayer dielectric layer 300 and the recess 310R of the multilayer stack 310. The top electrode layer 320 and the multilayer stack 310 in combination may be referred to as a top gate multilayer stack TGS.

Figure 16A:
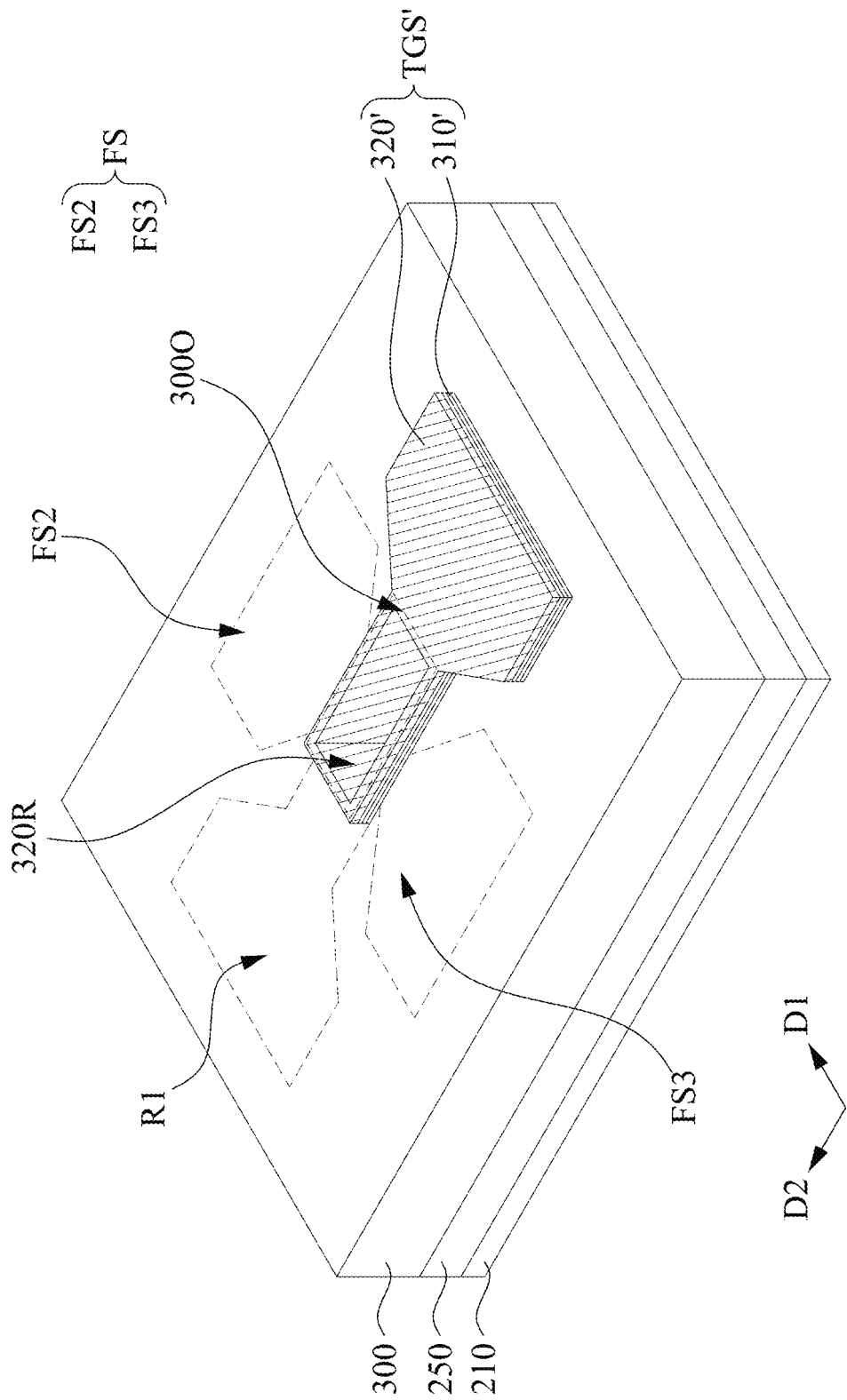
Figure 16B:
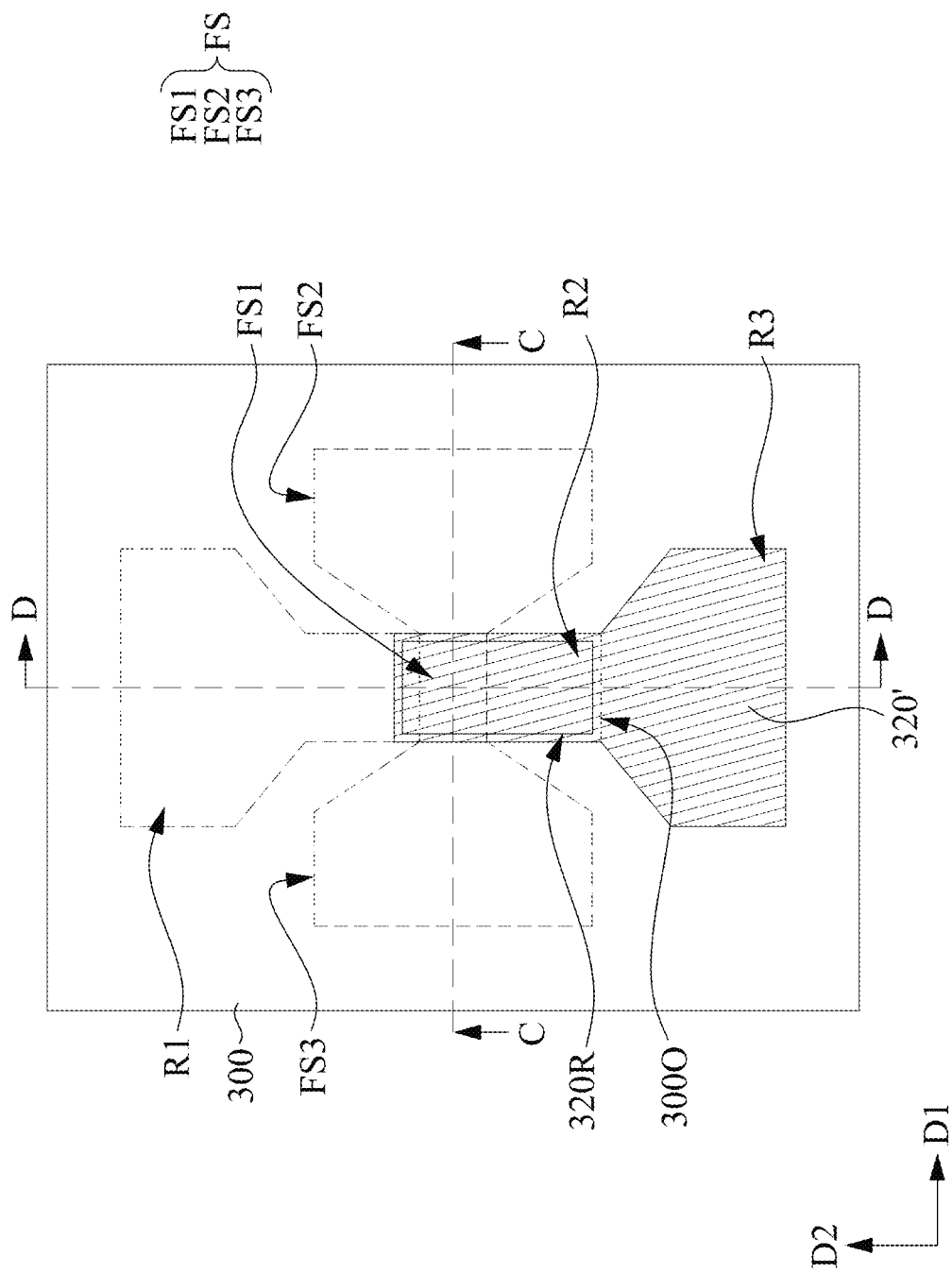
Figure 16C:
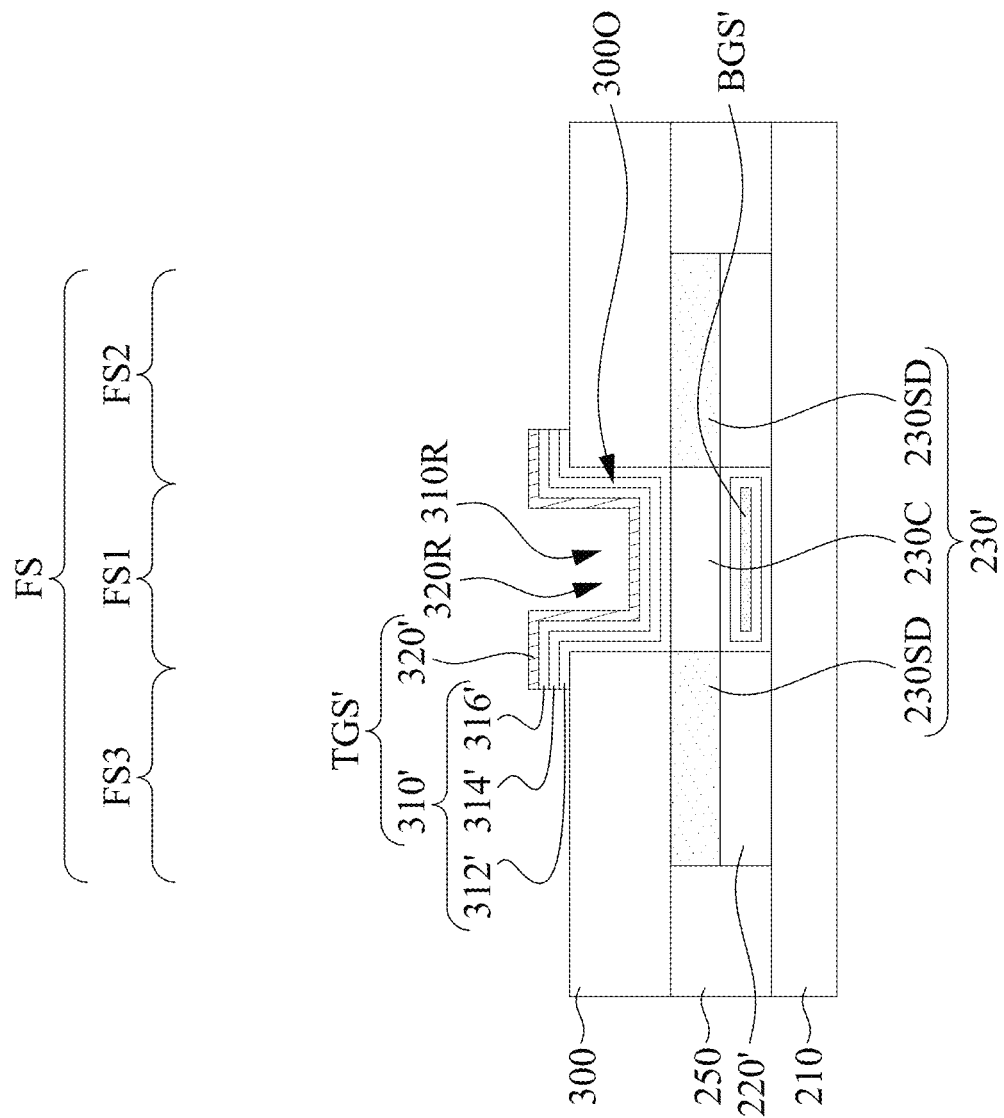
Figure 16D:
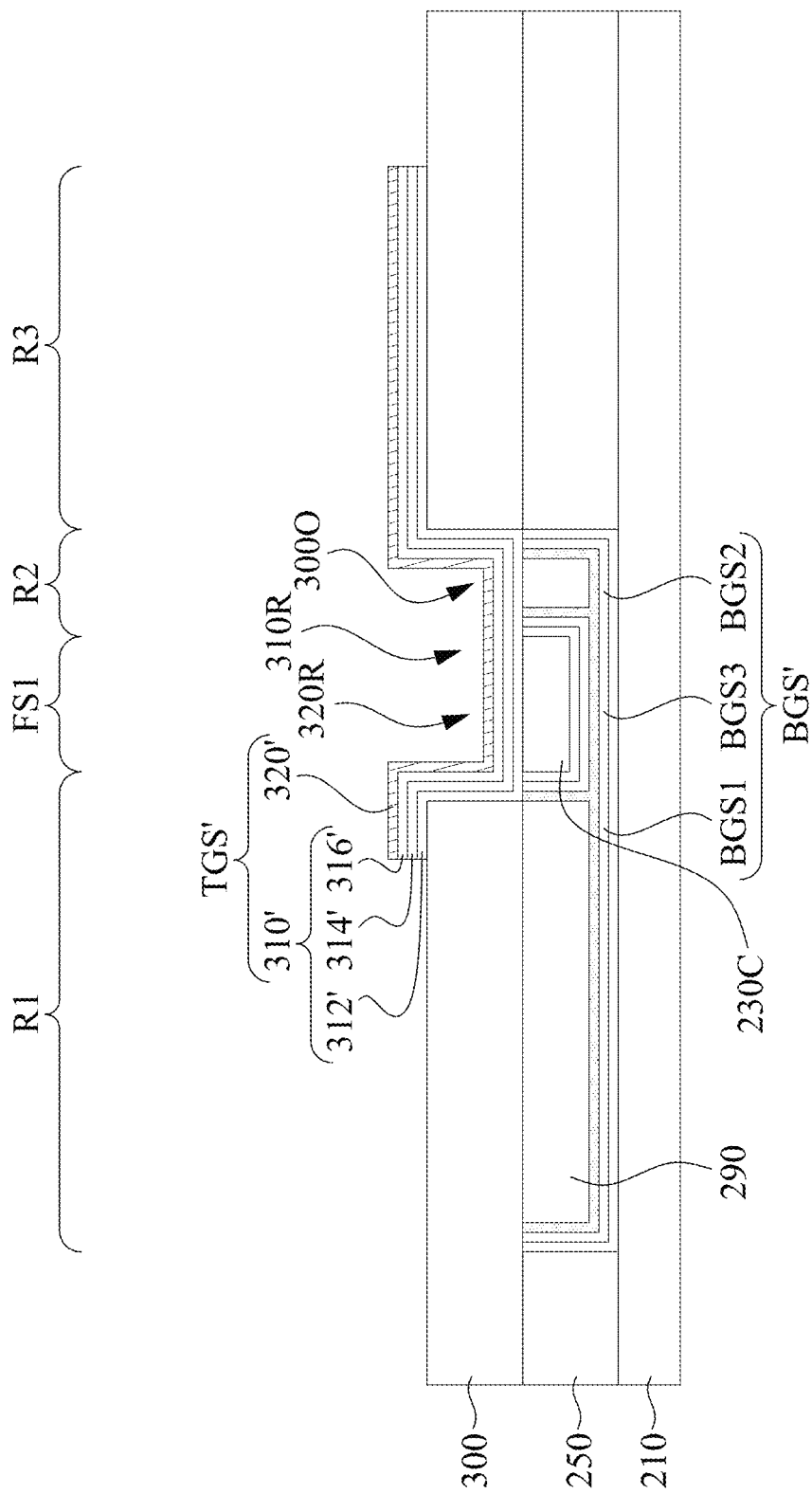

FIG. 16A is a perspective view of an integrated circuit device at an intermediate stage according to some embodiments of the present disclosure. FIG. 16B is a top view of the integrated circuit device of FIG. 16A. FIGS. 16C and 16D are cross-sectional views respectively taken along lines C-C and D-D of FIG. 16B. Reference is made to FIGS. 2B and 16A-16D. The method M proceeds to step S14, where the top electrode layer 320 and the multilayer stack 310 are patterned into a top electrode 320' and a stack 310'. Stated differently, the gate multilayer stack TGS is patterned into a gate structure TGS' including the top electrode 320' and the stack 310'. The top electrode 320' and the stack 310' may extend from a top of the channel region FS1, over the second region R2, to a third region R3 of the base substrate 210. The third region R3 is on a side of the second region R2 opposite to the channel region FS1. In some embodiments, a width of the gate structure TGS' (or the region R3) measured along the direction D1 is greater than the channel length of the channel region 230C, which is beneficial for receiving a top gate contact.

Figure 17A:
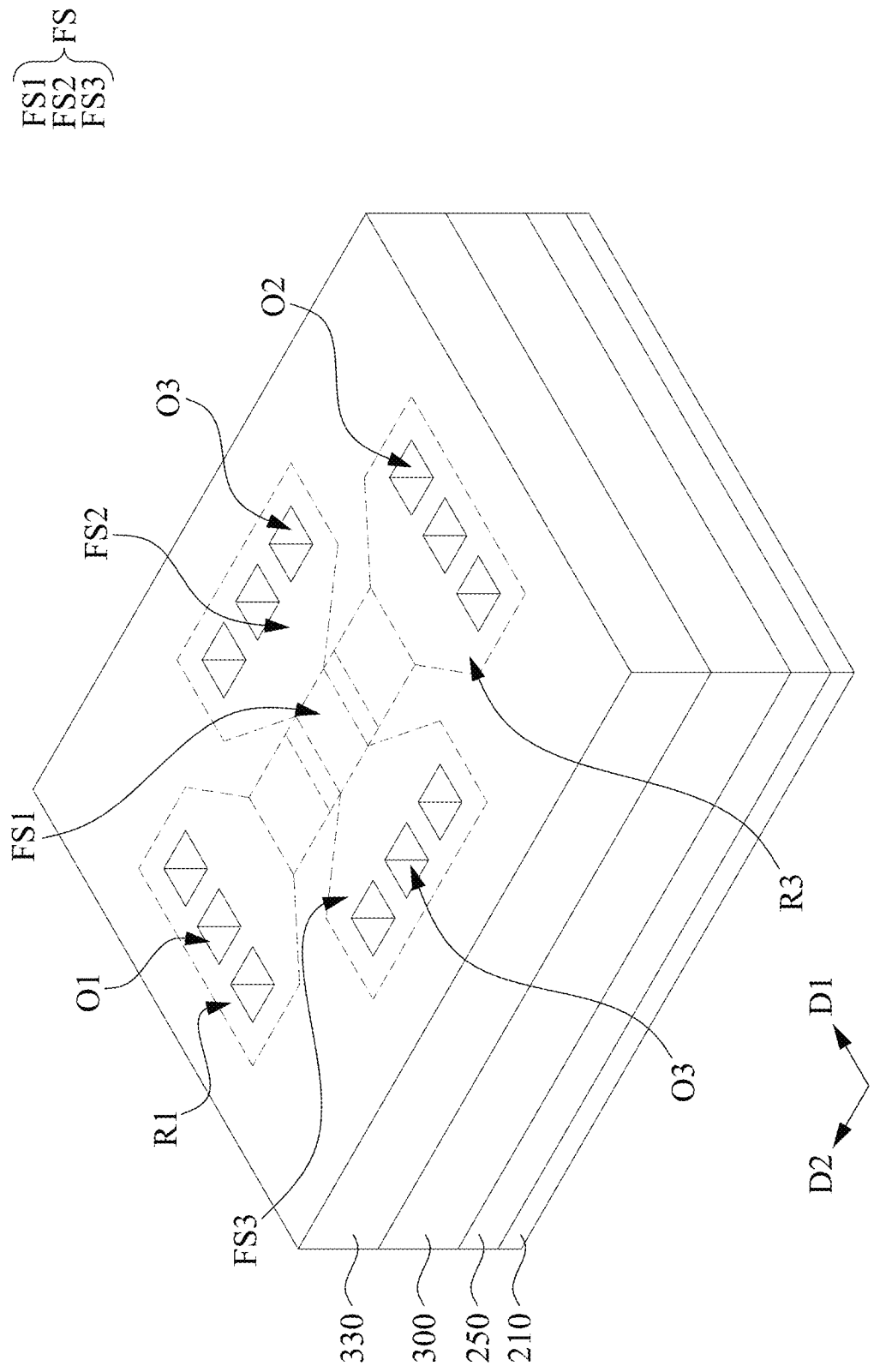
Figure 17B:
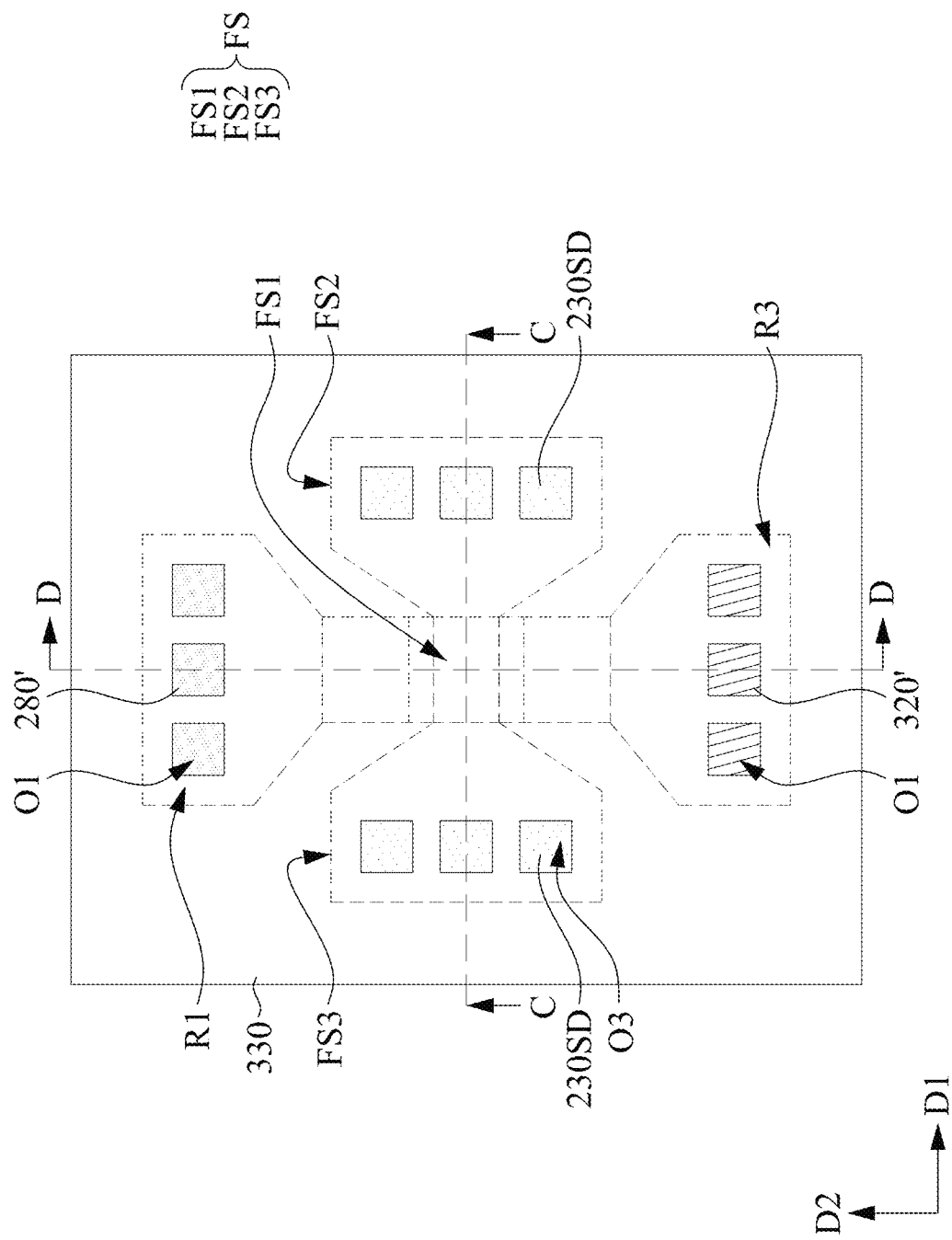
Figure 17C:
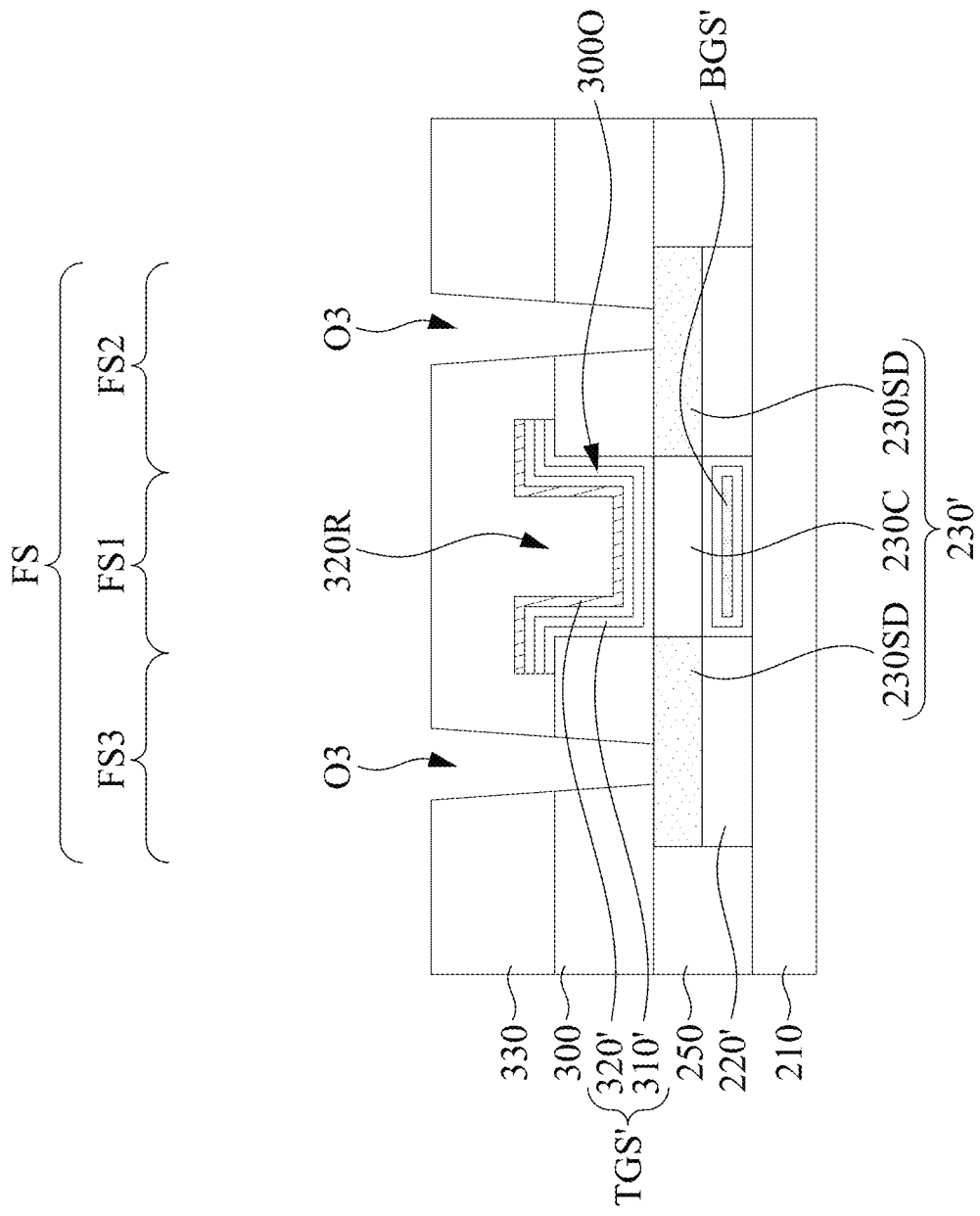
Figure 17D:
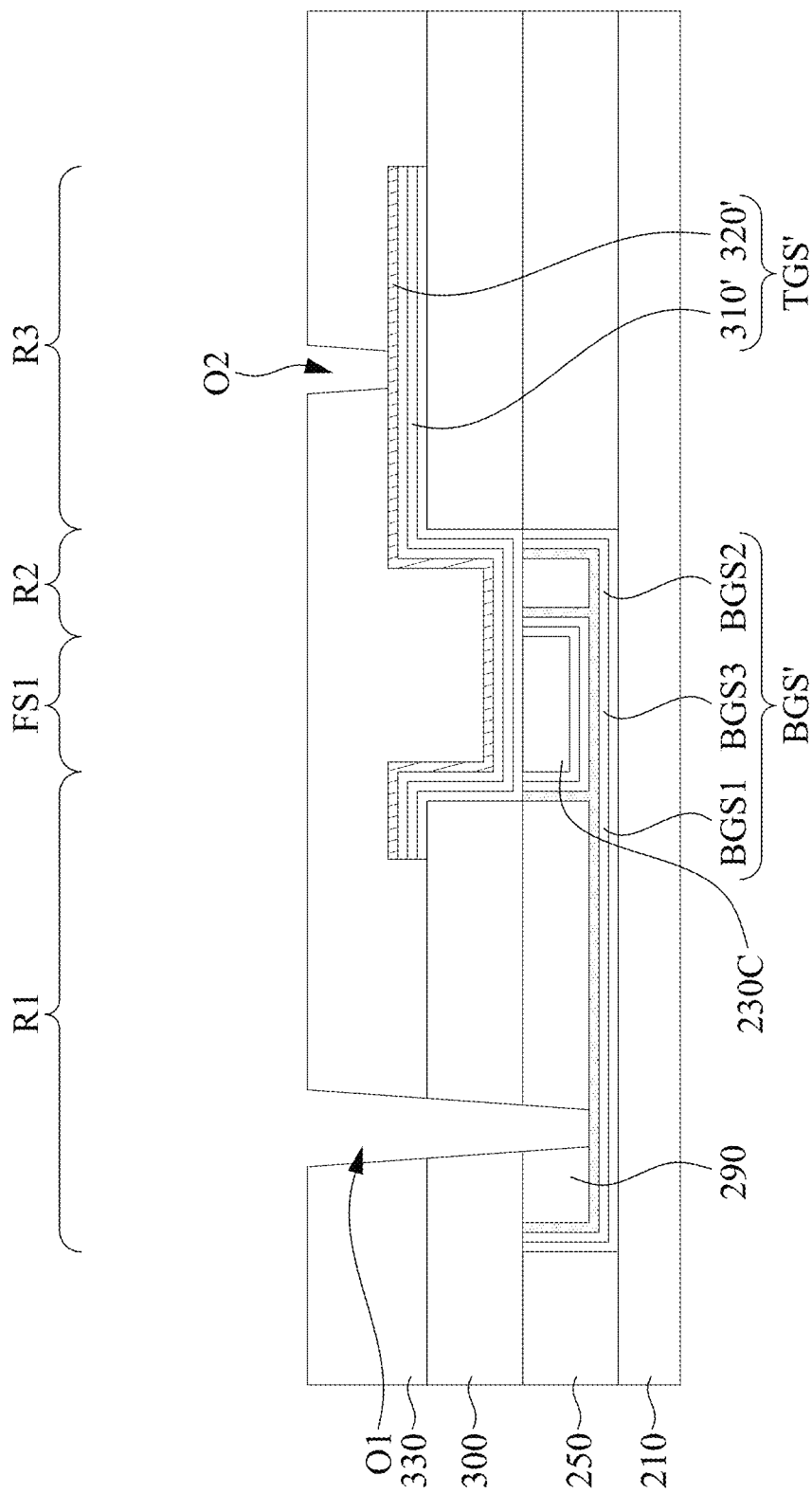

FIG. 17A is a perspective view of an integrated circuit device at an intermediate stage according to some embodiments of the present disclosure. FIG. 17B is a top view of the integrated circuit device of FIG. 17A. FIGS. 17C and 17D are cross-sectional views respectively taken along lines C-C and D-D of FIG. 16B. Reference is made to FIGS. 2B and 17A-17D. The method M proceeds to step S15, where a fourth interlayer dielectric layer 330 is deposited over the structure of FIGS. 17A-17D, and contact openings O1-O3 are etched in the interlayer dielectric 292 and the third and fourth interlayer dielectric layers 300 and 330.

In some embodiments, the fourth interlayer dielectric layer 330 may include low-k dielectric materials having k values, for example, lower than about 4.0 or even 2.0. In some embodiments, the fourth interlayer dielectric layer 330 may be made of, for example, silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The fourth interlayer dielectric layer 330 may be deposited using any suitable method, such as CVD, physical vapor deposition (PVD), ALD, PEALD, PECVD, SACVD, FCVD, spin-on, and/or the like, or a combination thereof.

In the present embodiments, a patterned mask (not shown) is formed over the fourth interlayer dielectric layer 330, and then the contact opening O1-O3 are etched in the interlayer dielectric 292 and the interlayer dielectric layers 300 and 330 through the patterned mask (not shown). For example, the contact opening O1 is etched in the interlayer dielectric 292 and the interlayer dielectric layers 300 and 330 to expose the portion BGS1 of the gate structure BGS', the contact opening O2 is etched in the fourth interlayer dielectric layer 330 to expose the top electrode 320', and the contact openings O3 are etched in the third and fourth interlayer dielectric layers 300 and 330 to expose the source and drain features 230SD, respectively. The patterned mask may include suitable materials that provide a high etch selectivity with respect to the interlayer dielectric 292 and the interlayer dielectric layers 300 and 330, thereby serving as an etch mask during the etching process. For example, the patterned mask (not shown) may include silicon nitride, silicon oxynitride, the like, or the combination thereof. The patterned mask may be formed by a series of operations including deposition, photolithography patterning, and etching processes, as the formation of the pattern mask 240 (referring to FIGS. 5A-5C). After the formation of the openings O1-O3, the patterned mask (not shown) is removed by suitable etching process.

In some embodiments, the top electrode 320', the source and drain features 230SD, and the gate electrode 280' of the gate structure BGS' may have a higher etch resistance to the etching process than that of the interlayer dielectric 292 and the interlayer dielectric layers 300 and 330, and not substantially be etched by the etching process. For example, the top electrode 320', the source and drain features 230SD, and the gate electrode 280' may serve as etch stop layers during etching the openings O1-O3.

Figure 18A:
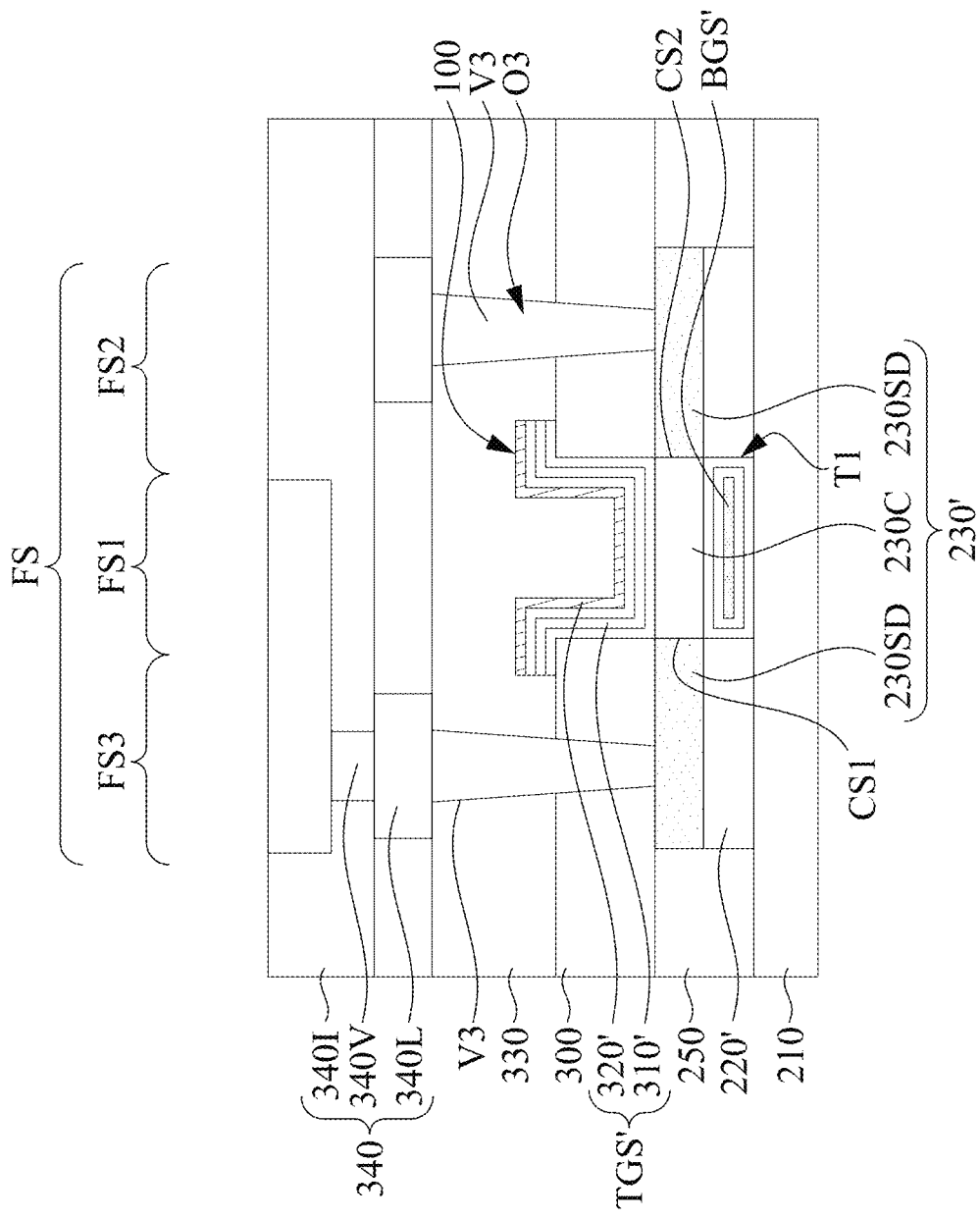
Figure 18B:
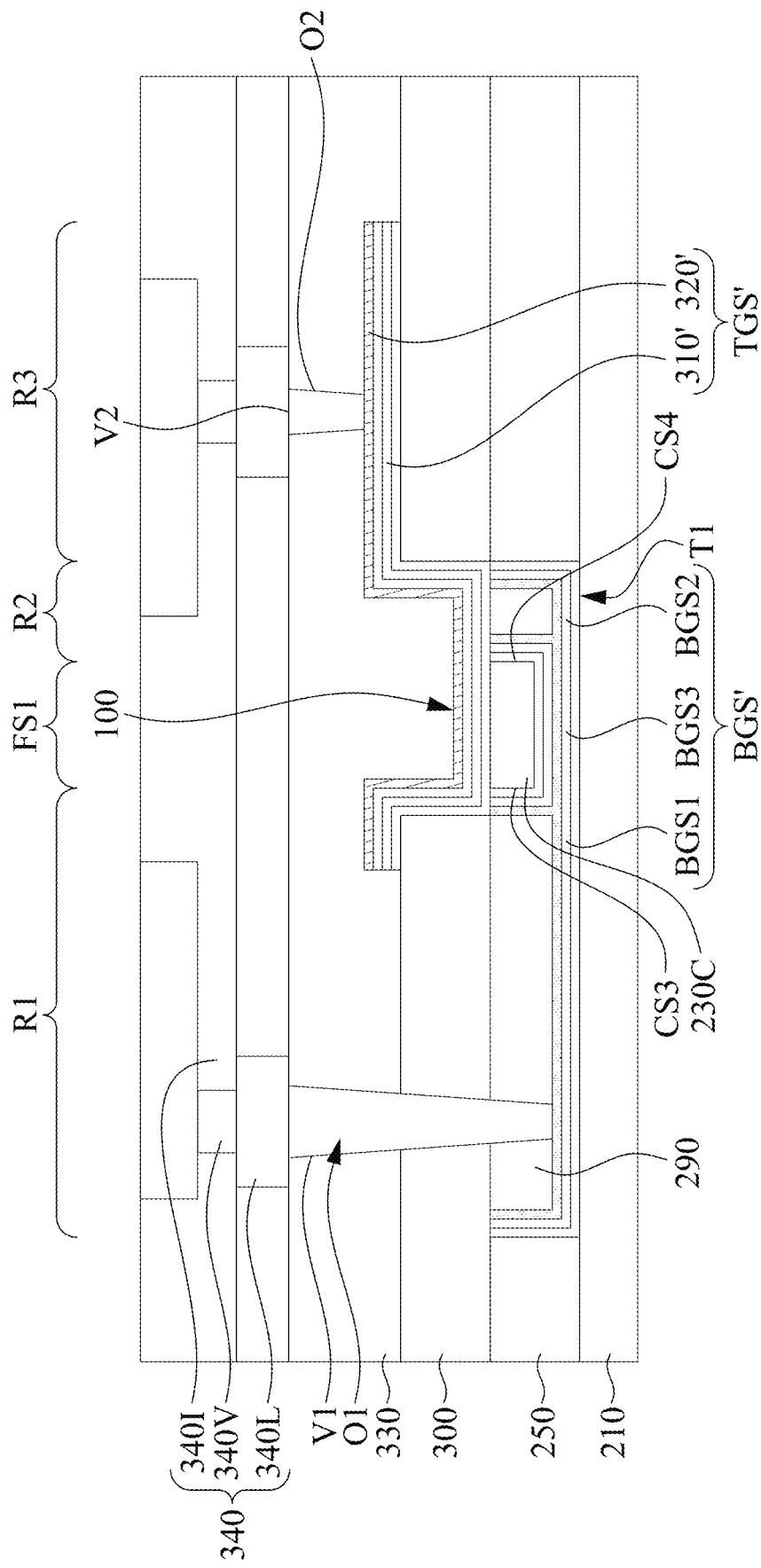

FIGS. 18A and 18B are cross-sectional views of an integrated circuit device respectively taken along the same lines as FIGS. 17C and 17D taken along. Reference is made to FIGS. 2B, 18A, and 18B. The method M proceeds to step S16, where conductive contacts V1-V3 are formed in the contact openings O1-O3, respectively. In some embodiments, the contact openings O1-O3 are filled with a conductive fill material. The conductive fill material (e.g., W, Al, Cu, Ru, Ni, Co, alloys of these, combinations thereof, and the like) may be deposited over the fourth interlayer dielectric layer 330 to fill the contact openings O1-O3, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the fourth interlayer dielectric layer 330. The resulting conductive plugs extend into the dielectric layers and constitute contacts V1-V3. For example, the conductive contact V1 may land on the portion BGS1 of the gate structure BGS', the conductive contact V2 may land on the top electrode 320', and the conductive contacts V3 may land on the source and drain features 230SD, respectively. The conductive contacts V1-V3 may make physical and electrical connections to the gate structure BGS', the source and drain features 230SD, and the top electrode 320'.

In some embodiment, prior to filling the contact openings O1-O3 with the conductive fill material, a conductive liner may be formed in the openings O1-O3. The liner comprises barrier metals used to reduce out-diffusion of conductive materials from the conductive contacts V1-V3 into the surrounding dielectric materials. The barrier metals may include TiN, TaN, Ta, or other suitable metals, or their alloys. In some embodiments, the liner may comprise two barrier metal layers. The first barrier metal comes in contact with the semiconductor material in the source/drain features 230SD and may be subsequently chemically reacted with the heavily-doped semiconductor in the source/drain features 230SD to form a low resistance ohmic contact, after which the unreacted metal may be removed. For example, if the heavily-doped semiconductor in the source/drain features 230SD is silicon or silicon-germanium alloy semiconductor, then the first barrier metal may comprise Ti, Ni, Pt, Co, other suitable metals, or their alloys, and may form silicide with the source/drain features 230SD. The second barrier metal layer of the conductive liner may additionally include other metals (e.g., TiN, TaN, Ta, or other suitable metals, or their alloys).

After forming the conductive contacts V1-V3, an interconnect structure 340 including multiple interconnect levels may be formed, stacked vertically above the conductive contacts V1-V3. The multiple interconnect levels include, for example, conductive lines 340L and the conductive vias 340V that may be formed in respective inter-metal dielectric (IMD) layers 3401 using any suitable method, such as a single damascene process, a dual damascene process, or the like. In some embodiments, the IMD layers 3401 may include low-k dielectric materials having k values, for example, lower than about 4.0 or even 2.0 disposed between such conductive features. In some embodiments, the IMD layers 3401 may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive lines 340L and the conductive vias 340V may comprise conductive materials such as copper, aluminum, tungsten, combinations thereof, or the like. In some embodiments, the conductive lines 340L and the conductive vias 340V may further comprise one or more barrier/adhesion layers (not shown) to protect the respective IMD layers from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

In some embodiments of the present disclosure, the gate structure BGS', the channel region 230C, the source and drain features 230SD, the gate structure TGS' in combination form a four-terminal device 100. The channel region 230C may have a shape like nano-structure, such as nanosheet, nanowire, nanobridge, between the source and drain features 230SD. In some embodiments, the channel region 230C may have four sides CS1-CS4 respectively connecting a top surface of the channel region 230C to a bottom surface of the channel region, in which the side CS1 is opposite to the side CS2, and the side CS3 is opposite to the side CS4. The source and drain features 230SD may be disposed on the sides CS1 and CS2 of the channel region 230C. The gate structure BGS' may have an extension (e.g., BGS1) extending beyond the side CS3. The gate structure TGS' may have an extension extending beyond the side CS4. The conductive contacts V1-V3 may make physical and electrical connections between the four terminals of the four-terminal device 100 and the interconnect structure 340.

In some embodiments of the present disclosure, the four-terminal device 100 is a logic transistor with a terminal (e.g., the top electrode 320') adjusting threshold voltage, through the data storage layer 314. In some examples, the four terminal logic device has a silicon-oxide-nitride-oxide-silicon (SONOS) structure, and the layers 312'-316' may respectively be a tunneling layer, a nitride charge strapping layer (e.g., nitride), and a barrier layer. In some examples, the four terminal logic device has a floating gate memory structure, and the layers 312'-316' may respectively be a tunneling layer, a polysilicon charge strapping layer (e.g., floating gate), and a barrier layer. The charge trapping layer is non-conductive but contains a large number of charge trapping sites able to hold an electrostatic charge. The charge trapping layer is electrically isolated from the transistor T1, although charges stored on the charge trapping layer directly affect the conductivity of the underlying transistor channel. In these examples, when the top electrode 320' is biased positively, electrons from the transistor source and drain regions 230SD tunnel through the tunneling layer 312' and get trapped in the charge trapping layer 314'. This results in an energy barrier between the drain and the source, raising the threshold voltage ($V_t$). The electrons can be removed again by applying a negative bias on the top electrode 320'.

In some alternative examples, the four terminal logic device 100 is a ferroelectric field-effect transistor (FeFET), and the layers 312'-316' may respectively be a dielectric layer, a ferroelectric material layer, and a dielectric layer. By applying the top electrode 320' with positive or negative voltage pulses, polarization states of the ferroelectric material layer can be changed. The FeFET shows nonvolatile characteristics due to the fact that the two stable, remanent polarization states of the ferroelectric material layer modify the threshold voltage even when no pulse is supplied. Accordingly, the binary states are encoded in the threshold voltage of the transistor.

In some alternative embodiments of the present disclosure, the formed four-terminal device 100 can be used as a resistance-based memory storage element of a nonvolatile memory array integrated with the transistor T1, in which the data storage layer 314' is configured to store a bit as a memory does. In some examples, the four terminal memory device includes a ferroelectric random-access memory (FeRAM) cell, and the data storage layer 314' may be a ferroelectric material layer. In some examples, the four terminal memory device includes a resistive random-access memory (RRAM) cell, and the data storage layer 314' may be a resistance switching layer. In some examples, the four terminal memory device includes a phase change random-access memory (PCRAM) cell, and the data storage layer 314' may be a phase-change layer. In some examples, the four terminal memory device includes a nanocrystal non-volatile memory (NCNVM) cell, and the data storage layer 314' may include a nanocrystal structure. For other types of the memory devices, other suitable materials can be applicable for the data storage layer 314'. The non-volatile memory device 100 may have a programing terminal (e.g., the top electrode 320') physically separated from a reading terminal (e.g., the source/drain feature 230SD), which can reduce read disturbance, achieving read disturbance immunity.

In some embodiments of the present disclosure, the four-terminal device 100 can be used as a memtransistor for constructing artificial neural networks (ANN). Memtransistor is a hybrid structure that integrates memristor and transistor. The multiple connections of the memtransistor enable it to more accurately model a neuron with its multiple synaptic connections. A neural network produced from these would provide hardware-based artificial intelligence (AI) with a good foundation. Furthermore, while the four-terminal device has a programing terminal (e.g., the top electrode 320') physically separated from a reading terminal (e.g., the source/drain feature 230SD), a programing/writing operation can be performed simultaneously as the reading operation is performed. The simultaneously-read-write capability can accelerate training speed and saves training time.

As the four-terminal device can be used as the $V_t$ programmable logic transistor, the memory storage element integrated with the bottom transistor, or the memtransistor for ANN, the bottom gate of the four-terminal device 100 (e.g., the gate structure BGS') can operate in various modes depending on requirements. In first embodiments, the source/drain features may be doped semiconductor features forming P-N junctions with the channel region, and the transistor T1 may operate in inversion mode. In second embodiments, the source/drain features may include metals or alloys forming Schottky junctions with the channel region, and the transistor T1 may operate in inversion mode. In third embodiments, the channel region of the transistor T1 (e.g., nanowire, nanosheet, or nanobridge) is junctionless, and the transistor T1 may operate in accumulation mode. In fourth embodiments, the transistor T1 may act as a negative capacitance field-effect transistor (NCFET), in which effective negative capacitance may be created in the gate dielectric layer 260'.

Figure 19A:
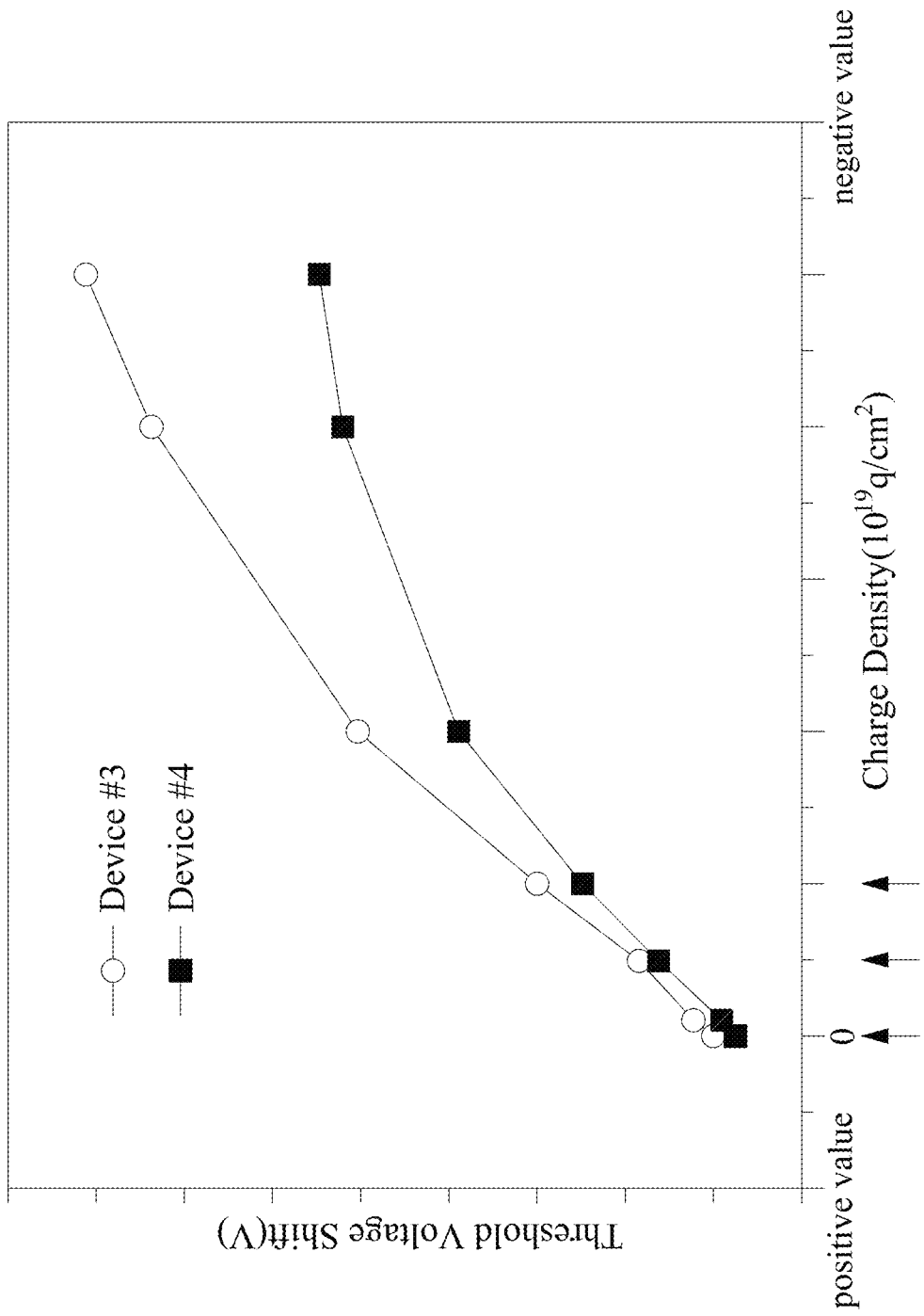
FIG. 19A is a plot of threshold voltage versus charge density according to some embodiments of the present disclosure.

FIG. 19A is a plot of threshold voltage versus charge density according to some embodiments of the present disclosure. In FIG. 19A, the charge density of the charge trapping layer of the programming gate dielectric layer is shown on the horizontal axis in FIG. 19A, and the threshold voltage ($V_t$) is shown on the vertical axis in FIG. 19A. The device #3 and #4 may have the SONOS structure over the nanosheet channel region, and operate in the inversion mode. The device #3 has a first channel height, the device #4 has a second channel height greater than that of the first channel height. For example, the first channel height is in a range from about 3 to about 7 nanometers, and the second channel height is in a range from about 8 to about 12 nanometers.

The charge density of the charge trapping layer can be controlled by applying programming voltages on the control electrode 320' (referring to FIGS. 18A and 18B). As shown in the figure, when the charge density decreases (more negative charges in the charge trapping layer), the threshold voltages ($V_t$) of the devices #3 and #4 becomes larger. It is confirmed that by applying various programming voltages to have different charge density in the charge trapping layer 314' (referring to FIGS. 18A and 18B), each of the devices #3 and #4 can be programmed to multiple charged states, each corresponding to a respective threshold voltages ($V_t$). Comparing the device #3 with the device #4, it shows that the device with less channel height can have a great shift of the threshold voltages ($V_t$) by programming.

Figure 19D:
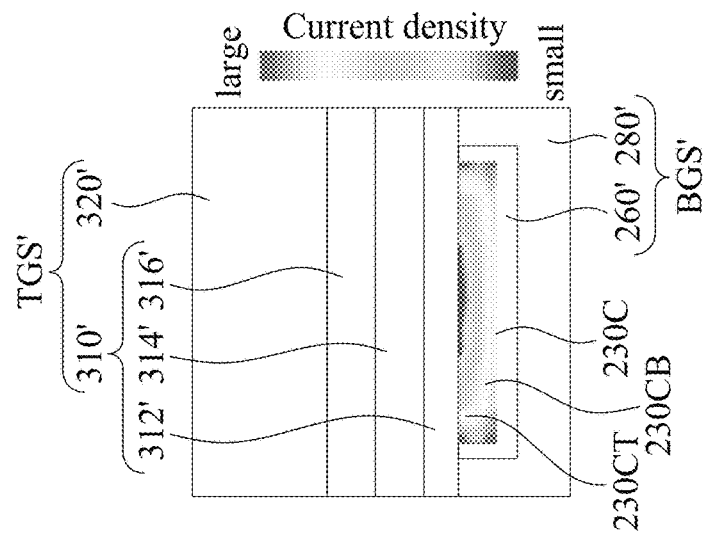
FIGS. 19B-19D shows various operating stages of an integrated circuit device according to some embodiments of the present disclosure.
Figure 19C:
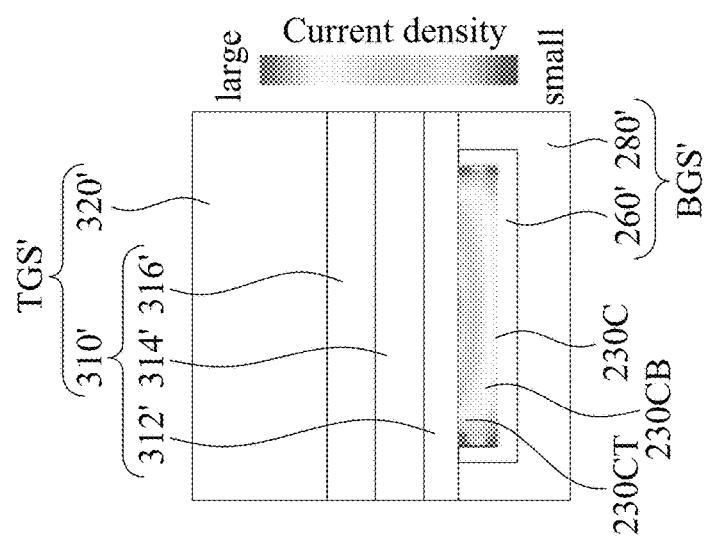
Figure 19B:
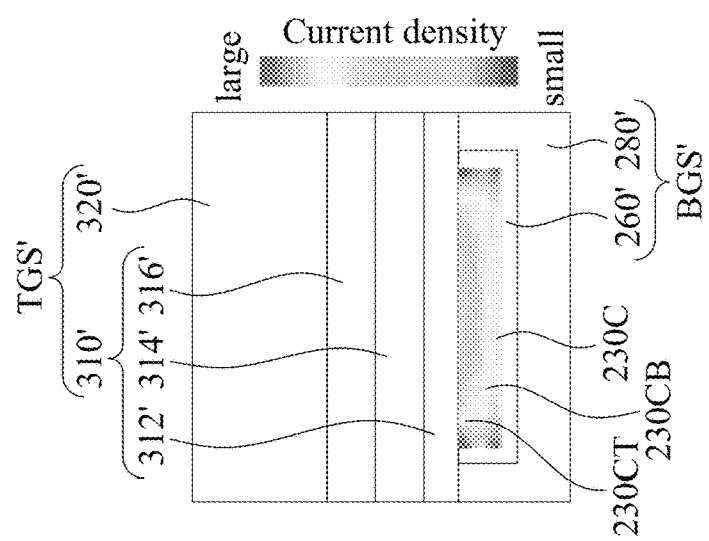

FIGS. 19B-19D shows various operating stages of an integrated circuit device according to some embodiments of the present disclosure. Reference is made to FIGS. 19B-19D, in which the charge trapping layers 314' in FIGS. 19B-19D are respectively programmed to have the charge densities CD1-CD3 in FIG. 19A. The different charge densities CD1-CD3 in the programmed charge trapping layers 314' may cause difference in the current densities in the channel regions 230C. A magnitude of the current density can be described by a scale in absolute values. In FIGS. 19B-19D, and it is noted that a magnitude of the current density increases from a top portion 230CT of the channel region 230C to a bottom portion 230CB of the channel region 230C. For example, in FIG. 19D, the current density of the top portion 230CT is almost at the small value in the scale, and the current density of the bottom portion 230CB is almost at near the large value in the scale. The current densities in the channel region 230C may be in a range from about $10^5$ A/cm$_2$ to about $10^8$ A/cm$_2$.

In these figures, while the charge densities CD1-CD3 (referring to FIG. 19A) in the channel regions 230C of FIGS. 19B-19D decreases from FIGS. 19B-19D, the dark regions of the portions 230CT of channel regions 230C of FIGS. 19B-19D gets larger from FIGS. 19B-19D. This indicates that the current density in the channel region 230C becomes small when the charge trapping layer 314' has a decreased charge density (e.g., the charge density CD3), and the current density in the channel region 230C becomes large when the charge trapping layer 314' has an increased charge density (e.g., the charge density CD1).

Figure 20A:
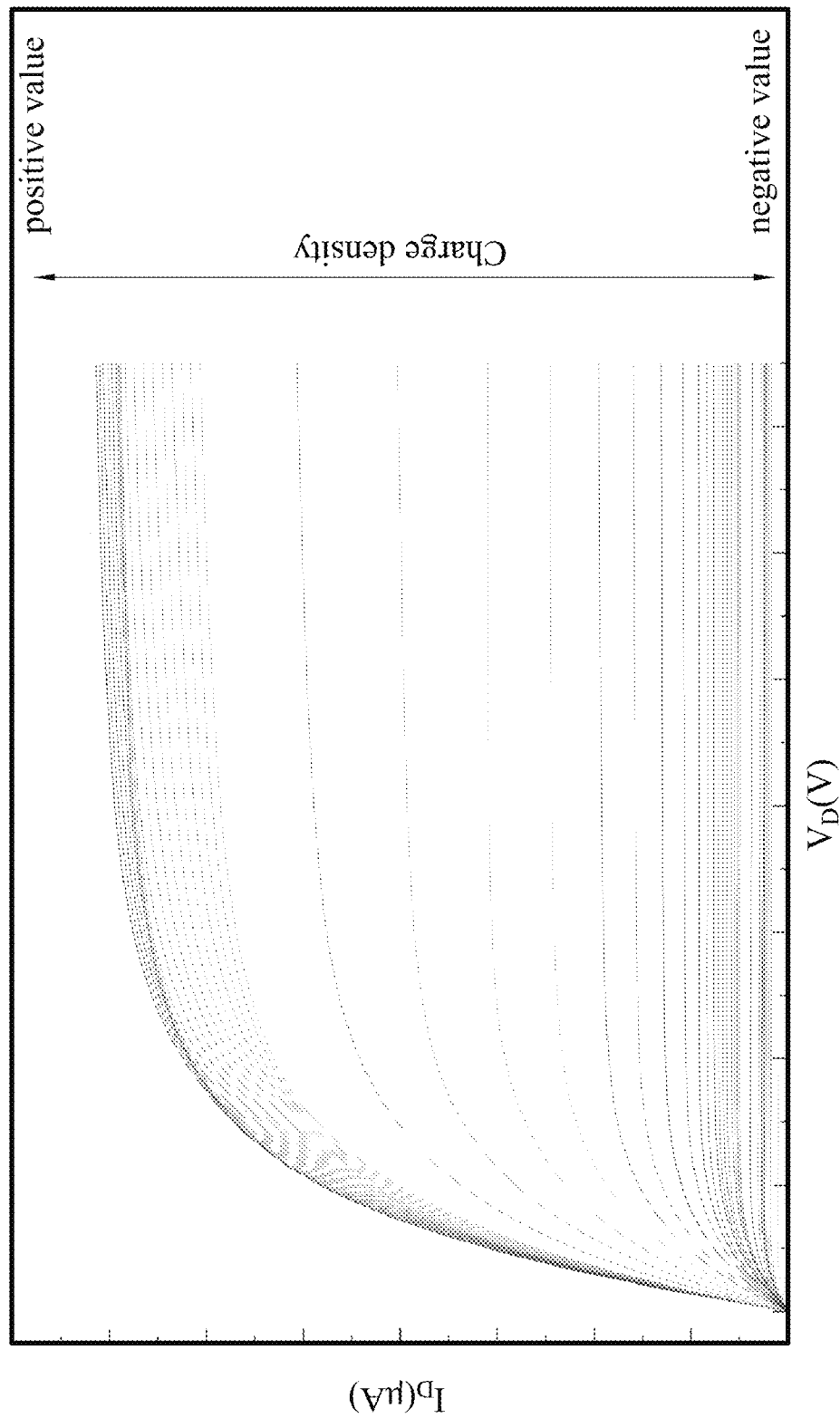
FIG. 20A shows various I-V curves of an integrated circuit device according to some embodiments of the present disclosure.

FIG. 20A shows various I-V curves of an integrated circuit device according to some embodiments of the present disclosure. The drain voltage (VD) is shown on the horizontal axis in FIG. 20A, and the drain current (ID) is shown on the vertical axis in FIG. 20A. The device in FIG. 20A may have the SONOS structure over the nanosheet channel region, and operate in the inversion mode. In FIG. 20A, each of the I-V curves corresponds to a charge state of the device, which is associated a charge density of the charge trapping layer of the programming gate dielectric layer. For these I-V curves, charge densities decrease (more negative charges in the charge trapping layer) as the I-V curves approaching bottom.

As shown in the figure, by applying various programming voltages to have different charge density in the charge trapping layer 314', the device can be programmed to multiple charged states, each corresponding to a respective I-V curve and a respective channel conductance, which may be used as a weight stored in the synapse.

Figure 20B:
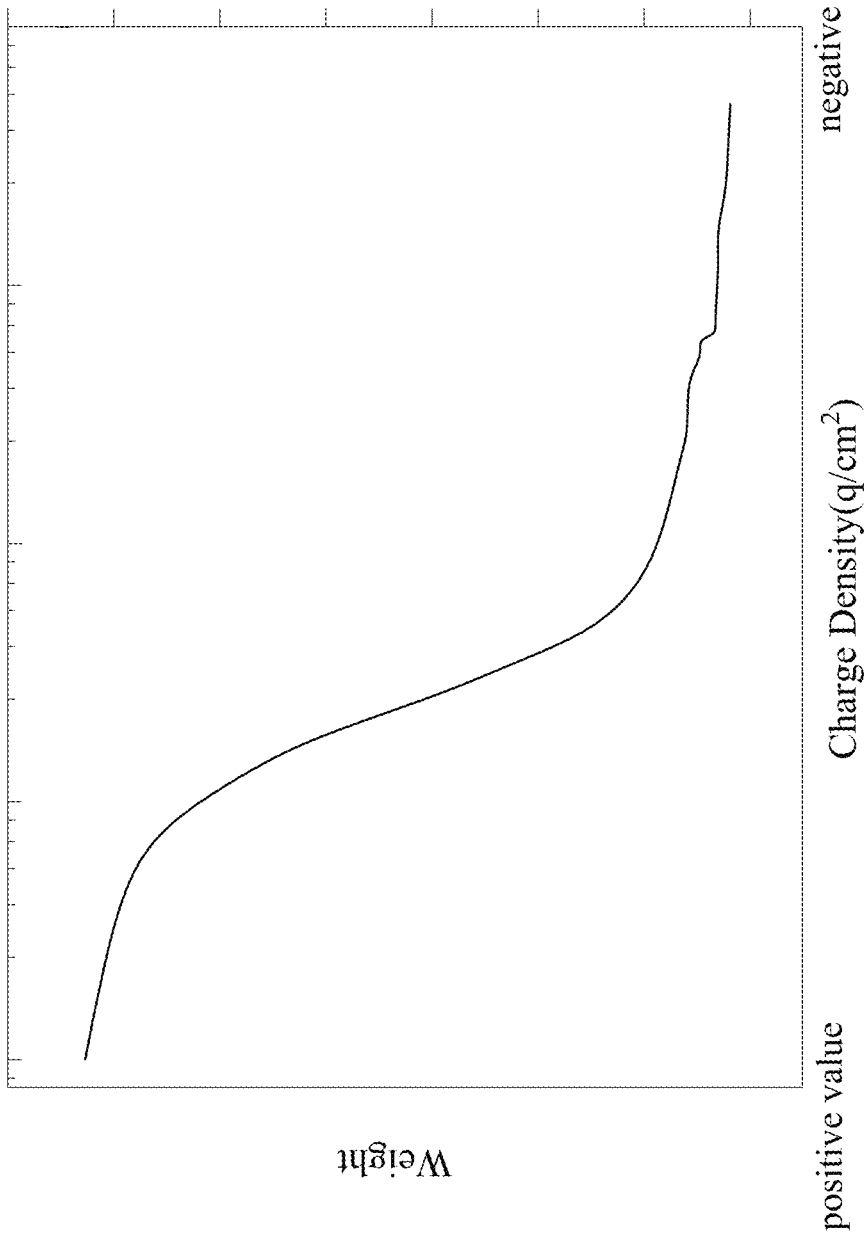
FIG. 20B is a plot of weight versus charge density according to some embodiments of the present disclosure.

FIG. 20B is a plot of weight versus charge density according to some embodiments of the present disclosure. In FIG. 20B, the charge density of the charge trapping layer of the programming gate dielectric layer is shown on the horizontal axis in FIG. 20B, and a weight is shown on the vertical axis in FIG. 20B. In FIG. 20B, the four-terminal device is used as a synaptic device in the ANN, and a channel conductance may represent as the weight stored in the synapse.

By applying programming voltages on the control electrode 320' (referring to FIGS. 18A and 18B) to control the charge density of the charge trapping layer, we can manipulate the reduction/increment of the channel conductance, thereby achieving depression/potentiation of the weight. Multiple weight states can be read through applying proper gate voltage and drain voltage, and thus the fabricated four-terminal device may serve as an analog memory device utilized for ANN in AI application.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a gate all around transistor has a terminal for adjusting its threshold voltage. Another advantage is that a gate all around transistor is used as NVM device with separated reading and programing terminals, thereby achieving read disturbance immunity. Still another advantage is that a gate all around transistor is used as a synaptic device with separated reading and programing terminals, which allows simultaneous reading and programing operations, thereby saving training time.

According to some embodiments of the present disclosure, an integrated circuit device includes a semiconductor substrate, a first gate structure, a channel layer, source and drain features, a second gate structure, a first contact, and a second contact. The first gate structure is over the semiconductor substrate. The first gate structure includes a gate dielectric layer and a first gate electrode. The channel layer is over and surrounded by the first gate structure. The source and drain features are respectively on opposite first and second sides of the channel layer. The second gate structure is over the channel layer. The second gate structure includes a programming gate dielectric layer having a data storage layer and a second gate electrode over the programming gate dielectric layer. The first gate contact is on the first gate electrode. The second gate contact is on the second gate electrode.

According to some embodiments of the present disclosure, an integrated circuit device includes a semiconductor substrate, a channel layer, source and drain features, a first gate structure, a second gate structure, a first contact, and a second contact. The channel layer is over the semiconductor substrate. The channel layer has a top surface, a bottom surface, and first to fourth sides respectively connecting the top surface to the bottom surface, the first side of the channel layer is opposite to the second side of the channel layer, and the third side of the channel layer is opposite to the fourth side of the channel layer. The source and drain features are respectively on the first and second sides of the channel layer. The first gate structure is at least between the semiconductor substrate and the bottom surface of the channel layer, and having an extension extending beyond the third side of the channel layer. The second gate structure is over the top surface of the channel layer, and having an extension extending beyond the fourth side of the channel layer. The first gate contact is on the extension of the first gate structure. The second contact is on the extension of the second gate structure.

According to some embodiments of the present disclosure, a method for fabricating an integrated circuit device is provided. The method includes forming an interlayer over a semiconductor substrate and a semiconductor layer over the interlayer; etching the interlayer such that a channel region of the semiconductor layer is suspended over the semiconductor substrate; depositing a first interlayer dielectric layer over the semiconductor layer; etching a first opening in the first interlayer dielectric layer to expose the channel region of the semiconductor layer; forming a first gate structure in the first opening in the first interlayer dielectric layer to surround the channel region of the semiconductor layer; and forming a second gate structure comprising a programming gate dielectric and an electrode over the channel region of the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, comprising:
    forming an interlayer over a semiconductor substrate and a semiconductor layer over the interlayer;
    etching the interlayer such that a channel region of the semiconductor layer is suspended over the semiconductor substrate;
    depositing a first interlayer dielectric layer over the semiconductor layer;
    etching a first opening in the first interlayer dielectric layer to expose the channel region of the semiconductor layer;
    forming a first gate structure in the first opening in the first interlayer dielectric layer to surround the channel region of the semiconductor layer;
    forming a second gate structure comprising a programming gate dielectric and an electrode over the channel region of the semiconductor layer, wherein the programming gate dielectric has a continuous bottom surface in direct contact with a top surface of the channel region of the semiconductor layer and a top surface of the first gate structure;
    forming a first gate contact on the first gate structure; and
    forming a second gate contact on a portion of the electrode extending beyond a first sidewall of the channel region of the semiconductor layer.

2. The method of claim 1, wherein forming the first gate structure comprises:
    depositing a gate multilayer stack over the first interlayer dielectric layer and into the first opening; and
    performing a planarization process to remove a portion of the gate multilayer stack from above the top surface of the channel region of the semiconductor layer.

3. The method of claim 2, wherein forming the first gate structure further comprises:
    depositing a second interlayer dielectric layer over the gate multilayer stack and filling up the first opening prior to the planarization process.

4. The method of claim 1, wherein forming the second gate structure comprises:
    depositing a third interlayer dielectric layer over the first gate structure;
    etching a second opening in the third interlayer dielectric layer to expose the channel region of the semiconductor layer;

depositing a programming gate dielectric layer and an electrode layer over the third interlayer dielectric layer and into the second opening; and patterning the programming gate dielectric layer and the electrode layer into the programming gate dielectric and the electrode.

5. A method for fabricating an integrated circuit device, comprising:

depositing an interlayer over a semiconductor substrate;

depositing a semiconductor layer over the interlayer;

patterning the interlayer and the semiconductor layer into a fin structure;

etching the interlayer such that a channel region of the semiconductor layer is suspended over the semiconductor substrate;

forming a gate structure to surround the channel region of the semiconductor layer;

forming a programming gate dielectric over the gate structure and the channel region of the semiconductor layer, wherein the programming gate dielectric has a continuous bottom surface in direct contact with a top surface of the channel region of the semiconductor layer and a top surface of the gate structure, and the programming gate dielectric has a data storage layer; and forming an electrode over the programming gate dielectric.

6. The method of claim 5, wherein the data storage layer is a ferroelectric material layer, a resistance switching material layer, or a phase change material layer.

7. The method of claim 5, wherein forming the gate structure comprises:

depositing a gate dielectric layer around the channel region of the semiconductor layer;

depositing a gate electrode layer over the gate dielectric layer; and removing a portion of the gate electrode layer from a top surface of the channel region of the semiconductor layer.

8. The method of claim 7, wherein forming the gate structure further comprises:

removing a portion of the gate dielectric layer from the top surface of the channel region of the semiconductor layer.

9. The method of claim 7, wherein removing the portion of the gate electrode layer comprises:

performing a planarization process until the top surface of the channel region of the semiconductor layer is exposed.

10. A method for fabricating an integrated circuit device, comprising:

forming an interlayer over a semiconductor substrate and a semiconductor layer over the interlayer;

etching the interlayer such that a channel region of the semiconductor layer is suspended over the semiconductor substrate;

forming a first gate structure at least on a first side of the channel region of the semiconductor layer such that the first gate structure has a first portion on the first side of the channel region of the semiconductor layer and a second portion on a second side of the channel region of the semiconductor layer opposite to the first side of the channel region of the semiconductor layer;

after forming the first gate structure, depositing a first interlayer dielectric layer over the first gate structure and the channel region of the semiconductor layer;

etching an opening in the first interlayer dielectric layer to expose the first portion of the first gate structure and the channel region of the semiconductor layer, wherein the first interlayer dielectric layer covers the second portion of the first gate structure; and forming a second gate structure in the opening in the first interlayer dielectric layer, wherein the second gate structure comprises a programming gate dielectric and an electrode over the channel region of the semiconductor layer.

11. The method of claim 10, further comprising:

depositing a second interlayer dielectric layer over the second gate structure and filling the opening in the first interlayer dielectric layer.

12. The method of claim 11, further comprising:

forming a first gate contact on the first gate structure, wherein the first gate contact extends through the first and second interlayer dielectric layers.

13. The method of claim 11, further comprising:

forming a second gate contact on the electrode, wherein the second gate contact extends through the second interlayer dielectric layer.

14. The method of claim 10, further comprising:

forming a source/drain feature in a region of the semiconductor layer on a third side of the channel region of the semiconductor layer adjoining the first side of the channel region of the semiconductor layer.

15. The method of claim 14, wherein depositing the first interlayer dielectric layer is performed such that the first interlayer dielectric layer is in contact with the source/drain feature.

16. The method of claim 1, wherein forming the first gate contact is performed such that the first gate contact is on a portion of the first gate structure extending beyond a second sidewall of the channel region of the semiconductor layer.

17. The method of claim 16, wherein the second sidewall of the channel region of the semiconductor layer is opposite to the first sidewall of the channel region of the semiconductor layer.

18. The method of claim 16, wherein a height of the first gate contact is greater than a height of the second gate contact.

19. The method of claim 1, wherein a bottom surface of the electrode of the second gate structure is higher than a bottom surface of the first gate contact.

20. The method of claim 1, wherein the electrode of the second gate structure is spaced apart from the first gate structure by the programming gate dielectric.

* * * * *